US011844223B1

(12) United States Patent
Mathuriya et al.

(10) Patent No.: US 11,844,223 B1
(45) Date of Patent: Dec. 12, 2023

(54) FERROELECTRIC MEMORY CHIPLET AS UNIFIED MEMORY IN A MULTI-DIMENSIONAL PACKAGING

(71) Applicant: Kepler Computing Inc., San Francisco, CA (US)

(72) Inventors: Amrita Mathuriya, Portland, OR (US); Christopher B. Wilkerson, Portland, OR (US); Rajeev Kumar Dokania, Beaverton, OR (US); Debo Olaosebikan, San Francisco, CA (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 107 days.

(21) Appl. No.: 17/229,750

(22) Filed: Apr. 13, 2021

Related U.S. Application Data

(63) Continuation-in-part of application No. 16/428,885, filed on May 31, 2019, now Pat. No. 11,043,472.

(51) Int. Cl.
    *G11C 5/06* (2006.01)
    *H10B 51/00* (2023.01)
    (Continued)

(52) U.S. Cl.
    CPC ............... *H10B 51/00* (2023.02); *G11C 5/06* (2013.01); *G11C 11/22* (2013.01); *H01L 24/14* (2013.01); *H01L 25/0657* (2013.01)

(58) Field of Classification Search
    None
    See application file for complete search history.

(56) References Cited

U.S. PATENT DOCUMENTS

| 5,834,162 A | 11/1998 | Malba |
| 6,256,248 B1 | 7/2001 | Leung |

(Continued)

FOREIGN PATENT DOCUMENTS

| CN | 104081516 B | 2/2017 |
| GB | 2323188 A | 9/1998 |

(Continued)

OTHER PUBLICATIONS

Decision of Rejection dated May 18, 2021 for Taiwan Patent Application No. 109106755.

(Continued)

*Primary Examiner* — Tan T. Nguyen
(74) *Attorney, Agent, or Firm* — MUGHAL GAUDRY & FRANKLIN PC

(57) ABSTRACT

A ferroelectric memory chiplet in a multi-dimensional packaging. The multi-dimensional packaging includes a first die comprising a switch and a first plurality of input-output transceivers. The multi-dimensional packaging includes a second die comprising a processor, wherein the second die includes a second plurality of input-output transceivers coupled to the first plurality of input-output transceivers. The multi-dimensional packaging includes a third die comprising a coherent cache or memory-side buffer, wherein the coherent cache or memory-side buffer comprises ferroelectric memory cells, wherein the coherent cache or memory-side buffer is coupled to the second die via I/Os. The dies are wafer-to-wafer bonded or coupled via micro-bumps, copper-to-copper hybrid bond, or wire bond, Flip-chip ball grid array routing, chip-on-wafer substrate, or embedded multi-die interconnect bridge.

20 Claims, 55 Drawing Sheets

(51) Int. Cl.
    *H01L 25/065*     (2023.01)
    *G11C 11/22*     (2006.01)
    *H01L 23/00*     (2006.01)

(56) References Cited

U.S. PATENT DOCUMENTS

| | | | |
|---|---|---|---|
| 6,487,135 | B2 | 11/2002 | Watanabe et al. |
| 6,890,798 | B2 | 5/2005 | McMahon |
| 7,146,454 | B1 | 12/2006 | Li et al. |
| 7,217,596 | B2 | 5/2007 | Cobbley et al. |
| 7,683,459 | B2 | 3/2010 | Ma et al. |
| 8,143,710 | B2 | 3/2012 | Cho |
| 8,198,716 | B2 | 6/2012 | Periaman et al. |
| 8,525,342 | B2 | 9/2013 | Chandrasekaran et al. |
| 8,546,955 | B1 | 10/2013 | Wu |
| 8,547,769 | B2 | 10/2013 | Saraswat et al. |
| 8,612,809 | B2 | 12/2013 | Casper et al. |
| 8,701,073 | B1 | 4/2014 | Fu et al. |
| 8,759,899 | B1 | 6/2014 | Lue et al. |
| 8,896,126 | B2 | 11/2014 | Setardja |
| 8,947,931 | B1 * | 2/2015 | D'Abreu ............ H01L 25/0652 |
| | | | 365/185.11 |
| 9,165,968 | B2 | 10/2015 | Chao et al. |
| 9,379,078 | B2 | 6/2016 | Yu et al. |
| 9,627,365 | B1 | 4/2017 | Yu et al. |
| 9,748,190 | B2 | 8/2017 | Chen et al. |
| 10,074,423 | B1 * | 9/2018 | Hermesh ............ G11C 5/06 |
| 10,461,076 | B1 | 10/2019 | Brewer |
| 11,009,938 | B1 | 5/2021 | Law et al. |
| 11,139,270 | B2 | 10/2021 | Manipatruni et al. |
| 11,171,115 | B2 | 11/2021 | Manipatruni et al. |
| 2006/0179329 | A1 | 8/2006 | Terechko et al. |
| 2007/0208902 | A1 | 9/2007 | Park et al. |
| 2010/0008058 | A1 | 1/2010 | Saen et al. |
| 2010/0167467 | A1 | 7/2010 | Aoi |
| 2012/0098140 | A1 | 4/2012 | Bartley et al. |
| 2012/0106117 | A1 | 5/2012 | Sundaram et al. |
| 2013/0086395 | A1 | 4/2013 | Liu |
| 2013/0141858 | A1 | 6/2013 | Pyeon |
| 2013/0175686 | A1 | 7/2013 | Meyer et al. |
| 2013/0320560 | A1 | 12/2013 | Secker et al. |
| 2014/0208041 | A1 | 7/2014 | Hyde et al. |
| 2014/0217616 | A1 | 8/2014 | Choi |
| 2014/0371109 | A1 | 12/2014 | McMillen et al. |
| 2015/0091131 | A1 | 4/2015 | Lamorey et al. |
| 2015/0279431 | A1 | 10/2015 | Li et al. |
| 2016/0126291 | A1 | 5/2016 | Lu et al. |
| 2016/0357630 | A1 | 12/2016 | Kang et al. |
| 2017/0018301 | A1 | 1/2017 | Kilmer et al. |
| 2017/0062383 | A1 | 3/2017 | Yee et al. |
| 2017/0077387 | A1 | 3/2017 | Kan et al. |
| 2017/0084312 | A1 | 3/2017 | Kim |
| 2017/0084596 | A1 | 3/2017 | Scanlan |
| 2017/0139635 | A1 | 5/2017 | Jayasena et al. |
| 2017/0300269 | A1 | 10/2017 | Um |
| 2018/0082981 | A1 | 3/2018 | Gowda |
| 2018/0107630 | A1 | 4/2018 | Zhou et al. |
| 2018/0254073 | A1 | 9/2018 | Frans |
| 2018/0277695 | A1 | 9/2018 | Garten et al. |
| 2018/0330236 | A1 | 11/2018 | Hou |
| 2018/0350773 | A1 | 12/2018 | Saito |
| 2019/0042251 | A1 | 2/2019 | Nurvitadhi et al. |
| 2019/0050040 | A1 | 2/2019 | Baskaran et al. |
| 2019/0051642 | A1 | 2/2019 | Hyde et al. |
| 2019/0065204 | A1 | 2/2019 | Jean |
| 2019/0065956 | A1 | 2/2019 | Qian et al. |
| 2019/0096453 | A1 | 3/2019 | Shin et al. |
| 2019/0102330 | A1 * | 4/2019 | Hasbun ............ G11C 5/06 |
| 2019/0103143 | A1 * | 4/2019 | Hasbun ............ G11C 11/2273 |
| 2019/0103148 | A1 * | 4/2019 | Hasbun ............ G06F 13/16 |
| 2019/0114535 | A1 | 4/2019 | Ng et al. |
| 2019/0187898 | A1 | 6/2019 | Gu et al. |
| 2019/0189564 | A1 | 6/2019 | Guzek |
| 2019/0198083 | A1 | 6/2019 | Biswas et al. |
| 2019/0205244 | A1 | 7/2019 | Smith |
| 2019/0220434 | A1 | 7/2019 | Dai et al. |
| 2019/0229101 | A1 | 7/2019 | Lee |
| 2019/0259732 | A1 * | 8/2019 | Choo ............ H01L 25/0652 |
| 2019/0267074 | A1 | 8/2019 | Fishburn et al. |
| 2019/0279697 | A1 | 9/2019 | Karpov et al. |
| 2019/0318975 | A1 | 10/2019 | Shi et al. |
| 2020/0006324 | A1 | 1/2020 | Chen et al. |
| 2020/0075567 | A1 | 3/2020 | Collins |
| 2020/0076424 | A1 | 3/2020 | Dubey et al. |
| 2020/0098725 | A1 | 3/2020 | Liff et al. |
| 2020/0107444 | A1 | 4/2020 | Hoe et al. |
| 2020/0126995 | A1 | 4/2020 | Ge et al. |
| 2020/0161230 | A1 | 5/2020 | Knickerbocker et al. |
| 2020/0168528 | A1 | 5/2020 | Cheah et al. |
| 2020/0168550 | A1 | 5/2020 | Ryu et al. |
| 2020/0168554 | A1 | 5/2020 | Fay et al. |
| 2020/0279793 | A1 | 9/2020 | Xie et al. |
| 2020/0365593 | A1 | 11/2020 | Chen et al. |
| 2021/0134724 | A1 | 5/2021 | Rubin et al. |
| 2021/0335718 | A1 | 10/2021 | Cheah et al. |
| 2022/0367400 | A1 | 11/2022 | Li |

FOREIGN PATENT DOCUMENTS

| | | |
|---|---|---|
| JP | H11168185 A | 6/1999 |
| JP | 2000196008 A | 7/2000 |
| JP | 2004315268 4 | 11/2004 |
| JP | 2006324430 A | 11/2006 |
| JP | 2007150154 | 1/2009 |
| JP | 2010053399 A | 3/2010 |
| JP | 2018160490 A | 10/2018 |
| KR | 1020100081272 | 7/2010 |
| KR | 20200066538 A | 6/2020 |
| TW | 201327740 | 1/2013 |
| TW | 201430968 | 8/2014 |
| WO | 2018126073 A1 | 7/2018 |
| WO | 2018220846 A1 | 12/2018 |
| WO | 2019023253 A1 | 1/2019 |
| WO | 2020062312 A1 | 4/2020 |

OTHER PUBLICATIONS

Notice of Allowance dated Jul. 9, 2021 for U.S. Appl. No. 16/428,893.
Notice of Allowance dated Jul. 22, 2021 for U.S. Appl. No. 16/357,265.
Notice of Allowance dated Jul. 22, 2021 for U.S. Appl. No. 16/357,272.
International Preliminary Report on Patentability dated Sep. 30, 2021 for PCT Patent Application No. PCT/US2020/018875.
Final Office Action dated Oct. 17, 2022 for U.S. Appl. No. 16/823,209.
First Office Action in Re-Examination dated Jul. 11, 2022 for Taiwan Patent Application No. 109106755.
Non-Final Office Action dated May 24, 2022 for U.S. Appl. No. 16/823,209.
Non-Final Office Action dated Oct. 5, 2022 for U.S. Appl. No. 17/472,308.
Non-Final Office Action dated Oct. 6, 2022 for U.S. Appl. No. 17/472,325.
Non-Final Office Action dated Sep. 26, 2022 for U.S. Appl. No. 17/390,829.
Notice of Allowance dated Nov. 23, 2022 for U.S. Appl. No. 17/390,829.
Notice of Allowance dated Sep. 21, 2022 for Taiwan Patent Application No. 109106755.
Notice of Allowance dated Sep. 28, 2022 for U.S. Appl. No. 17/390,799.
Notice of Reasons for Rejection dated Nov. 8, 2022 for Japanese Patent Application No. 2021-546863.
International Preliminary Report on Patentability dated Dec. 9, 2021 for PCT Patent Application No. PCT/US2020/032974.
1st Office Action & Search Report dated Dec. 9, 2020, for Taiwan Patent Application No. 109106755.
Advisory Action dated Mar. 3, 2021 for U.S. Appl. No. 16/357,265.
Advisory Action dated Mar. 3, 2021 for U.S. Appl. No. 16/357,272.

(56) References Cited

OTHER PUBLICATIONS

Final Office Action dated Dec. 28, 2020 for U.S. Appl. No. 16/357,265.
Final Office Action dated Dec. 31, 2020 for U.S. Appl. No. 16/357,272.
International Search Report & Written Opinion dated Jun. 11, 2020 for PCT Patent Application No. PCT/US2020/018875.
International Search Report & Written Opinion dated Sep. 1, 2020 for PCT Patent Application No. PCT/US2020/032974.
Non-Final Office Action dated Jul. 20, 2020 for U.S. Appl. No. 16/357,272.
Non-Final Office Action dated Jul. 22, 2020 for U.S. Appl. No. 16/357,265.
Non-Final Office Action dated Mar. 22, 2021 for U.S. Appl. No. 16/357,265.
Non-Final Office Action dated Mar. 23, 2021 for U.S. Appl. No. 16/357,272.
Non-Final Office Action dated Sep. 3, 2020 for U.S. Appl. No. 16/428,885.
Non-Final Office Action dated Sep. 3, 2020 for U.S. Appl. No. 16/428,893.
Notice of Allowance dated Feb. 22, 2020 for U.S. Appl. No. 16/428,885.
Restriction Requirement dated Dec. 13, 2019 for U.S. Appl. No. 16/357,265.
Restriction Requirement dated Jan. 2, 2020 for U.S. Appl. No. 16/357,272.
Restriction Requirement dated Apr. 3, 2020 for U.S. Appl. No. 16/428,885.
Restriction Requirement dated Apr. 3, 2020 for U.S. Appl. No. 16/428,893.
Jun, H. et al., "HBM (High Bandwidth Memory) DRAM Technology and Architecture", 2017 IEEE International Memory Workshop (IMW), Monterey, CA, 2017, pp. 1-4.
Kim, J. et al., "A 1.2 V 12.8 GB/s 2 Gb Mobile Wide-I/O DRAM With 4$\times$128 I/Os Using TSV Based Stacking", IEEE Journal of Solid-State Circuits, vol. 47, No. 1, pp. 107-116, Jan. 2012.
Lee, D. et al., "A 1.2V 8Gb 8-channel 128GB/s high-bandwidth memory (HBM) stacked DRAM with effective microbump I/O test methods using 29nm process and TSV", 2014 IEEE International Solid-State Circuits Conference Digest of Technical Papers (ISSCC), San Francisco, CA, 2014, pp. 432-433.
Macri, J. "AMD's next generation GPU and high bandwidth memory architecture: Fury", 2015 IEEE Hot Chips 27 Symposium (HCS), Cupertino, CA, 2015, pp. 1-26.
Pugsley et al., "NDC: Analyzing the impact of 3D-stacked memory+logic devices on MapReduce workloads", 2014 IEEE International Symposium on Performance Analysis of Systems and Software (ISPASS), Monterey, CA, 2014, pp. 190-200.
Shulaker et al., "Monolithic 3D integration of logic and memory: Carbon nanotube FETs, resistive RAM, and silicon FETs", 2014 IEEE International Electron Devices Meeting, San Francisco, CA, 2014, pp. 27.4.1-27.4.4.
Sun et al., "A novel architecture of the 3D stacked MRAM L2 cache for CMPs", 2009 IEEE 15th International Symposium on High Performance Computer Architecture, Raleigh, NC, 2009, pp. 239-249.
Woo et al., "An optimized 3D-stacked memory architecture by exploiting excessive, high-density TSV bandwidth", HPCA-16 2010 The Sixteenth International Symposium on High-Performance Computer Architecture, Bangalore, 2010, pp. 1-12.
Yu, D. "Wafer level system integration for SiP", 2014 IEEE International Electron Devices Meeting, San Francisco, CA, 2014, pp. 27.1.1-27.1.4.
Notice of Allowance dated Jul. 27, 2021 for U.S. Appl. No. 16/428,893.
AMD CDNA whitepaper. Retrieved from https://www.amd.com/system/files/documents/amd-cdna-whitepaper.pdf [Sep. 14, 2021].
AMD's V-cache product announcement. Retrieved from https://www.pcworld.com/article/3620871/amd-v-cache-for-ryzen-everything-you-need-to-know.html [Sep. 14, 2021].
Chen et al. "System on integrated chips (SoIC (TM) for 3D heterogeneous integration." 2019 IEEE 69th Electronic Components and Technology Conference (ECTC). IEEE, 2019.
Chen et al. "Ultra high density SoIC with sub-micron bond pitch." 2020 IEEE 70th Electronic Components and Technology Conference (ECTC). IEEE, 2020.
Herbert et al., "Analysis of dynamic voltage/frequency scaling in chip-multiprocessors." Proceedings of the 2007 international symposium on Low power electronics and design (ISLPED'07). IEEE, 2007.
Ingerly et al. "Foveros: 3D integration and the use of face-to-face chip stacking for logic devices." 2019 IEEE International Electron Devices Meeting (IEDM). IEEE, 2019.
Lee et al. "Heterogeneous System-Level Package Integration—Trends and Challenges." 2020 IEEE Symposium on VLSI Technology. IEEE, 2020.
Prasad et al. "Buried power rails and back-side power grids: Arm® CPU power delivery network design beyond 5nm." 2019 IEEE International Electron Devices Meeting (IEDM). IEEE, 2019.
Rotem et al. "Power-management architecture of the intel microarchitecture code-named sandy bridge." IEEE micro 32.2 (2012): 20-27.
Advisory Action dated Jan. 5, 2023 for U.S. Appl. No. 16/823,209.
Advisory Action dated Mar. 15, 2023 for U.S. Appl. No. 17/472,308.
Advisory Action dated Mar. 15, 2023 for U.S. Appl. No. 17/472,325.
Final Office Action dated Apr. 17, 2023 for U.S. Appl. No. 17/499,241.
Final Office Action dated Apr. 19, 2023 for U.S. Appl. No. 16/823,209.
Final Office Action dated Feb. 14, 2023 for U.S. Appl. No. 17/472,308.
Final Office Action dated Feb. 14, 2023 for U.S. Appl. No. 17/472,325.
Lexinnova, 3D Stacked Memory, retrieved from the Internet by USPTO at . 2017. 23 pages.
Non-Final Office Action dated Apr. 20, 2023 for U.S. Appl. No. 17/472,308.
Non-Final Office Action dated Apr. 20, 2023 for U.S. Appl. No. 17/472,325.
Non-Final Office Action dated Jan. 31, 2023 for U.S. Appl. No. 16/823,209.
Non-Final Office Action dated Mar. 3, 2023 for U.S. Appl. No. 17/449,240.
Non-Final Office Action dated Mar. 24, 2023 for U.S. Appl. No. 17/408,326.
Notice of Allowance dated Apr. 13, 2023 for U.S. Appl. No. 17/478,841.
Office Action dated Feb. 21, 2023 for Japanese Patent Application No. 2021-546863.
Wikipedia. Ferroelectric RAM. retrieved from the Internet by USPTO Feb. 21, 2023, https://en.wikipedia.org/wiki/Ferroelectric_RAM, 8 pages.

* cited by examiner

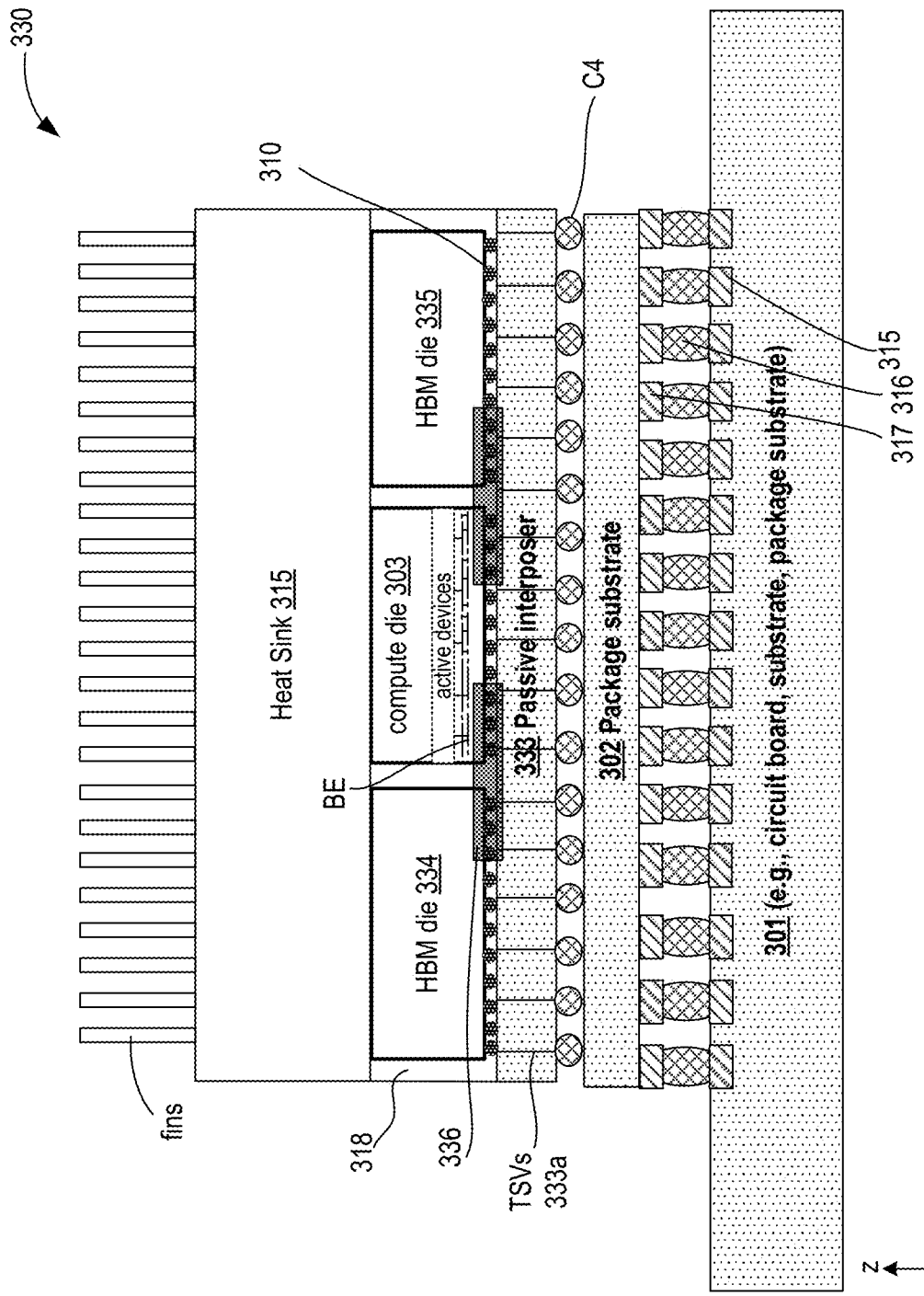

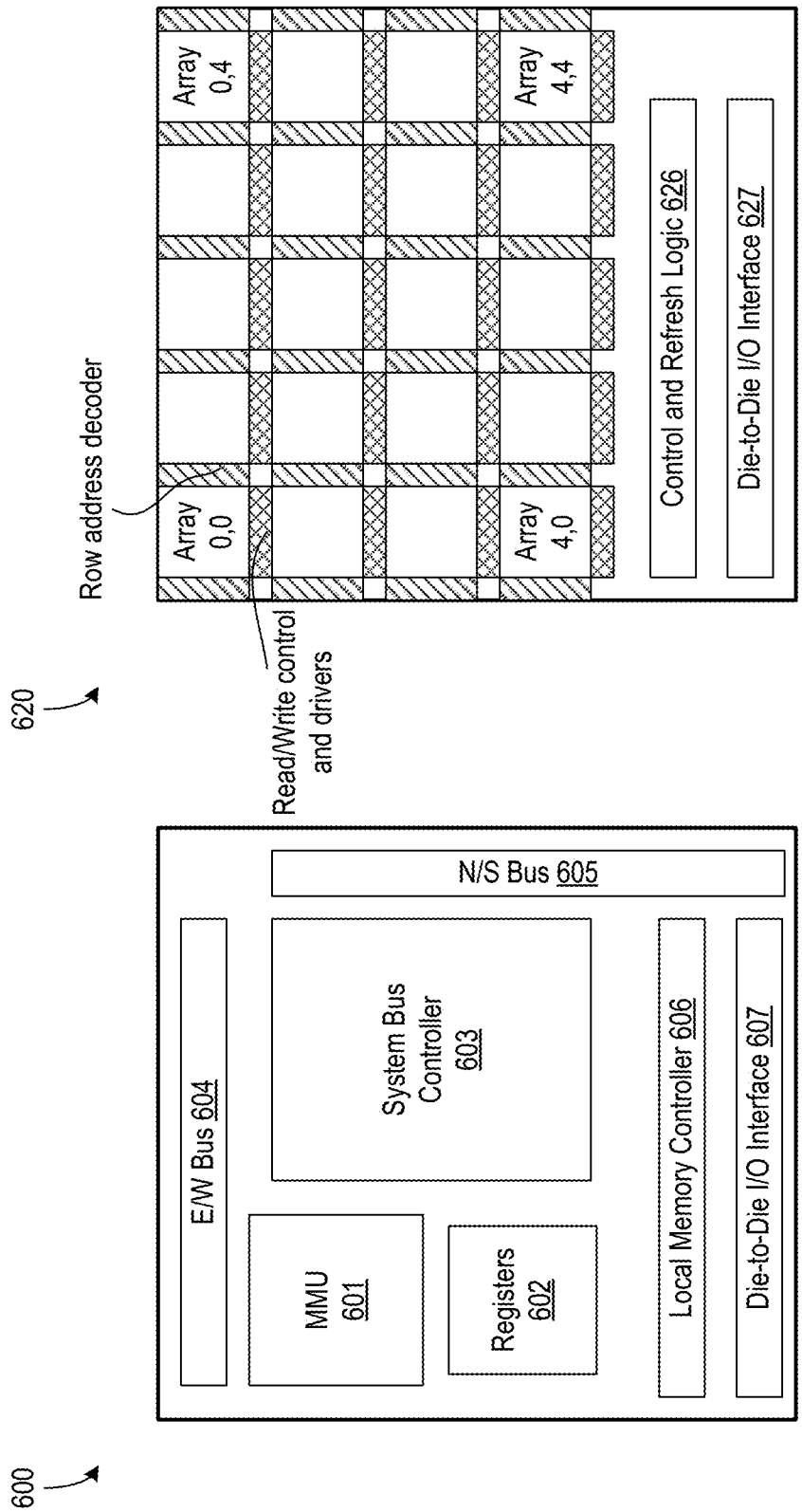

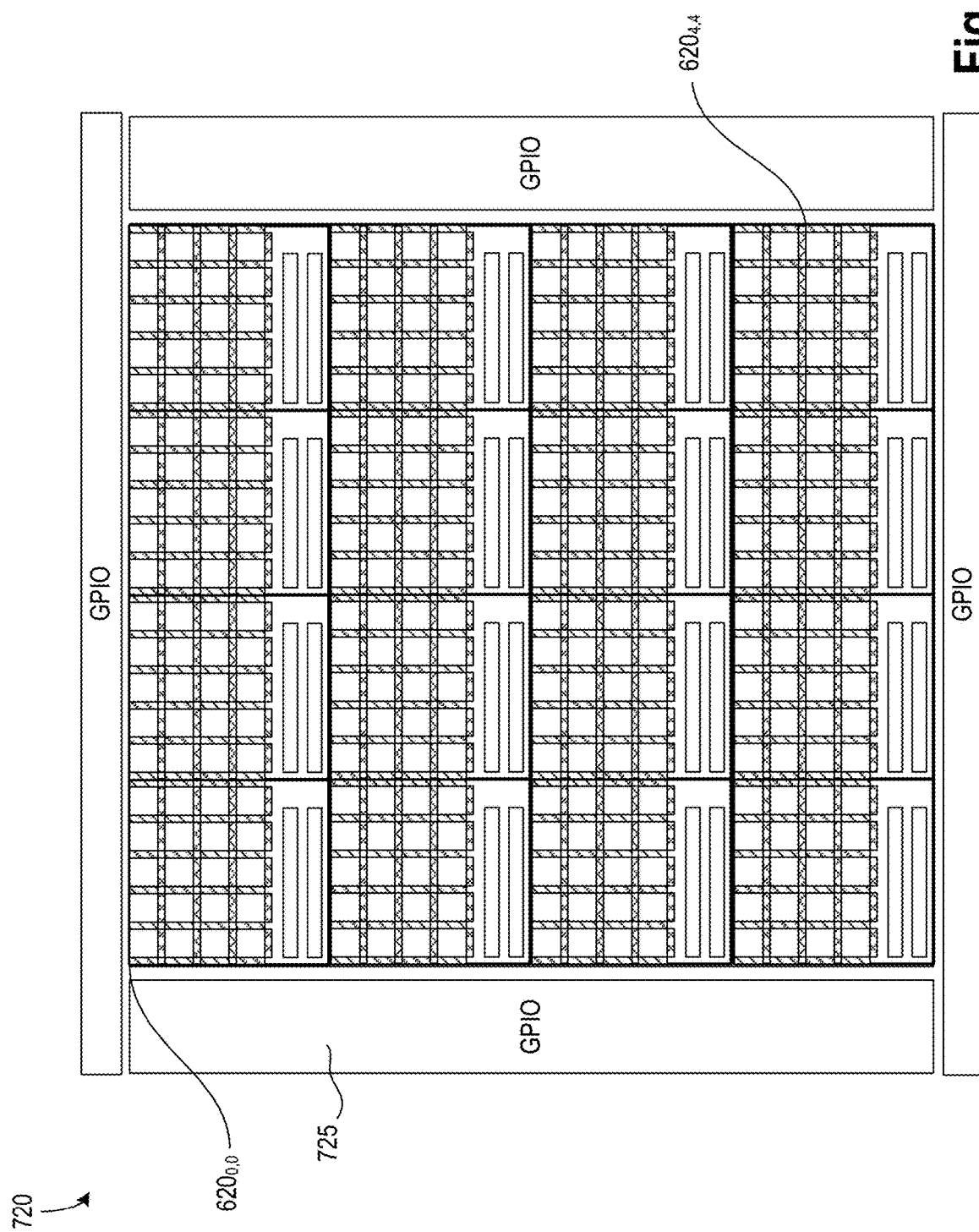

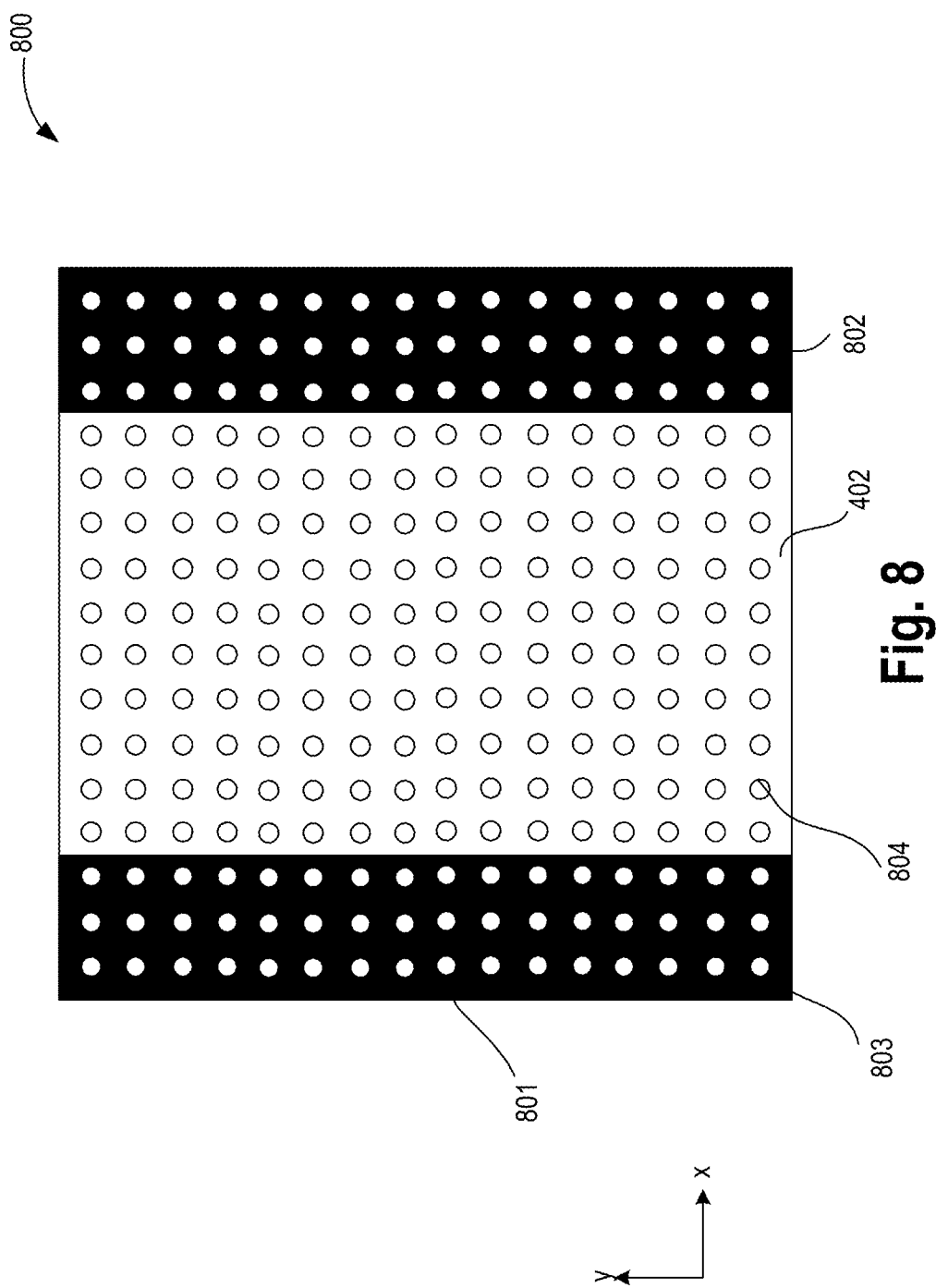

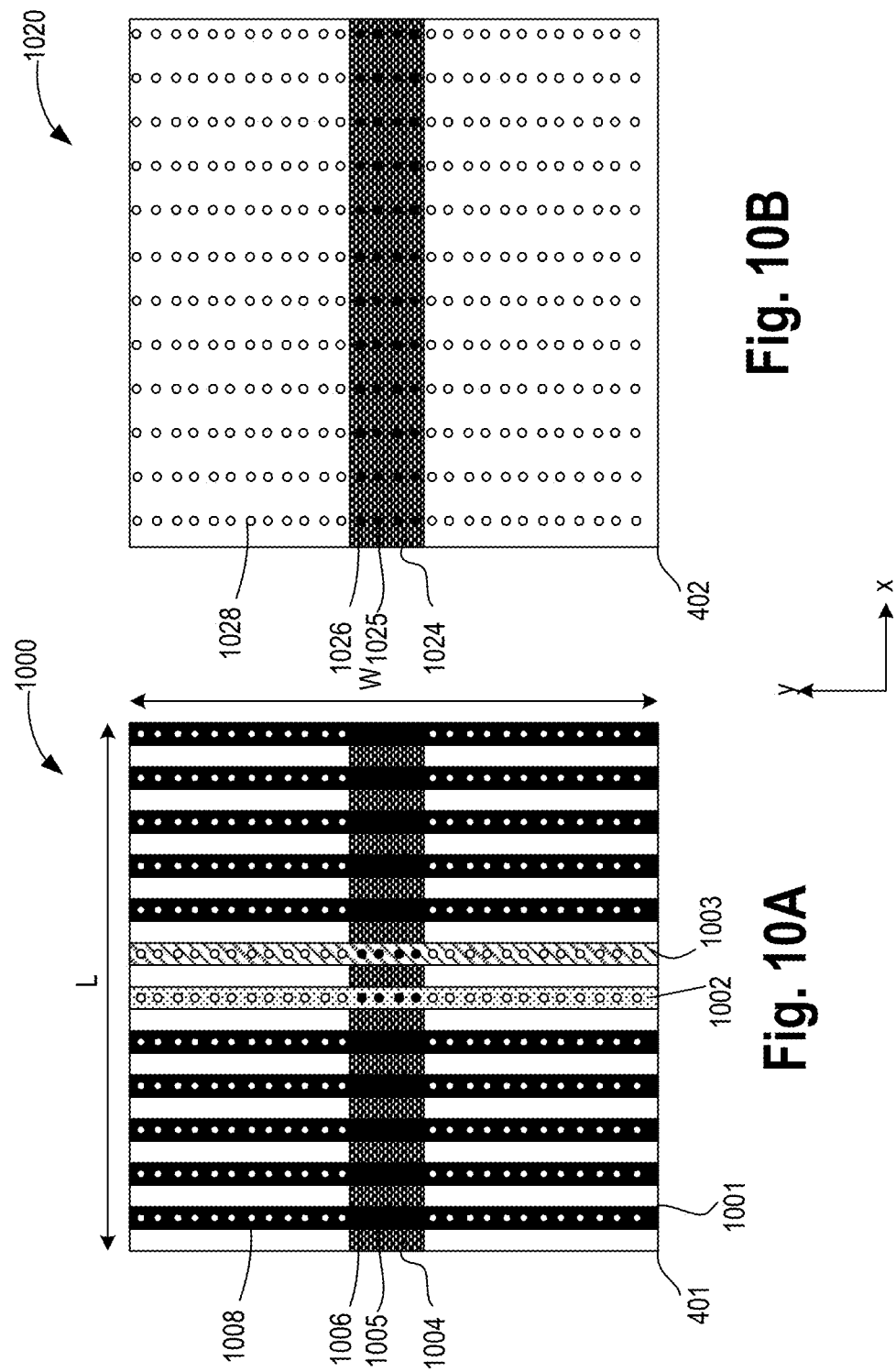

1600

| Memory Die | | | | |
|---|---|---|---|---|
| CH3 | CH7 | CH11 | CH15 | CH19 |
| CH2 | CH6 | CH10 | CH14 | CH18 |
| CH1 | CH5 | CH9 | CH13 | CH17 |
| CH0 | CH4 | CH8 | CH12 | CH16 |

CPU/accelerator implementation on a unified memory architecture

```
Void Sortfile(File *fp, int N){
    char *data; // declare a pointer to a buffer named data
    //data allocated in unified region, this may be a special region of memory such as chiplet memory
    data = (char *) unified_malloc(N);
    //load file contents to buffer (data) IO completed on CPU
    fread(data, 1, N, fp);
    //sort the contents of the buffer "data"
    accelerator_qsort(data, N, 1, compare); // sorting done on accelerator
    synchronize(); //accelerator and CPU synchronize
    use_sorted_data(); // CPU performs additional computation with sorted data.
}
```

UMA makes sharing data between a CPU and an accelerator easy, shared address space allows pointer passing.

CPU implementation

```
Void Sortfile(File *fp, int N){
    char *data; // declare a pointer to a buffer named data
    // data allocated in conventional memory
    data = (char *) malloc(N); //data allocated in memory
    //load file contents to buffer (data) IO completed on CPU
    fread(data, 1, N, fp); //IO completed on CPU
    //sort the contents of the buffer "data"
    CPU_qsort(data, N, 1, compare); // sorting done CPU
    use_sorted_data(); // CPU performs additional computation with sorted data.
}
```

Fig. 45B

FERROELECTRIC MEMORY CHIPLET AS UNIFIED MEMORY IN A MULTI-DIMENSIONAL PACKAGING

CLAIM OF PRIORITY

This application is a continuation and continuation-in-part of U.S. patent application Ser. No. 16/428,885 filed May 31, 2019, titled "3D Integrated Ultra High-Bandwidth Memory," and now issued as U.S. Pat. No. 11,043,472 on Jun. 22, 2021, and which is incorporated by reference in its entirety.

BACKGROUND

Artificial intelligence (AI) is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained". This trained model with fixed weights is then used to make decisions about new data. Training a model and then applying the trained model for new data is hardware intensive activity. There is a desire to reduce latency of computing the training model and using the training model, and to reduce the power consumption of such AI processor systems.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3C illustrates a cross-section of a package where high bandwidth memory (HBM) are on either side of the compute die resulting in limited I/O bandwidth due to periphery constraints for number of I/Os.

FIG. 6A illustrates a unit cell (or processing element (PE)) of a compute die which is configured to couple with a memory die below it, in accordance with some embodiments.

FIG. 6B illustrates a unit cell of a memory die which is configured to couple with a compute die above it, in accordance with some embodiments.

FIG. 7B illustrates a memory die comprising a plurality of unit cells of FIG. 6B, in accordance with some embodiments.

FIG. 8 illustrates a cross-section of a top view of the compute die with micro-humps on the sides to connect with memories along a horizontal plane, in accordance with some embodiments.

FIG. 10A illustrates a cross-section of a memory die, which is below the compute die, in accordance with some embodiments.

FIG. 10B illustrates a cross-section of a compute die, which is above the memory die, in accordance with some embodiments.

FIG. 16 illustrates an apparatus showing partitioning of the memory die in a plurality of channels, in accordance with some embodiments.

FIGS. 45A-B illustrate pseudocodes, respectively, for implementing unified memory architecture (UMA) between compute die 2001 and accelerator 3920, and for compute die 2001 only.

DETAILED DESCRIPTION

Figure 1:
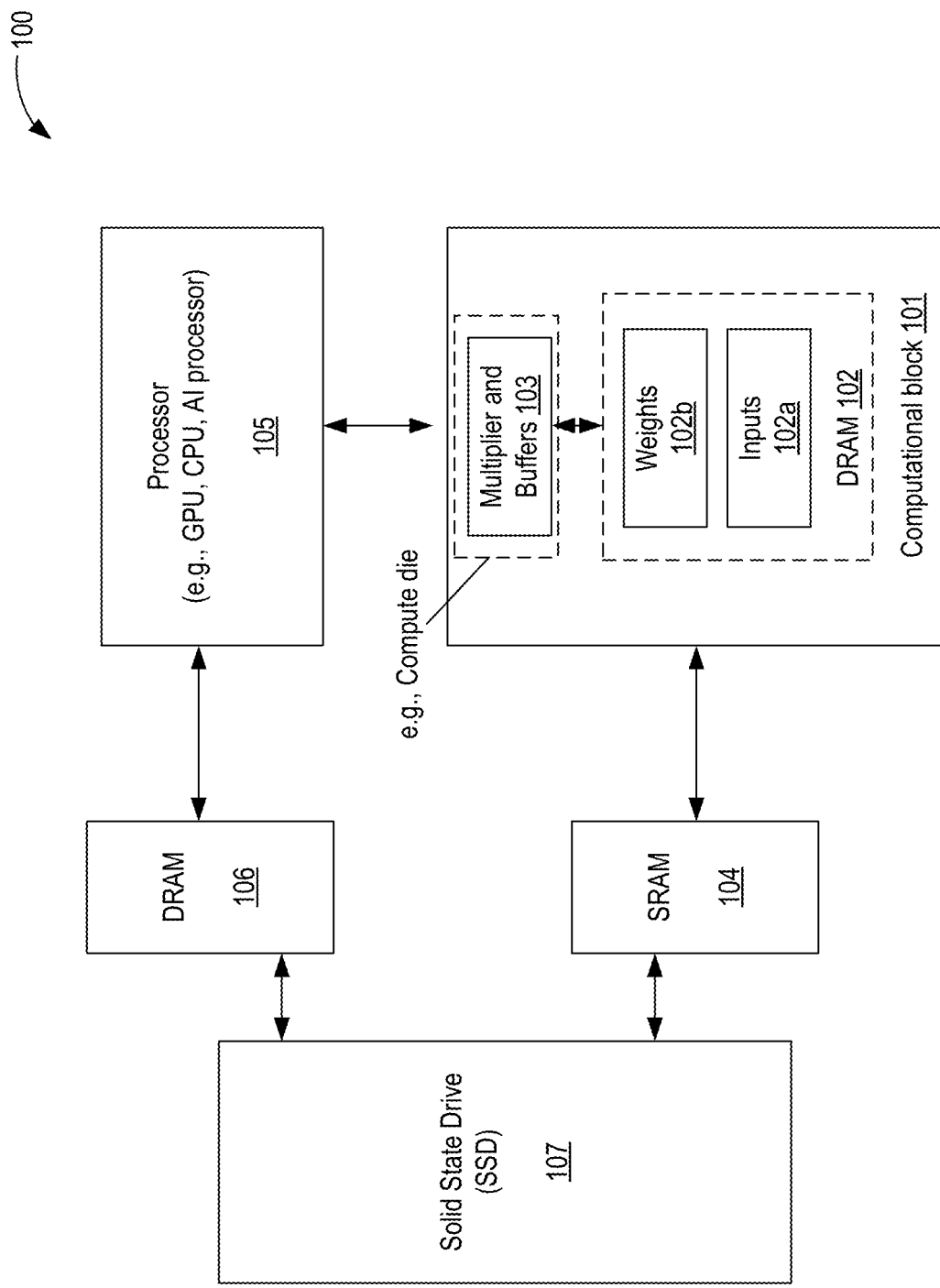
FIG. 1 illustrates a high-level architecture of an artificial intelligence (AI) machine comprising a compute die positioned on top of a memory die, in accordance with some embodiments.

Existing packaging technology that stacks a dynamic random-access memory (DRAM) on top of a compute die results in limited I/O bandwidth due to periphery constraints. These periphery constraints come from vertical interconnect or pillars between a package substrate and the DRAM die. Further, having the compute die below the DRAM causes thermal issues for the compute die because any heat sink is closer to the DRAM and away from the compute die. Even with wafer-to-wafer bonded DRAM and compute die in a package results in excessive perforation of the compute die because the compute die is stacked below the DRAM. These perforations are caused by through-silicon vias (TSVs) that couple the C4 bumps adjacent to the compute die with the micro-bumps, Cu-to-Cu pillars, or hybrid Cu-to-Cu pillars between the DRAM die and the compute die. When the DRAM die is positioned above the compute die in a wafer-to-wafer configuration, the TSV density is lined directly to die-to-die I/O counts, which is substantially similar to the number of micro-bumps (or Cu-to-Cu pillars) between the DRAM die and the compute die. Further, having the compute die below the DRAM die in a wafer-to-wafer coupled stack, causes thermal issues for the compute die because the heat sink is closer to the DRAM die and away from the compute die. Placing the memory as high bandwidth memory (HBM) on either sides of the compute die does not resolve the bandwidth issues with stacked compute and DRAM dies because the bandwidth is limited by the periphery constraints from the number of I/Os on the sides of the HBMs and the compute die.

Some embodiments describe a packaging technology to improve performance of an AI processing system resulting in an ultra-high bandwidth AI processing system. In some embodiments, an integrated circuit package is provided which comprises: a substrate; a first die on the substrate, and a second die stacked over the first die, wherein the first die comprises memory and the second die comprises computational logic. In some embodiments, the first die comprises dynamic access memory (DRAM) having bit-cells, wherein each bit-cell comprises an access transistor and a capacitor.

In other embodiments, the DRAM below the compute die can be replaced with or supplemented with other fast access memories like ferroelectric RAM (FeRAM), static random-access memory (SRAM), and other non-volatile memories such as flash, NAND, magnetic RAM (MRAM), Fe-SRAM, Fe-DRAM, and other resistive RAMs (Re-RAMs) etc. The memory of the first die may store input data and weight factors. The computational logic of the second die is coupled to the memory of the first die. The second die can be an inference die that applies fixed weights for a trained model to an input data to generate an output. In some embodiments, the second die includes processing cores (or processing entities (PEs)) that have matrix multipliers, adders, buffers, etc. In some embodiments, first die comprises a high bandwidth memory (HBM). HBM may include a controller and memory arrays.

In some embodiments, the second die includes an application specific integrated circuit (ASIC) which can train the model by modifying the weights and also use the model on new data with fixed weights. In some embodiments, the memory comprises a DRAM. In some embodiments, the memory comprises an SRAM (static random-access memory). In some embodiments, the memory of the first die comprises MRAM (magnetic random-access memory). In some embodiments, the memory of the first die comprises Re-RAM (resistive random-access memory). In some embodiments, the substrate is an active interposer, and the first die is embedded in the active interposer. In some embodiments, the first die is an active interposer itself.

In some embodiments, the integrated circuit package is a package for a system-on-chip (SOC). The SOC may include a compute die on top of a memory die; an HBM, and a processor die coupled to memory dies adjacent to it (e.g., on top of or on the side of the processor die). In some embodiments, the SOC include a solid-state memory die.

There are many technical effects of the packaging technology of various embodiments. For example, by placing the memory die below the compute die, or by placing one or more memory dies on the side(s) of the compute die, AI system performance improves. The thermal issues related to having compute die being away from the heat sink are addressed by placing the memory below the compute die. Ultra high-bandwidth between the memory and compute dies is achieved by tight micro-bump spacing between the two dies. In existing systems, the bottom die is highly perforated by TSVs to carry signals to and from active devices of the compute die to the active devises of the memory die via the micro-bumps. By placing the memory die below the compute die such that their active devices are positioned closer to one another (e.g., face-to-face), the perforation requirement for the bottom die is greatly reduced. This is because the relation between the number of micro-bumps and the TSVs is decoupled. For example, the die-to-die I/O density is independent of the TSV density. The TSVs though the memory die are used to provide power and ground, and signals from a device external to the package. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" or BE generally refers to a section of a die which is opposite of a "frontend" of FE and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a high-level architecture of an artificial intelligence (AI) machine 100 comprising a compute die positioned on top of a memory die, in accordance with some embodiments. AI machine 100 comprises computational block 101 or processor having random-access memory (RAM) 102 and computational logic 103; static random-access memory (SRAM) 104, main processor 105, dynamic random-access memory (DRAM) 106, and solid-state memory or drive (SSD) 107. In some embodiments, some or all components of AI machine 100 are packaged in a single package forming a system-on-chip (SOC). In some embodiments, computational block 101 is packaged in a single package and then coupled to processor 105 and memories 104, 106, and 107 on a printed circuit board (PCB). In various embodiments, computational block 101 comprises a special purpose compute die 103 or microprocessor. In some embodiments, RAM 102 is DRAM which forms a special memory/cache for the special purpose compute die 103. The DRAM can be embedded DRAM (eDRAM) such as 1T-1C (one transistor and one capacitor) based memories. In some embodiments, RAM 102 is Ferro-electric RAM (Fe-RAM).

In some embodiments, compute die 103 is specialized for applications such as Artificial Intelligence, graph processing, and algorithms for data processing. In some embodiments, compute die 103 further has logic computational blocks, for example, for multipliers and buffers, a special data memory block (e.g., buffers) comprising DRAM. In some embodiments, DRAM 102 has weights and inputs stored in-order to improve the computational efficiency. The interconnects between processor 105 (also referred to as special purpose processor), SRAM 104 and Compute die 103 are optimized for high bandwidth and low latency. In some embodiments, SRAM 104 is replaced by Fe-RAM. The architecture of FIG. 1 allows efficient packaging to lower the energy/power/cost and provides for ultra-high bandwidth between DRAM 102 and compute block of 101.

In some embodiments, RAM 102 comprises DRAM which is partitioned to store input data (or data to be processed) 102a and weight factors 102b. In some embodiments, RAM 102 comprises Fe-RAM. For example, RAM 102 comprises FE-DRAM or FE-SRAM. In some embodiments, input data 102a is stored in a separate memory (e.g., a separate memory die) and weight factors 102b are stored in a separate memory (e.g., separate memory die).

In some embodiments, computational logic 103 comprises matrix multiplier, adder, concatenation logic, buffers, and combinational logic. In various embodiments, computational logic 103 performs multiplication operation on inputs 102a and weights 102b. In some embodiments, weights 102b are fixed weights. For example, processor 105 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 102b. In various embodiments, the input data, that is to be analyzed using a trained model, is processed by computational block 101 with computed weights 102b to generate an output (e.g., a classification result).

In some embodiments, SRAM 104 is ferroelectric based SRAM. For example, a six transistor (6T) SRAM bit-cells having ferroelectric transistors are used to implement a non-volatile Fe-SRAM. In some embodiments, SSD 107 comprises NAND flash cells. In some embodiments, SSD 107 comprises NOR flash cells. In some embodiments, SSD 107 comprises multi-threshold NAND flash cells.

In various embodiments, the non-volatility of Fe-RAM is used to introduce new features such as security, functional safety, and faster reboot time of architecture 100. The non-volatile Fe-RAM is a low power RAM that provides fast access to data and weights. Fe-RAM 104 can also serve as a fast storage for inference die 101 (or accelerator), which typically has low capacity and fast access requirements.

In various embodiments, the Fe-RAM (Fe-DRAM or Fe-SRAM) includes ferroelectric material. The ferroelectric (FE) material may be in a transistor gate stack or in a capacitor of the memory. The ferroelectric material can be any suitable low voltage FE material that allows the FE material to switch its state by a low voltage (e.g., 100 mV). In some embodiments, the FE material comprises a perovskite of the type $ABO_3$, where 'A' and B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type AA'BB' $O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. In some embodiments, memory 104 comprises DRAM instead of Fe-RAM.

Figure 2:
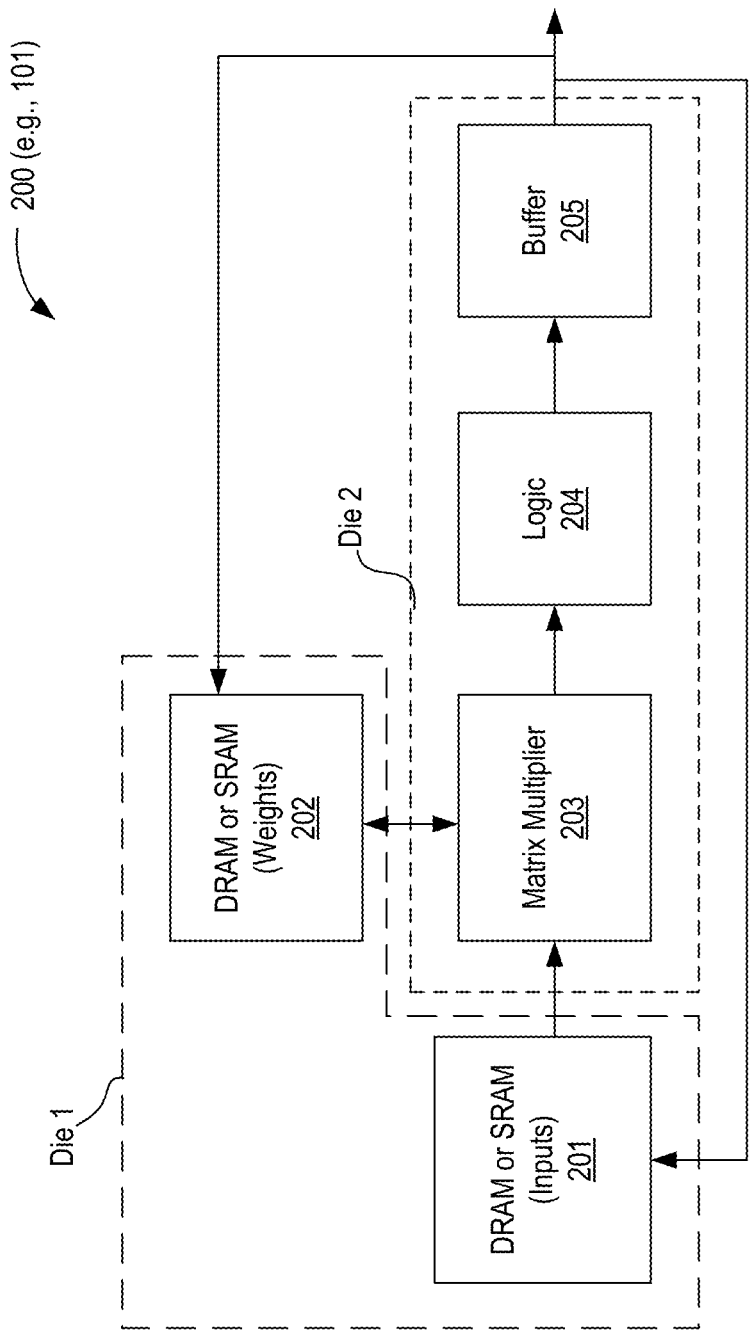
FIG. 2 illustrates an architecture of a computational block comprising a compute die positioned on top of a memory die, in accordance with some embodiments.

FIG. 2 illustrates an architecture of computational block 200 (e.g., 101) comprising a compute die positioned on top of a memory die, in accordance with some embodiments. The architecture of FIG. 2 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 201 to store input data and a second die 202 to store weight factors. In some embodiments, the memory die is a single die that is partitioned such that first partition 201 of the memory die is used to store input data and second partition 202 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 201 and 202, or memory dies 201 and 202 include one or more of: DRAM, FE-SRAM, FE-DRAM, SRAM, and/or MRAM. In some embodiments, input data stored in memory partition or die 201 is the data to be analyzed by a trained model with fixed weights stored in memory partition or die 202.

In some embodiments, the compute die comprises matrix multiplier 203, logic 204, and temporary buffer 205. Matrix multiplier 203 performs multiplication operation on input data 'X' and weights 'W' to generate an output 'Y'. This output may be further processed by logic 204. In some embodiments, logic 204 performs: a threshold operation, pooling and drop out operations, and/or concatenation operations to complete the AI logic primitive functions. In some embodiments, the output of logic 204 (e.g., processed output 'Y') is temporarily stored in buffer 205. In some embodiments, buffer 205 is memory such as one or more of: DRAM, Fe-SRAM, Fe-DRAM, MRAM, resistive RAM (Re-RAM) and/or SRAM. In some embodiments, buffer 205 is part of the memory die (e.g., Die 1). In some embodiments, buffer 205 performs the function of a re-timer. In some embodiments, the output of buffer 205 (e.g., processed output 'Y') is used to modify the weights in memory partition or die 202. In one such embodiment, computational block 200 not only operates as an inference circuitry, but also as a training circuitry to train a model. In some embodiments, matrix multiplier 203 includes an array of multiplier cells, wherein the DRAMs 201 and 202 include arrays of memory bit-cells, respectively, wherein each multiplier cell is coupled to a corresponding memory bit-cell of DRAM 201 and/or DRAM 202. In some embodiments, computational block 200 comprises an interconnect fabric coupled to the array of multiplier cells such that each multiplier cell is coupled to the interconnect fabric.

Architecture 200 provides reduced memory accesses for the compute die (e.g., die 2) by providing data locality for weights, inputs and outputs. In one example, data from and to the AI computational blocks (e.g., matrix multiplier 203) is locally processed within a same packaging unit. Architecture 200 also segregates the memory and logic operations on to a memory die (e.g., Die 1) and a logic die (e.g., Die 2), respectively, allowing for optimized AI processing. Desegregated dies allow for improved yield of the dies. A high capacity memory process for Die 1 allows reduction of power of the external interconnects to memory, reduces cost of integration, and also results in a smaller foot-print.

Figure 3A:
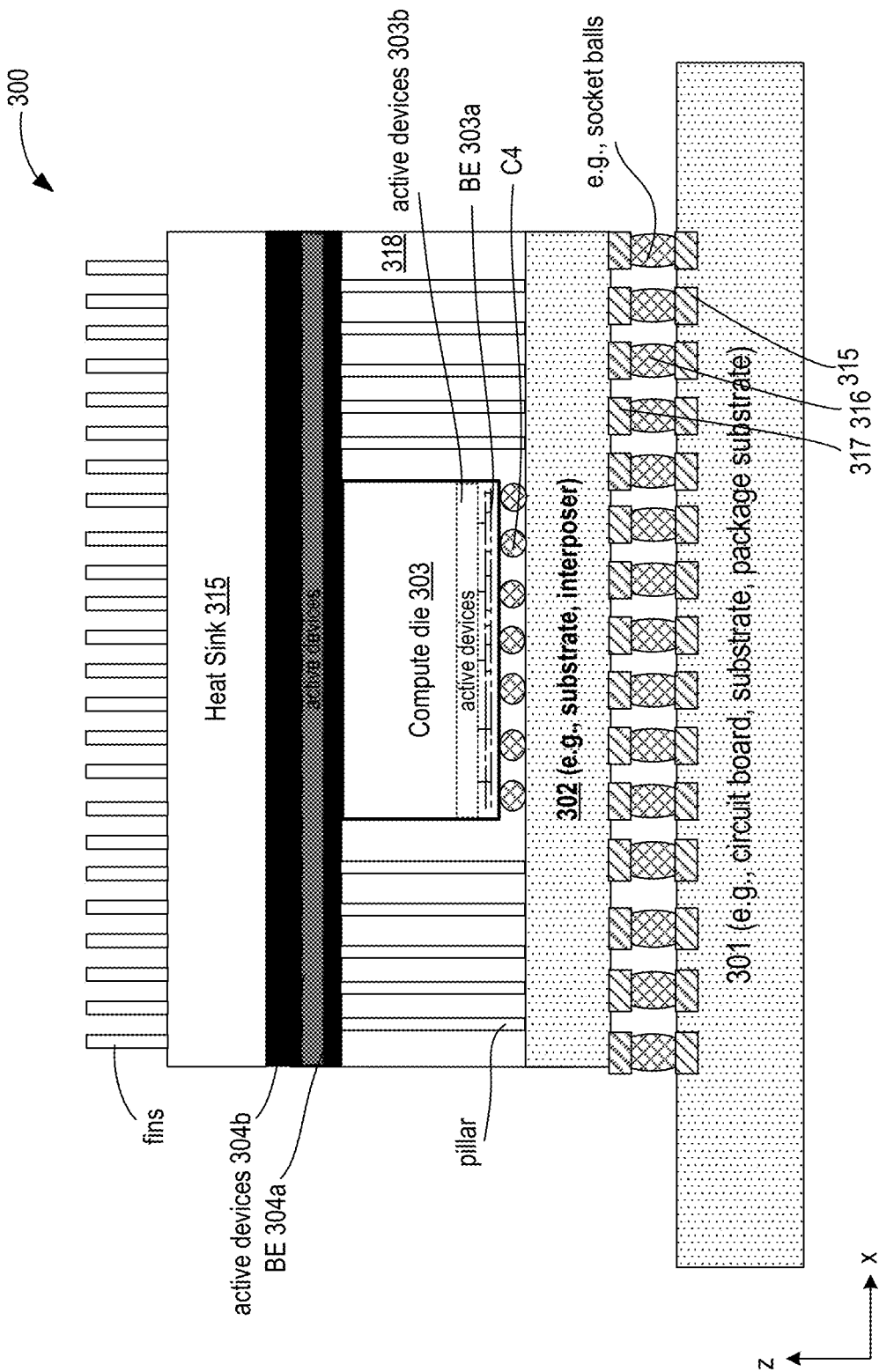
FIG. 3A illustrates a cross-section of a package where the compute die is below the memory die resulting in limited I/O (input-output) bandwidth and thermal issues for the compute die.

FIG. 3A illustrates a cross-section of package 300 (also referred to as package configuration 300) where a compute die is below a memory die resulting in limited I/O bandwidth and thermal issues for the compute die. In some embodiments, integrated circuitry (IC) package assembly is coupled to circuitry board 301. In some embodiments, circuit board 301 may be a Primed Circuit Board (PCB) composed of an electrically insulative material such as an epoxy laminate. For example, circuit board 301 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material. In some embodiments, layer 301 is a package substrate and is part of the IC package assembly.

The IC package assembly may include substrate 302, compute die 303, and memory die 304. In this case, memory die 304 is above compute die 304. Here, compute die 303 is coupled to memory die 304 by pillar interconnects such as copper pillars. Memory die 303 communicates with compute die 304 through these, pillar interconnects. The pillar interconnects are embedded in a dielectric 318 (or encapsulant 318).

Package substrate 302 may be a coreless substrate. For example, package substrate 302 may be a "bumpless" build-up layer (BBUL) assembly that includes a plurality of "bumpless" build-up layers. Here, the term "bumpless build-up layers" generally refers to layers of substrate and components embedded therein without the use of solder or other attaching means that may be considered "bumps." However, the various embodiments are not limited to BBUL type connections between die and substrate, but can be used for any suitable flip chip substrates. The one or more build-up layers may have material properties that may be altered and/or optimized for reliability, warpage reduction, etc. Package substrate 302 may be composed of a polymer, ceramic, glass, or semiconductor material. Package substrate 302 may be a conventional cored substrate and/or an interposer. Package substrate 302 includes active and/or passive devices embedded therein.

The upper side of package substrate 302 is coupled to compute die 303 via C4 bumps. The lower opposite side of package substrate 302 is coupled to circuit board 301 by package interconnects 317. Package interconnects 316 may couple electrical routing features 317 disposed on the second side of package substrate 302 to corresponding electrical routing features 315 on circuit board 301.

Here, the term "C4" bumps ((also known as controlled collapse chip connection) provides a mechanism for interconnecting semiconductor devices. These bumps are typically used in flip-chip packaging technology, but are not limited to that technology.

Package substrate 302 may have electrical routing features formed therein to route electrical signals between compute die 303 (and/or memory die 304) and circuit board 301 and/or other electrical components external to the IC package assembly. Package interconnects 316 and die interconnects 310 include any of a wide variety of suitable structures and/or materials including, for example, bumps, pillars or halls formed using metals, alloys, solderable material, or their combinations. Electrical routing features 315 may be arranged in a ball grid array ("BGA") or other configuration. Compute die 303 and/or memory die 304 includes two or more dies embedded in encapsulant 318. Here, heat sink 315 and associated fins are coupled to memory die 304.

In this example, compute die 303 is coupled to memory die 304 in a front-to-back configuration (e.g., the "front" or "active" side of memory die 304 is coupled to the "back" or "inactive" of compute die 303). The backend (BE) interconnect layers 303a and active device 303b of compute die 303 are closer to the C4 humps than to DRAM die 304. The BE interconnect layers 304a and active devices 304b (e.g., transistors) of DRAM die 304 are closer to compute die 303 than heat sink 315.

In this example, the stacking of DRAM die 304 on top of compute die 303 is not wafer-to-wafer bonding. This is evident from the different surface areas of the two dies being different. Pillars such as TSVs are used to communicate between circuit board 301, compute die 303, and DRAM die 304. This particular packaging configuration has limited I/O bandwidth because DRAM die 304 and compute die 303 communicate via pillars in the periphery. Signals from compute die 303 are routed via C4 bumps and through substrate 302 and pillars before they reach active devices 304b via BE 304a of DRAM die 304. This long route along with limited number of pillars and C4 humps limits the overall bandwidth of the AI system. Further, this configuration also suffers from thermal issues because the compute die 303 is not directly coupled to heat sink 315. While heat sink 315 is shown as a thermal solution, other thermal solutions may also be used. For example, fan, liquid cooling, etc. may be used in addition to or instead of heat sink 315.

Figure 3B:
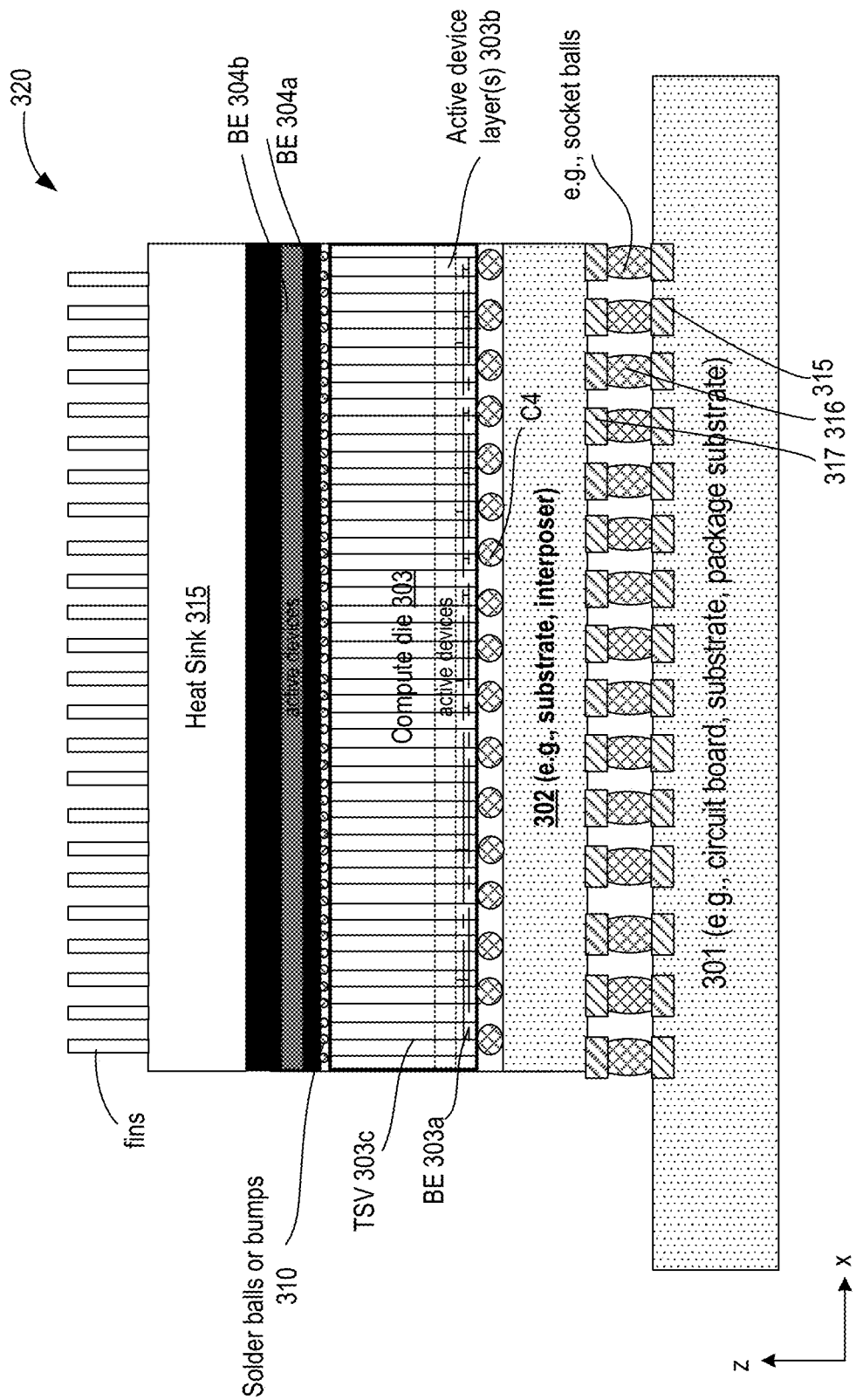
FIG. 3B illustrates a cross-section of a package where the compute die is below the memory die, where the compute die is perforated with high-density through-silicon vias (TSVs) to couple with the bumps between the compute die and the memory die.

FIG. 3B illustrates a cross-section of package 320 where compute die 303 is below memory die 304, where compute die 303 is perforated with high-density through-silicon vias (TSVs) to couple with the bumps between compute die 303 and memory die 304. In this example, compute die 303 and DRAM die 304 are wafer-to-wafer bonded via solder balls or micro-bumps 310, or any suitable technology. The configuration of package 320 results in higher bandwidth than configuration of package 320. This is because the periphery routing via pillars is replaced with direct routing between bumps 310 and TSVs 303*c*. In this packaging configuration, the bottom die 303 is highly perforated by TSVs 303*b* to carry signals to and from active devices of compute die 303 to the active devises of memory die 304 via micro-bumps 310. This perforation is because of a direct link between number of bumps 310 and TSVs 303*b*. In this case, the number of TSVs is same as number of bumps 310. To increase bandwidth, more bumps and TSVs need to be added. However, increasing TSVs limits the routing in compute die 303. Like the configuration of FIG. 3A, here package configuration 320 also suffers from thermal issues because compute die 303 is not directly coupled to heat sink 315.

FIG. 3C illustrates cross-section of a package 330 where high bandwidth memory (HBM) are on either side of compute die 303 resulting in limited I/O bandwidth due to periphery constraints for number of I/Os. In this case, memory dies are not stacked over compute die 303 but placed adjacent or laterally next to compute die 303 as HBM 334 and 335. The bandwidth of this configuration is limited by periphery constraints in region 326 between bumps 310 of HBM 334/335 and compute die 303. As such, memory access energy is higher than package configuration 320 because memory access is non-uniform ally distributed. In this configuration, the number of channels is limited by the number of peripheral I/O count in regions 336.

Figure 4A:
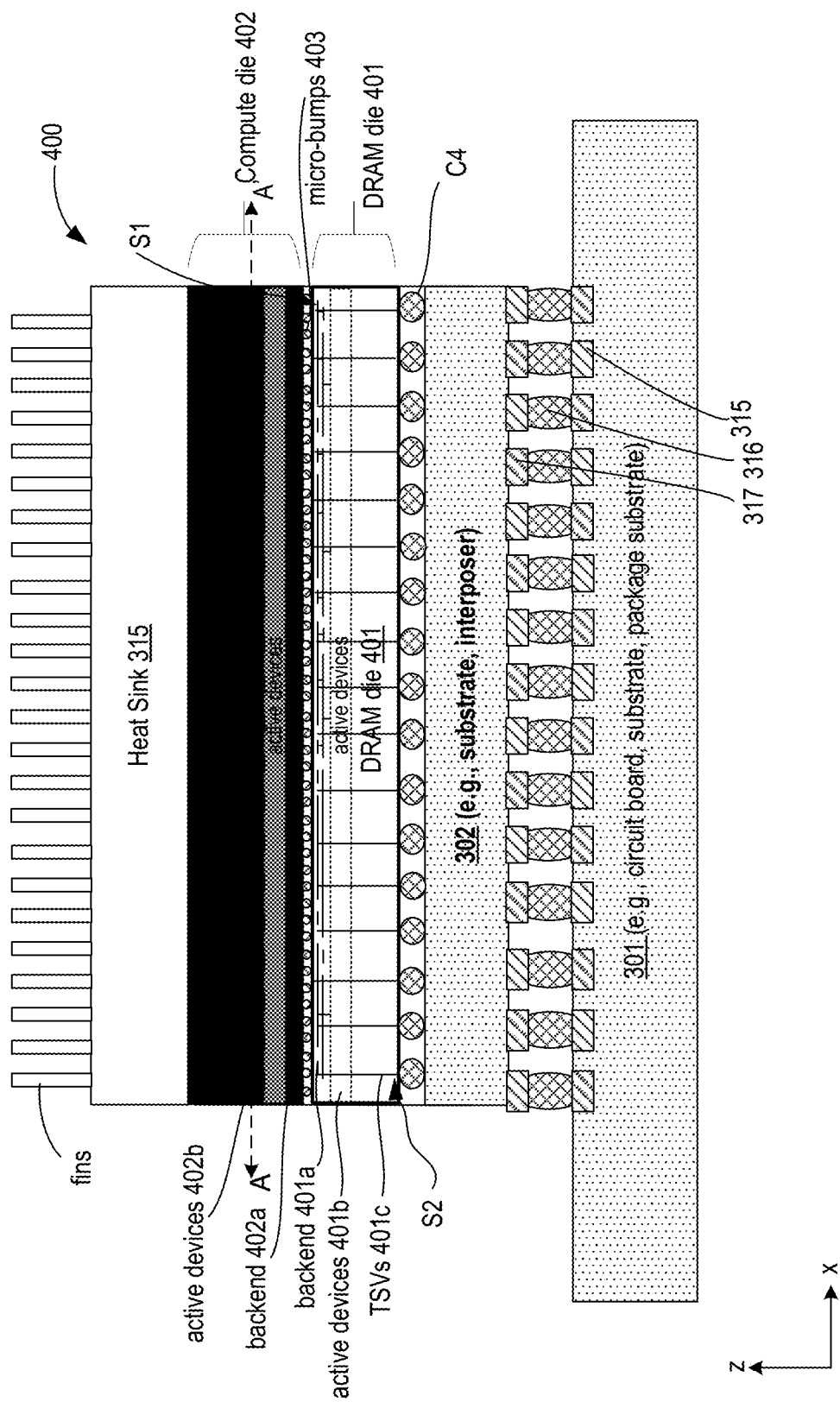
FIG. 4A illustrates a cross-section of a package comprising a computational block, which includes a compute die (e.g., an inference logic die) above a dynamic random-access memory (DRAM) die, in accordance with some embodiments.

FIG. 4A illustrates a cross-section of package 400 (herein referred to as package configuration 400) comprising a computational block, which includes a compute die (e.g., an inference logic die) above a dynamic random-access memory (DRAM) die, in accordance with some embodiments. This particular topology enhances the overall performance of the AI system by providing ultra-high bandwidth compared to package configurations of FIGS. 3A-C. Compared to FIG. 3B, here DRAM die 401 is positioned under compute die 402 and the two dies are wafer-to-wafer bonded via micro-bumps 403, copper-to-copper (Cu-to-Cu) pillars, hybrid Cu-to-Cu pillars 403, wire bond, flip-chip ball grid array routing, chip-on-wafer substrate (COWOS), or embedded multi-die interconnect bridge. In some embodiments, Cu-to-Cu pillars are fabricated with copper pillars formed on each wafer substrate which is to be bonded together. In various embodiments, a conductive material (e.g., Nickel) is coated between the copper pillars of the two wafer dies.

Dies 401 and 402 are bonded such that their respective BE layers and active devices 401*a/b* and 402*a/b* face one another. As such, transistors between the two dies are closest where the die-to-die bonding happens. This configuration reduces the latency because active devices 401*a* and 402*a* are closer to one another compared to the active devices 301*a* and 302*a* of FIG. 3B.

Compared to the configuration of FIG. 3B. TSVs 401*c* are decoupled from micro-bumps (or Cu-2-Cu pillars). For example, the number of TSVs 401*c* are not directly related to the number of micro-bumps 403. As such, memory die TSV perforation requirement is minimized as die-to-die I/O density is independent of TSV density. The Ultra high bandwidth also comes from the tight micro-bump spacing. In some embodiments, the micro-bump spacing 403 is tighter than the micro-bump spacing 310 of FIG. 3B because DRAM 401 is not perforated at the same pitch as in compute die 302 of FIG. 3B. For example, in FIG. 3B micro-bump density is dependent on TSV pitch and overall signal routing design of compute die 302. Package configuration 400 has no such limitation.

Here, DRAM die 401 is perforated to form few TSVs 401*c* that carry DC signals such as power and ground from substrate 302 to compute die 402. External signals (e.g., external to package 400) can also be routed to compute die 402 via TSVs 401*c*. The bulk of all communication between compute die 402 and DRAM die 401 takes place through micro-bumps 403 or face-to-face interconnects 403. In various embodiments, there is no perforation of compute die 402 because TSVs may not be needed. Even if TSVs were used to route to any additional die (not shown) on top of compute die 402, those number of TSVs are not related to the number of micro-bumps 403 in that they may not have to be the same number. In various embodiments, TSVs 401*c* pass through active region or layers (e.g., transistor regions) of DRAM die 401.

In various embodiments, compute die 402 comprises logic portions of an inference die. An inference die or chip is used to apply inputs and fixed weights associated with a trained model to generate an output. By separating the memory 401 associated with inference die 402, the AI performance increases. Further, such topology allows for better use of thermal solution such as heat sink 315, which radiates heat away from the power consuming source, inference die 402. While memory for die 401 is illustrated as DRAM 401, different types of memories can also be used. For example, in some embodiments, memory 402 can be one or more of: FE-SRAM, FE-DRAM, SRAM, MRAM, resistance RAM (Re-RAM), embedded DRAM (E.g., 1T-1C. based memory), or a combination of them. Using FE-SRAM, MRAM, or Re-RAM allows for low power and high-speed memory operation. This allows for placing memory die 401 below compute die 402 to use the thermal solution more efficiently for compute die 402. In some embodiments, memory die 401 is a high bandwidth memory (HBM).

In some embodiments, compute die 402 is an application specific circuit (ASIC), a processor, or some combination of such functions. In some embodiments, one or both of memory die 401 and compute die 402 may be embedded in encapsulant (not shown). In some embodiments, encapsulant can be any suitable material, such as epoxy-based build-up substrate, other dielectric; organic materials, resins, epoxies, polymer adhesives, silicones, acrylics, polyimides, cyanate esters, thermoplastics, and/or thermosets.

The memory circuitry of some embodiments can have active and passive devices in the front side of the die too. Memory die 401 may have a first side S1 and a second side S2 opposite to the first side S1. The first side S1 may be the side of the die commonly referred to as the "inactive" or "back" side of the die. The backside of memory die 401 may include active or passive devices, signal and power routings, etc. The second side S2 may include one or more transistors (e.g., access transistors), and may be the side of the die commonly referred to as the "active" or "front" side of the die. The second side S2 of memory die 401 may include one or more electrical routing features 310. Compute die 402 may include an "active" or "front" side with one or more electrical routing features connected to micro-bumps 403. In some embodiments, electrical routing features may be bond pads, solder balls, or any other suitable coupling technology.

Compared to package configuration 320, here the thermal issue is mitigated because heat sink 315 is directly attached to compute die 402, which generates most of the heat in this packaging configuration. While the embodiment of FIG. 4A is illustrated as wafer-to-wafer bonding between dies 401 and 402, in some embodiments, these dies can also be bonded using wafer-to-die bonding technologies. Compared to package configuration 320, higher bandwidth is achieved between DRAM die 401 and compute die 402 as higher number of channels are available between memory die 401 and compute die 402. Further, memory access energy is reduced compared to memory access energy of package configuration 320 because memory access is direct and uniform as opposed to indirect and distributed. Due to local access of memory in die by processing elements (PE) of compute die 402, latency is reduced compared to latency in package configuration 320. The close and direct connection between compute die 402 and memory die 401 allows memory of memory die 401 to behave as a fast-accessible cache memory.

In some embodiments, the IC package assembly may include, for example, combinations of flip-chip and wire-bonding techniques, interposers, ulti-chip package configurations including system-on-chip (SoC) and/or package-on-package (PoP) configurations to route electrical signals.

Figure 4B:
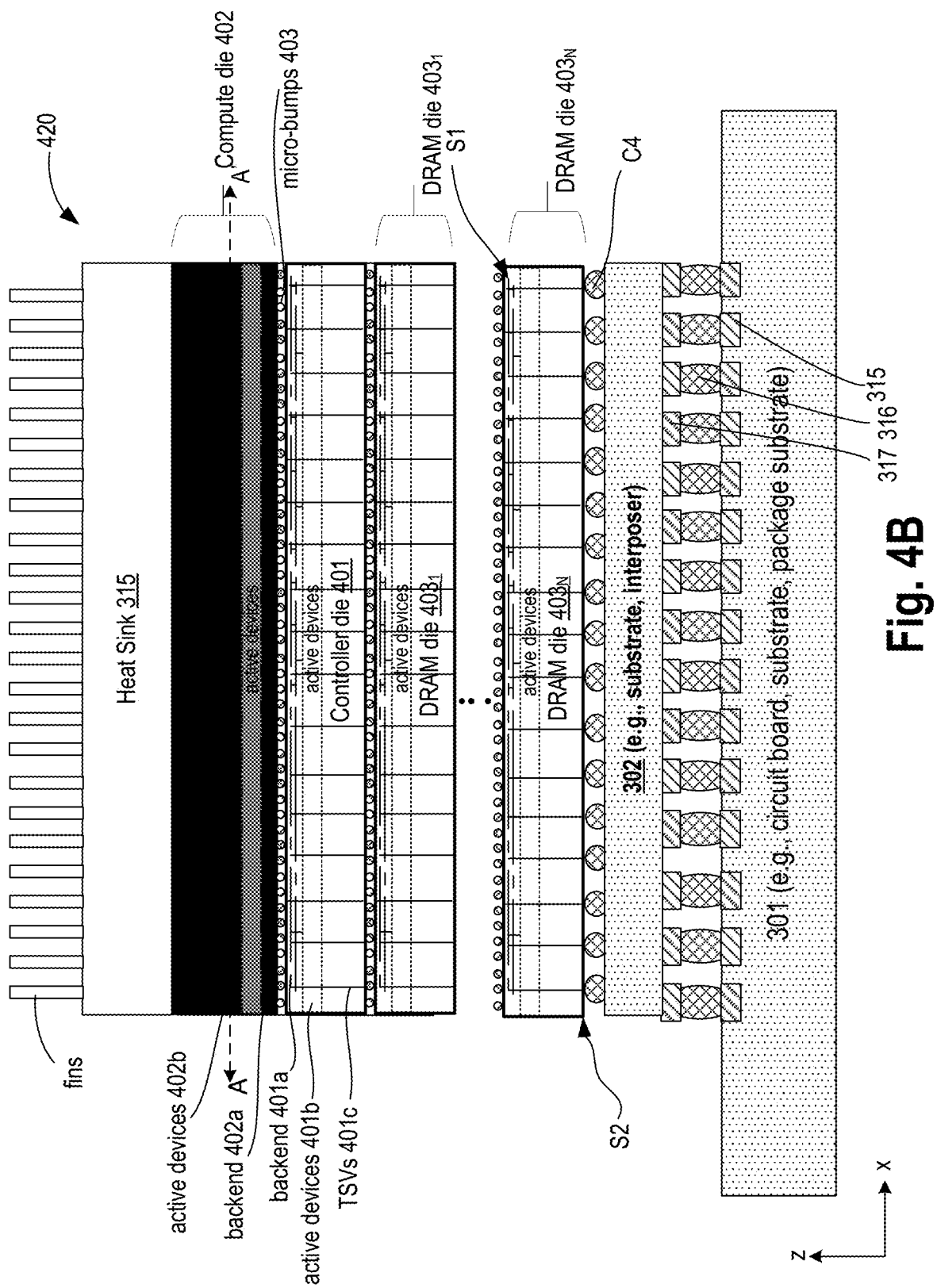
FIG. 4B illustrates a cross-section of a package comprising a computational block, which includes a compute die (e.g., an inference logic die) above a stack of memory dies and a controller logic die, in accordance with some embodiments.

FIG. 4B illustrates a cross-section of package 420 (herein also referred to as package configuration 420) comprising a computational block, which includes a compute die (e.g., an inference logic die) above a stack of memory dies and a controller logic die, in accordance with some embodiments. Compared to package configuration 400, here a stack of memory dies is positioned below compute die 402. The stack of memory dies include die 401 which may include memory (such as cache) and controller circuitries (e.g., row/column controllers and decoders, read and write drivers, sense amplifiers etc.). Below die 401, memory dies $403_{1-N}$ are stacked, where die $403_1$ is adjacent to die 401 and die $403_N$ is adjacent to substrate 302, and where 'N' is an integer greater than 1. In some embodiments, each die in the stack is wafer-to-wafer bonded via micro-bumps or Cu-to-Cu hybrid pillars. In various embodiments, the active devices of each memory die $403_{1-N}$ are away from C4 bumps and more towards active devices of 402a.

However, in some embodiments, memory dies $403_{1-N}$ can be flipped so that the active devices face substrate 302. In some embodiments, connection between compute die 402 and first memory die 401 (or controller die with memory) is face-to-face, and can result in higher bandwidth for that interface compared to interfaces with other memory dies in the stack. The TSVs through the memory dies can carry signal and power from compute die 402 to C4 bumps. The TSVs between various memory dies can carry signals between the dies in the stack, or power (and ground) to the C4 bumps. In some embodiments, communication channel between compute die 402 or memory dies across the stack is connected through TSVs and micro-bumps or wafer-to-wafer Cu-hybrid bonds. While the embodiment of FIG. 4B illustrates the memory to be DRAM, the memory can be embedded DRAM, SRAM, flash, Fe-RAM, MRAM, Fe-SRAM, Re-RAM, etc. or a combination of them.

In some embodiments, variable pitch TSVs (e.g., TSVs 401c) between memory dies (e.g., 401 and/or $403_{1-N}$) enables high count of I/Os between the dies, resulting in distributed bandwidth. In some embodiments, stacked memory dies connected through combinations of TSVs, and bonding between dies (e.g., using micro-hump or wafer-to-wafer bonding), can carry power and signals. In some embodiments, variable pitch TSVs enable high density on bottom die (e.g., die 401), with I/Os implemented with tighter pitch, while power and/or ground lines are implemented with relaxed pitch TSVs.

Figure 4C:
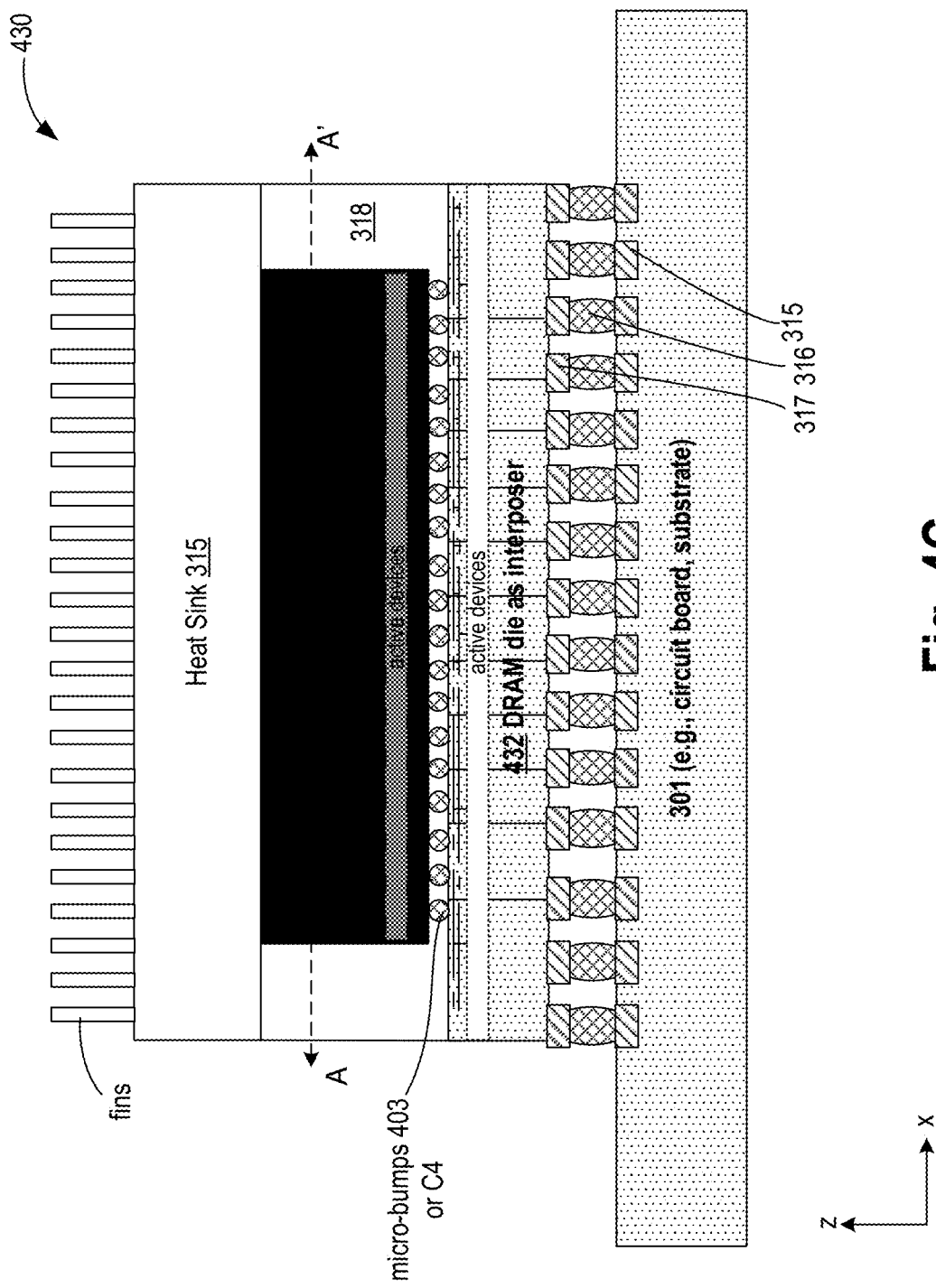
FIG. 4C illustrates a cross-section of a package comprising a computational block, which includes a compute die over a memory (e.g., DRAM) that also functions as an interposer, in accordance with some embodiments.

FIG. 4C illustrates a cross-section of package 430 (also referred to as package configuration 430) comprising a computational block, which includes a compute die over a memory (e.g., DRAM) that also functions as an interposer, in accordance with some embodiments. In some embodiments, compute die 402 is embedded in encapsulant 318. In some embodiments, encapsulant 318 can be any suitable material, such as epoxy-based build-up substrate, other dielectric/organic: materials, resins, epoxies, polymer adhesives, silicones, acrylics, polyimides, cyanate esters, thermoplastics, and/or thermosets.

Compared to package configuration 400, here memory die 401 is removed and integrated in interposer 432 such that the memory provides storage function as well as a function of an interposer. This configuration allows for reducing package cost. Interconnections 403 (e.g., C4 bumps or micro bumps) now electrically couple compute die 402 to memory 432. Memory 432 may comprise DRAM, embedded DRAM, flash, SRAM, FE-DRAM, SRAM, MRAM, Re-RAM or a combination of them. The same advantages of FIG. 4A are also realized in this embodiment. In some embodiments, memory die 401 is embedded in substrate or interposer 302.

In some embodiments, a compute die and two or more memories are positioned along a plane of the package, and a memory is provided that also functions as an interposer. In some embodiments, memory interposer 432 is replaced with a three dimensional (3D) RAM stack that also functions as an interposer. In some embodiments, the 3D memory stack is a stack of DRAM, embedded DRAM, MRAMs, Re-RAMs, or SRAMs.

Figure 5A:
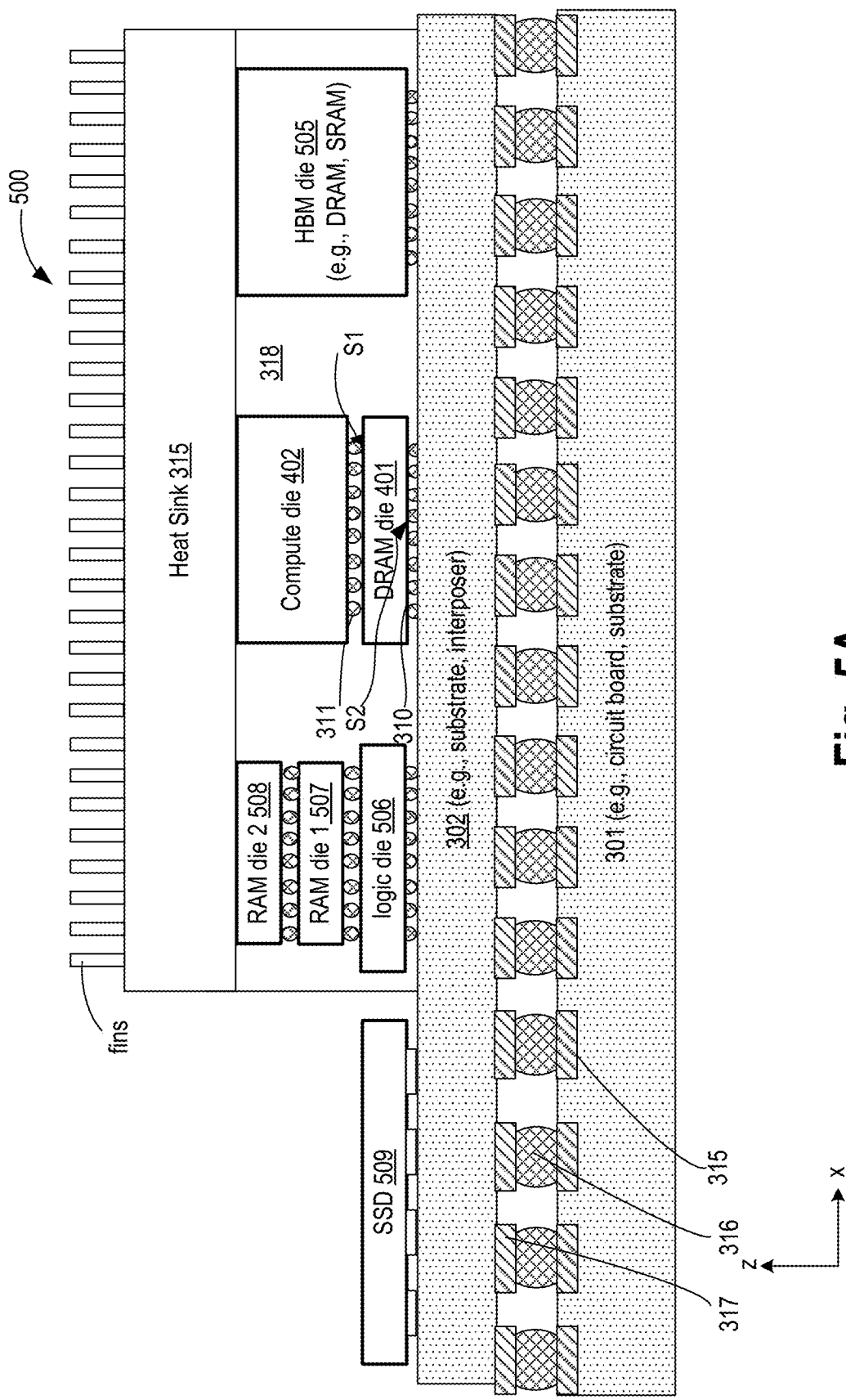
FIG. 5A illustrates a cross-section of package comprising an AI machine, which includes a system-on-chip (SOC) having a computational block, which includes a compute die over a DRAM, in accordance with some embodiments.

FIG. 5A illustrates a cross-section of package 500 comprising an AI machine, which includes a system-on-chip (SOC) having a computational block, which includes a compute die over a memory, in accordance with some embodiments. Package 500 comprises processor die 506 coupled to substrate or interposer 302. Two or more memory dies 507 (e.g., memory 104) and 508 (e.g., memory 106) are stacked on processor die 506. Processor die 506 (e.g., 105) can be any one of: central processing unit (CPU), graphics processor unit (GPU), DSP, field programmable grid array (FPGA) processor, or application specific integrated circuit (ASIC) processor. Memory (RAM) dies 507 and 508 may comprise DRAM, embedded DRAM, FE-SRAM, FE-DRAM, SRAM, MRAM, Re-RAM or a combination of them. In some embodiments, RAM dies 507 and 508 may include HBM. In some embodiments, one of memories 104 and 106 is implemented as HBM in die 405. The memories in HBM die 505 include any one or more of: DRAM, embedded DRAM, FE-SRAM, FE-DRAM, SRAM, MRAM, Re-RAM or a combination of them. I-Teat sink 315 provides a thermal management solution to the various dies in encapsulant 318. In some embodiments, solid-state drive (SSD) 509 is positioned outside of first package assembly that includes heat sink 315. In some embodiments, SSD 509 includes one of NAND flash memory, NOR flash memory, or any other type of non-volatile memory such as DRAM, embedded DRAM, MRAM, FE-DRAM, FE-SRAM, Re-RAM etc.

Figure 5B:
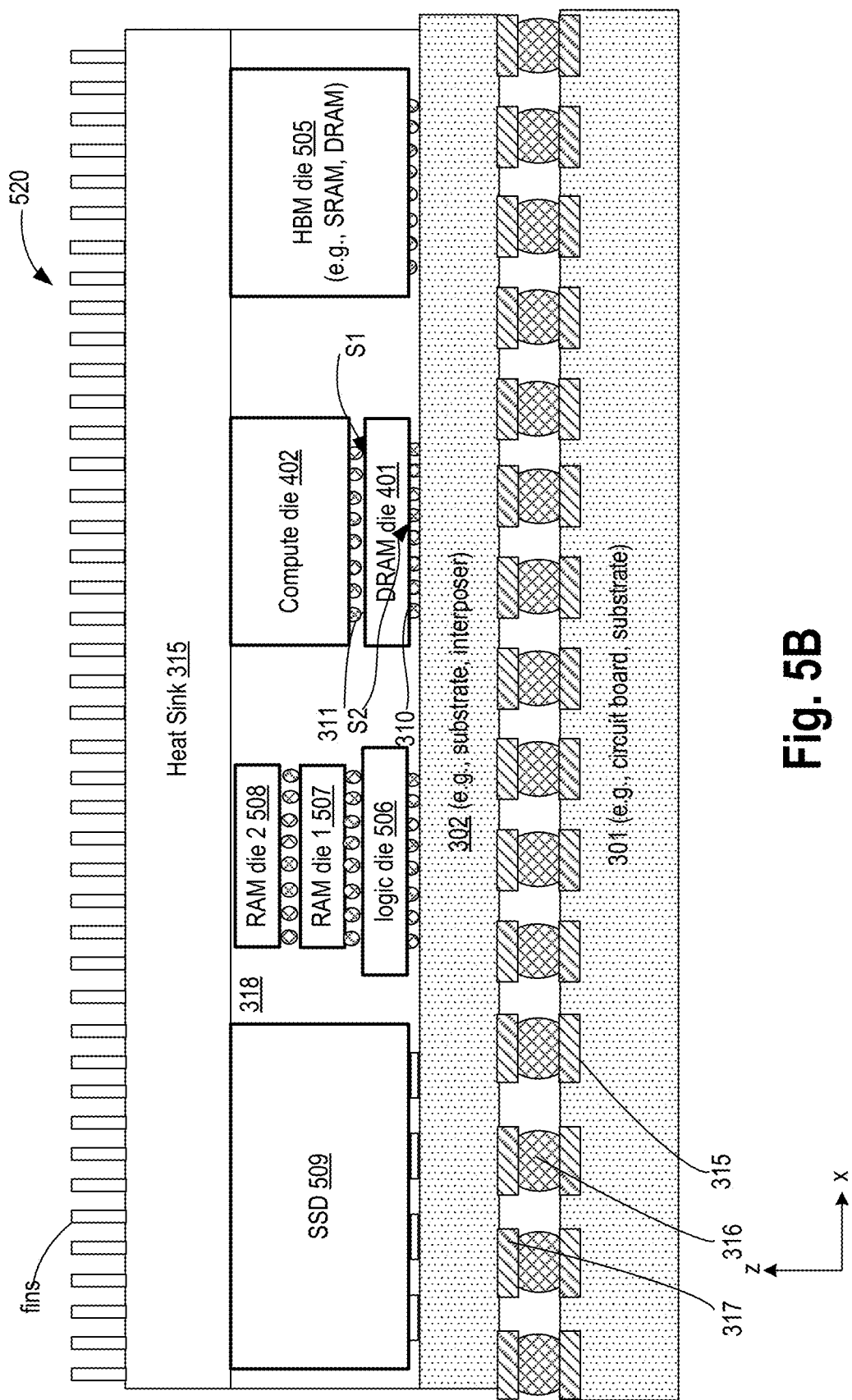
FIG. 5B illustrates a cross-section of a package comprising an AI machine, which includes an SOC having a computational block, which includes a compute die over a DRAM, a processor, and a solid-state memory, in accordance with some embodiments.

FIG. 5B illustrates a cross-section of package 520 comprising an AI machine, which includes an SOC having a computational block, which includes a compute die over a memory, a processor, and a solid-state memory, in accordance with some embodiments. Package 520 is similar to package 500 but for incorporating SSD 509 within a single package under a common heat sink 315. In this case, a single packaged SOC provides an AI machine which includes the capability of generating a training model and then using the trained model for different data to generate output.

Figure 5C:
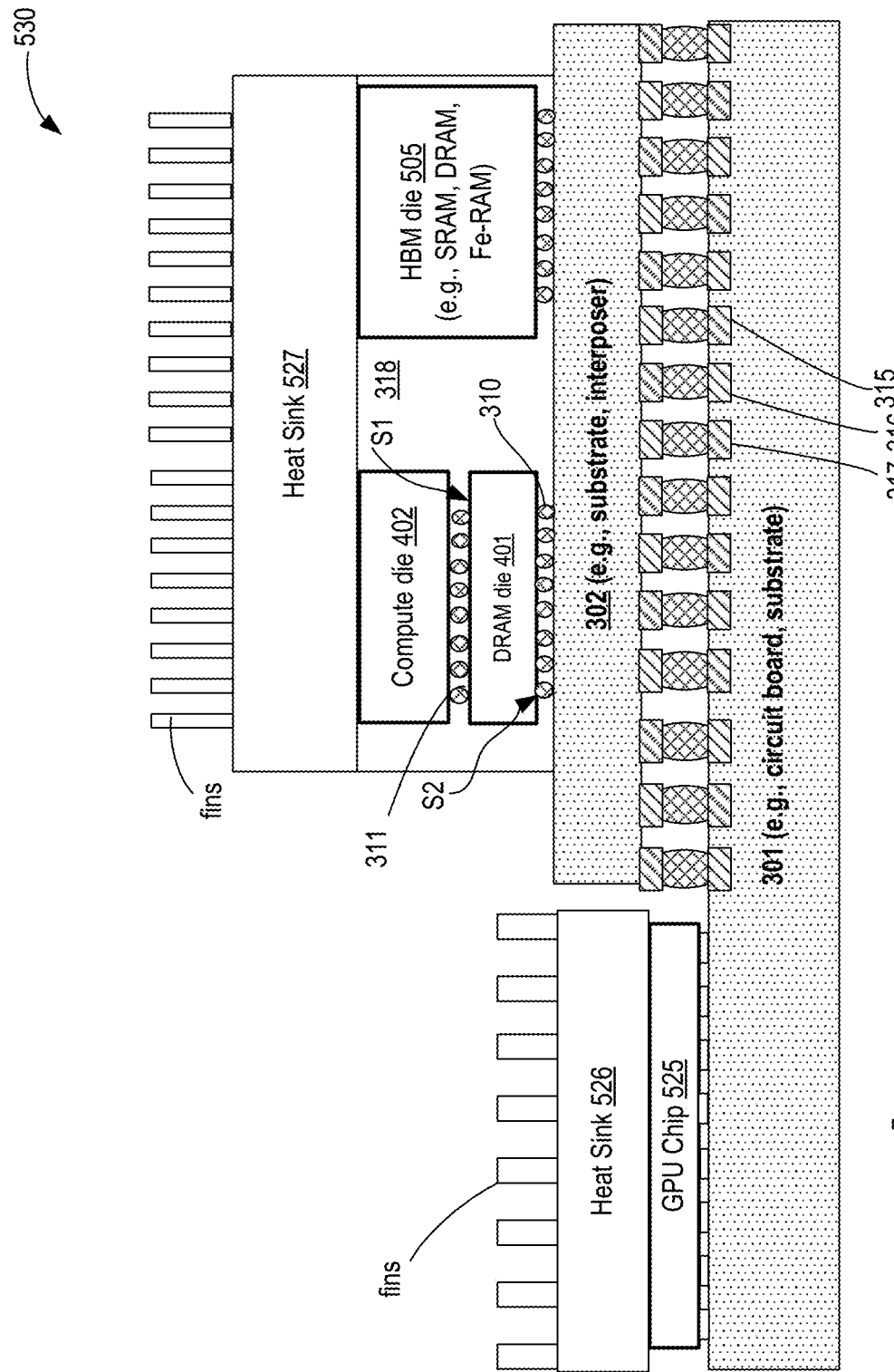
FIG. 5C illustrates a cross-section of multiple packages on a circuit board, where one of the packages includes a compute die over a memory die, and another of the packages includes a graphics processor unit, in accordance with some embodiments.

FIG. 5C illustrates cross-section 530 of multiple packages on a circuit board, where one of the packages includes a compute die over a memory die, and another of the packages includes a graphics processor unit, in accordance with some embodiments. In this example, an AI processor such as CPU 525 (GPU, DSP, FPGA, ASIC, etc.) is coupled to substrate 301 (e.g., printed circuit board (PCB)). Here, two packages are shown—one with heat sink 526 and the other with heat sink 527. Heat sink 526 is a dedicated thermal solution for GPU chip 525 while heat sink 527 provides a thermal solution for the computational block (dies 402 and 304) with HBM 505).

FIG. 6A illustrates unit cell (or processing element (PE)) 600 of compute die 402 which is configured to couple with memory die 401 below it, in accordance with some embodiments. In some embodiments, PE 600 comprises matrix multiplication unit (MMU) 601, registers 602, system bus controller 603, east/west (E/W) bus 604, north/south (N/S) bus 605, local memory controller 606, and die-to-die I/interface 607. MMU 601 plays the same role as multiplier 103 while registers 602 are used to save inputs 102a and weights 102b. System bus controller 603 controls the data and control communication by E/W bus 604 and N/W bus 605. Local memory controller 606 controls selection of inputs and weights and associated read and write drivers. Die-to-die I/O interface communicates with the memory unit cell underneath.

FIG. 6B illustrates unit cell 620 of memory die 401 which is configured to couple with compute die 402 above it, in accordance with some embodiments. Memory unit cell 600 comprises an array of bit-cells, where each array can be a unit array cell. In this example, a 4×4 unit array is shown, where each unit array (e.g., Array 0,0; Array 0,4; Array 4,0; Array 4,4) includes a plurality of bit-cells arranged in rows and columns. However, any N×M array can be used for the unit array, where 'N' and 'M' are integers that can be same or different numbers. The bit-cells of each array are accessible by a row address decoder. The bit-cells of each array can be read from and written to using the adjacent read/write control and drivers. Unit cell 600 includes control and refresh logic 626 to control reading and writing to the bit-cells of the array. Unit cell 600 includes die-to-die I/O interface 627 which is used to communicate with die-to-die I/O interface 607 of PE 600.

Figure 7A:
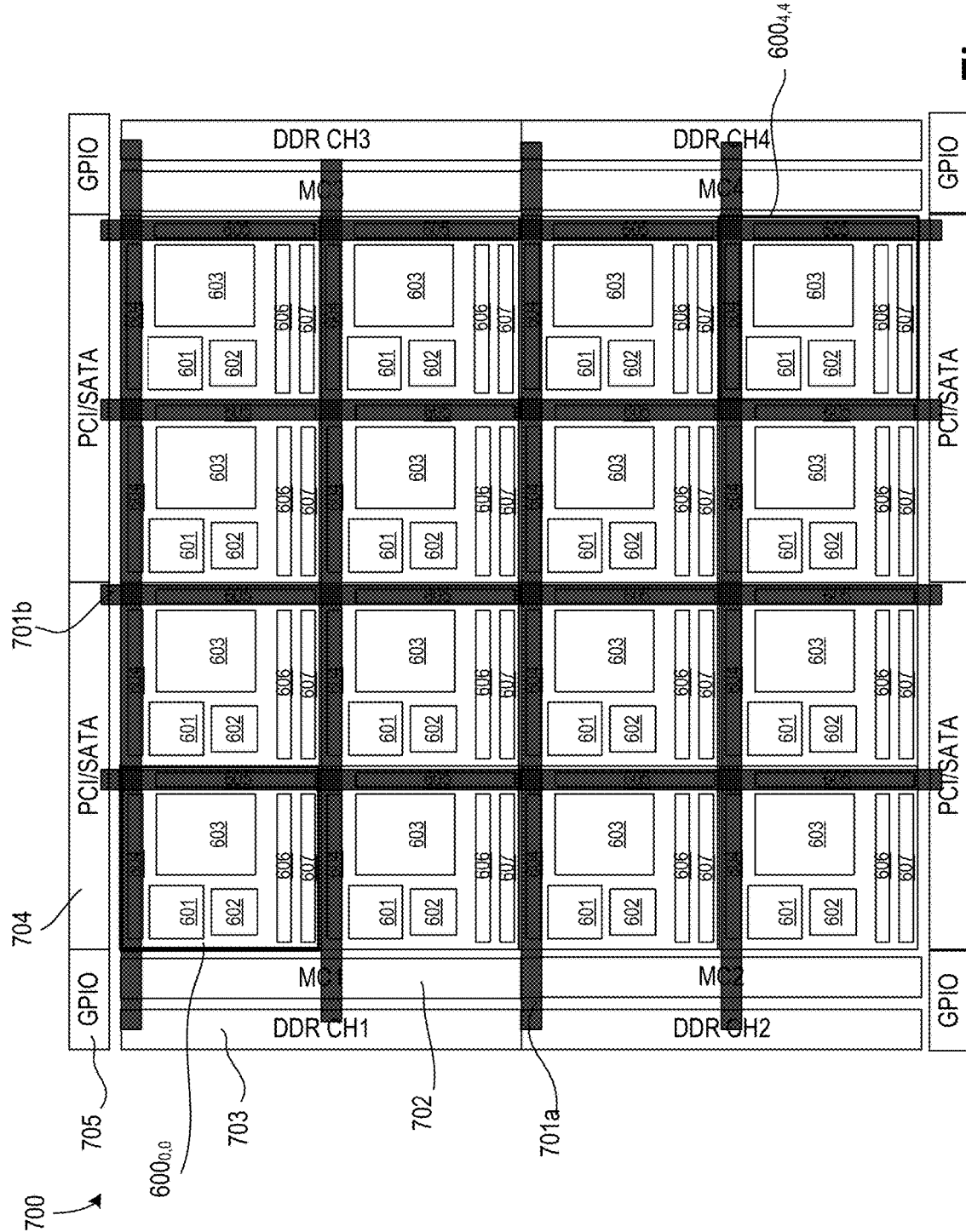
FIG. 7A illustrates a compute die comprising a plurality of unit cells of FIG. 6A, in accordance with some embodiments.

FIG. 7A illustrates compute die 700 (e.g., 402) comprising a plurality of units cells $600_{N,M}$ (where 'N' and 'M' are 4 in this example) of FIG. 6A, in accordance with some embodiments. Note, 'N' and 'M' can be any number depending on the desired architecture. Compute die 700 includes I/O interfaces and memory channels along its periphery. PEs $600_{N,M}$ are accessible by network-on-chip (NoC) comprising routers, drivers, and interconnects 701a and 701b. In some embodiments, two sides (or more) have memory channels (MC) 702 including MC1 through MC4. In some embodiments, compute die 700 includes double data rate (DDR) compliant channels 703 (e.g., DDR CH1, DDR CH2, DDR CH3, DDR CH4). However, the embodiments are not limited to DDR compliant I/O interfaces. Other low power and fast interfaces can also be used. In some embodiments, compute die 700 includes PCIe (peripheral component interconnect express) and/or SATA (Serial AT attachment) interfaces 704. Other serial or parallel I/O interfaces can also be used. In some embodiments, additional general purpose I/O (GPIO) interfaces 705 are added along the periphery of compute die 700. Each PE is above a corresponding memory unit cell. The architecture of compute die 700 allows break up the memory of memory die 401 into as many channels as desired, and assists with increased bandwidth, lower latency, and lower access energy.

FIG. 7B illustrates memory die 720 comprising a plurality of unit cells $620_{N,M}$ (where 'N' and 'M' are 4 in this example) of FIG. 6B, in accordance with some embodiments. In some embodiments, memory die 720 communicates with compute die 700 above it via GPIOs 725. In other embodiments, other types of I/Os may be used to communicate with compute die 700.

FIG. 8 illustrates a cross-section of top view 800 of compute die 402 with micro-humps on the sides to connect with memories along a horizontal plane, in accordance with some embodiments. The shaded regions 801 and 802 on either side of compute die 402 include micro-bumps 803 that are used to connect to memories on either side of compute die 402. Micro-bumps 804 may be used to connect to substrate 302 or interposer 302.

Figure 9:
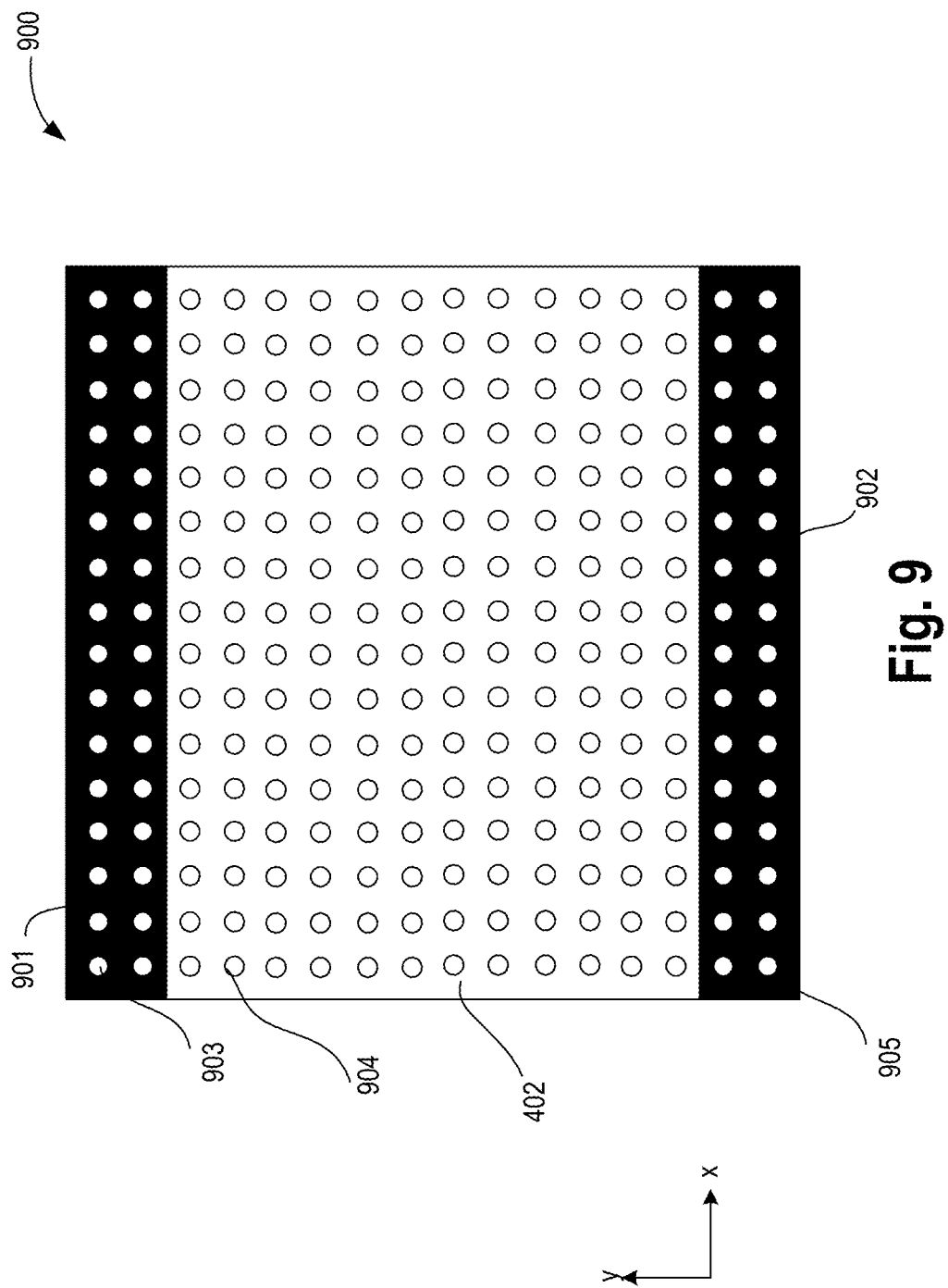
FIG. 9 illustrates a cross-section of a top view of the compute die with micro bumps on the top and bottom of the compute die to connect with memory dies along a vertical plane of the package, in accordance with some embodiments.

FIG. 9 illustrates a cross-section of top view 900 of compute die 402 with micro bumps on the top and bottom of the compute die to connect with memory dies along a vertical plane of the package, in accordance with some embodiments. The shaded regions 901 and 902 on upper and lower side sections of compute die 402 include micro-bumps 903 and 905 that are used to connect to upper and lower memories, respectively. Micro-bumps 904 may be used to connect to substrate 302 or interposer 302.

FIG. 10A illustrates cross-section 1000 of a memory die (e.g., 401), which is below compute die 402, in accordance with some embodiments. Memory die 401 has a pitch of 'L'×'W'. Cross-section 1000 shows strips of TSVs that are used to connect to compute die 402. Strips of shade 1001 carry signals while strips 1002 and 1003 carry power and ground lines. Strip 1004 provides power and ground signals 1005 and 1006 to the memory cells within a row. TSVs 1008 connect signals (e.g., word-line) to memory bit cells.

FIG. 10B illustrates cross-section 1020 of a compute die (e.g., 402), which is above the memory die (e.g., 401), in accordance with some embodiments. TSVs 1028 may couple to TSVs 1008 while strip 1024 is over strip 1004. TSVs 1025 and 1026 couple to TSVs 1005 and 1006, respectively.

Figure 11B:
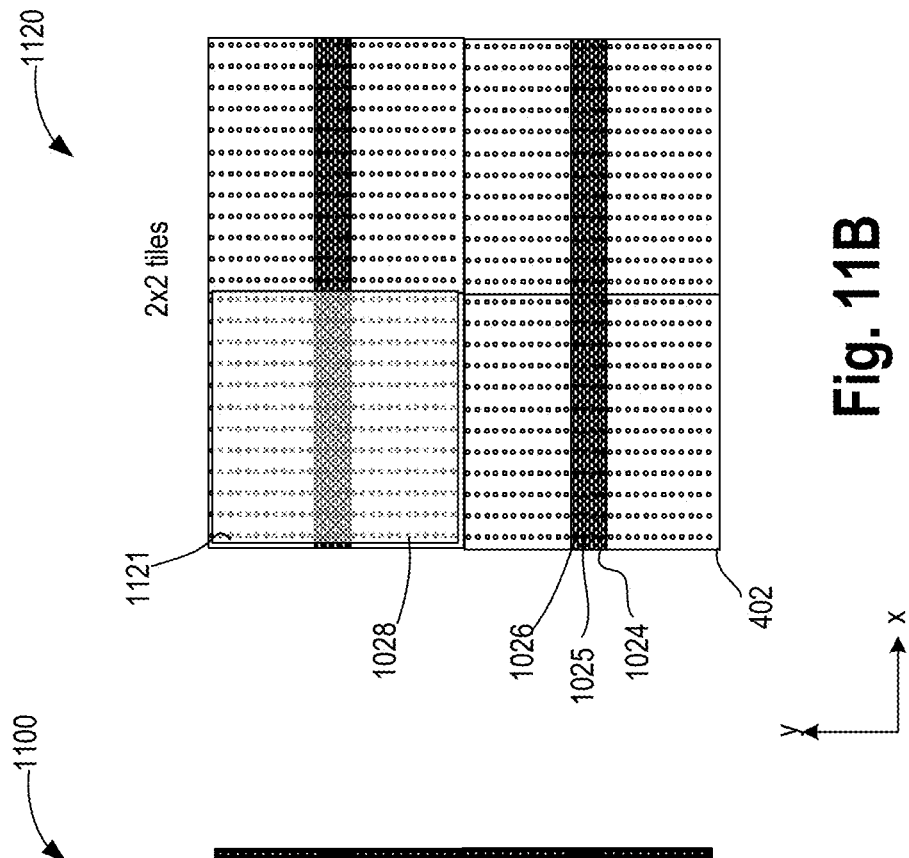
FIG. 11B illustrates a cross-section of a compute die with 2×2 tiles, which is above the memory die, in accordance with some embodiments.
Figure 11A:
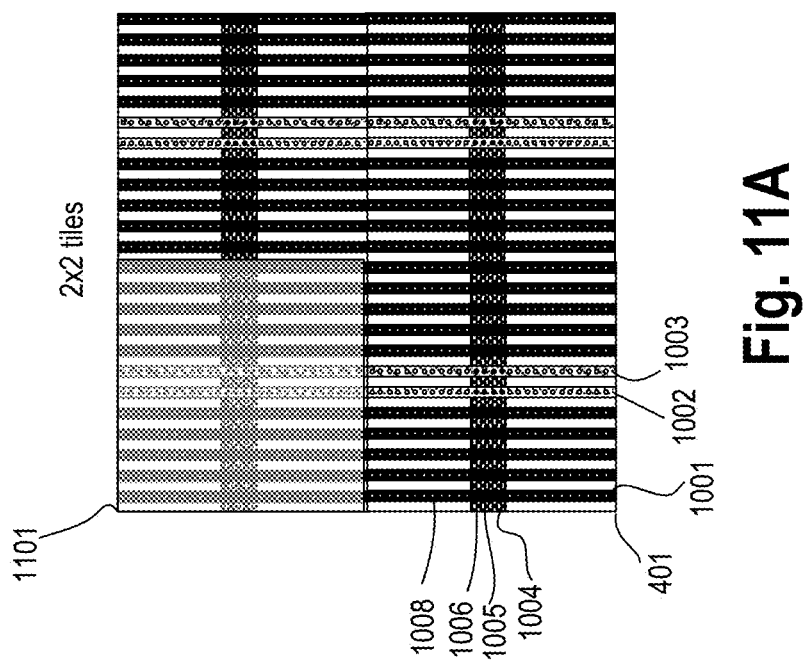
FIG. 11A illustrates a cross-section of a memory die with 2×2 tiles, which is below the compute die, in accordance with some embodiments.

FIG. 11A illustrates cross-section 1100 of a memory die 401 with 2×2 tiles, which is below the compute die, in accordance with some embodiments. While memory die 401 of FIG. 10A illustrates a single tile, here 2×2 tiles are used to organize the memory. This allows to cleanly partition the memory for storing data and weights. Here, a tile is indicated by tile 1101. The embodiments are not limited to 2×2 tiles and organization of M×N tiles (where M and N are integers that may be equal or different).

FIG. 11B illustrates cross-section 1120 of a compute die with 2×2 tiles, which is above the memory die, in accordance with some embodiments. Like memory die 401, compute die 402 can also be partitioned into tiles. Each tile 1121 is like a compute die 402 of FIG. 10B, in accordance with some embodiments. Such an organization of compute die 402 allows to run different training models with different input data and weight simultaneously or in parallel.

Figure 12:
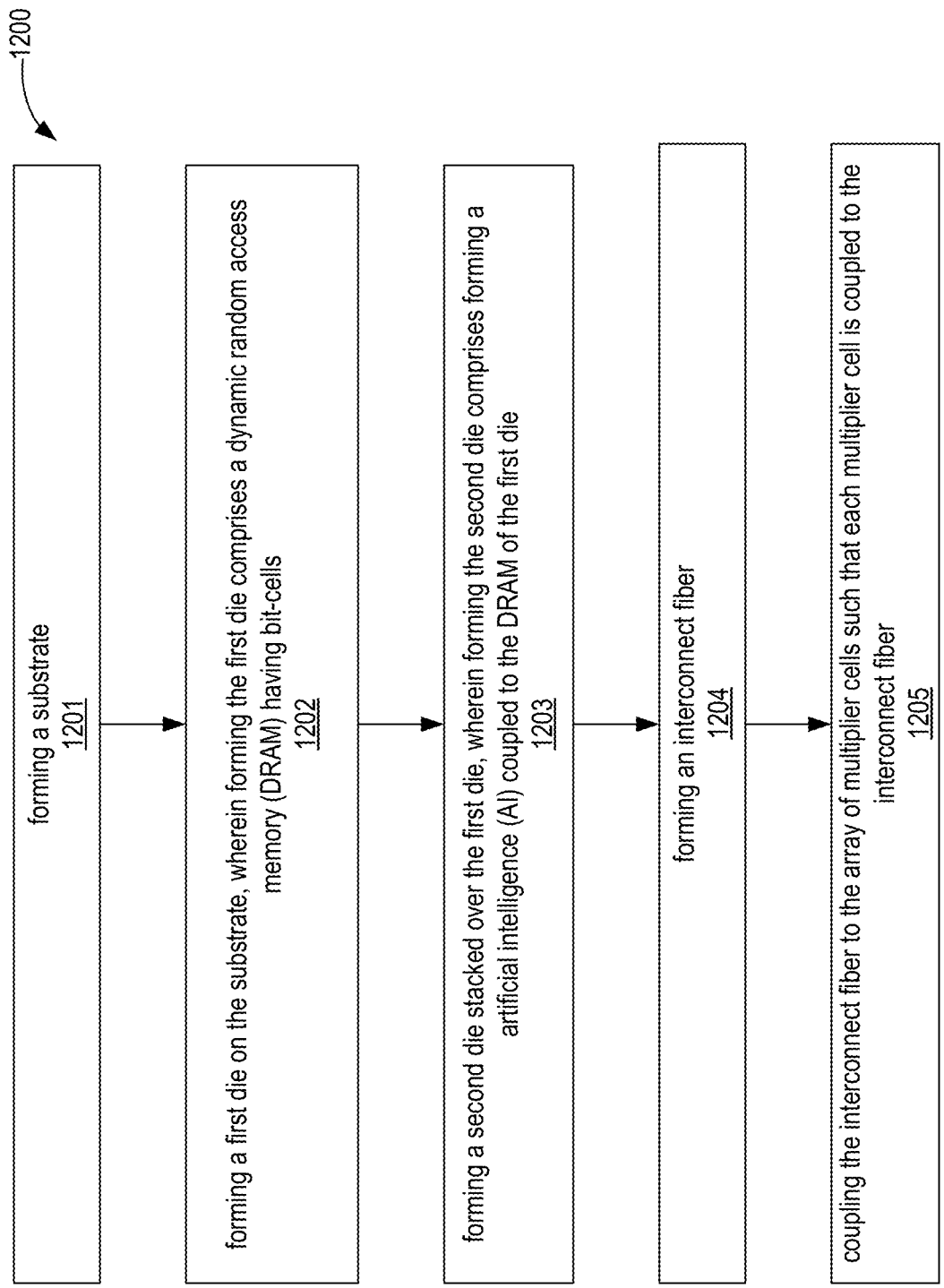
FIG. 12 illustrates a method of forming a package with compute die over the memory die, in accordance with some embodiments.

FIG. 12 illustrates flowchart 1200 of a method of forming a package of a computational block, which includes a compute die (e.g., an inference logic die) above a memory die, in accordance with some embodiments. The blocks in the flowchart 1200 are illustrated in a particular order. However, the order of the various processing steps can be modified without changing the essence of the embodiments. For example, some processing blocks may be processed simultaneously, while others may be performed out of order.

At block 1201, a substrate (e.g., 302) is formed. In some embodiments, substrate 302 is package substrate. In some embodiments, substrate 302 is an interposer (e.g. active or passive interposer). At block 1202, a first die (e.g., 401) is formed on the substrate. In some embodiments, forming the first die comprises a dynamic random-access memory (DRAM) having bit-cells, wherein each bit-cell comprises an access transistor and a capacitor. At block 1203, a second die (e.g., compute die 402) is formed and stacked over the first die, wherein forming the second die comprises forming a computational logic coupled to the memory of the first die. In some embodiments, forming the computational logic includes forming an array of multiplier cells, and wherein the DRAM includes an array of memory bit-cells.

At block 1204, an interconnect fabric is formed. At block 1205, the interconnect fabric is coupled to the array of multiplier cells such that each multiplier cell is coupled to the interconnect fabric. In some embodiments, the DRAM is partitioned into a first partition operable as buffers; and a second partition to store weight factors.

In some embodiments, the method of flowchart 1200 comprises: receiving data by the computational logic from the first partition and the second partition; and providing an output of the computational logic to a logic circuitry. In some embodiments, forming the computational logic comprises forming ferroelectric logic. In some embodiments, the computational logic is operable to multiply at least two matrices. In some embodiments, the method of forming the substrate comprises forming active or passive devices. In some embodiments, the method comprises: forming a third die (e.g., a logic die or a memory) on the substrate. In some embodiments, the method comprises coupling the third die on the substrate. In some embodiments, the method comprises a fourth die comprising dynamic random-access memory (DRAM); and stacking the fourth die over the third die. In some embodiments, the method comprises coupling a heat sink to the second die.

In some embodiments, the method comprises coupling the AI processor to the DRAM of the first die, which comprises wafer-to-wafer bonding the first and second dies; or coupling the AI processor to the DRAM of the first die, which comprises coupling the first and second dies via micro-bumps. In some embodiments, the method comprises: forming the first die includes forming through-silicon-vias (TSVs) in the first die, wherein a number of TSVs are substantially fewer than a number of micro-bumps. In some embodiments, the method comprises: coupling the first and second dies via micro-bumps, which comprises coupling the first and second dies such that active devices of the first die and active devices of the second die are closer to the micro-bumps than to a heat sink. In some embodiments, the method comprises: supplying the TSVs with power and ground supplies. In some embodiments, the method comprises: coupling a device external to the apparatus via the TSVs, wherein the second die is independent of TSVs. In some embodiments, the method comprises forming the first die on the substrate, which comprises coupling the first die to the substrate via C4 bumps. In some embodiments, the method comprises forming network-on-chip (NoC) on the first or second die. In some embodiments, the method comprises coupling a heat sink to the second die.

In some embodiments, forming the AI includes forming an array of multiplier cells, and wherein the DRAM includes an array of memory bit-cells, and wherein the AI processor is operable to multiply at least two matrices. In some embodiments, the method comprises: forming an interconnect fabric; and coupling the interconnect fabric to the array of multiplier cells such that each multiplier cell is coupled to the interconnect fabric. In some embodiments, the DRAM is partitioned into a first partition operable as buffers; and a second partition to store weight factors, wherein the method comprises: receiving data by the computational logic from the first partition and the second partition; and providing an output of the AI processor to a logic circuitry.

Figure 13:
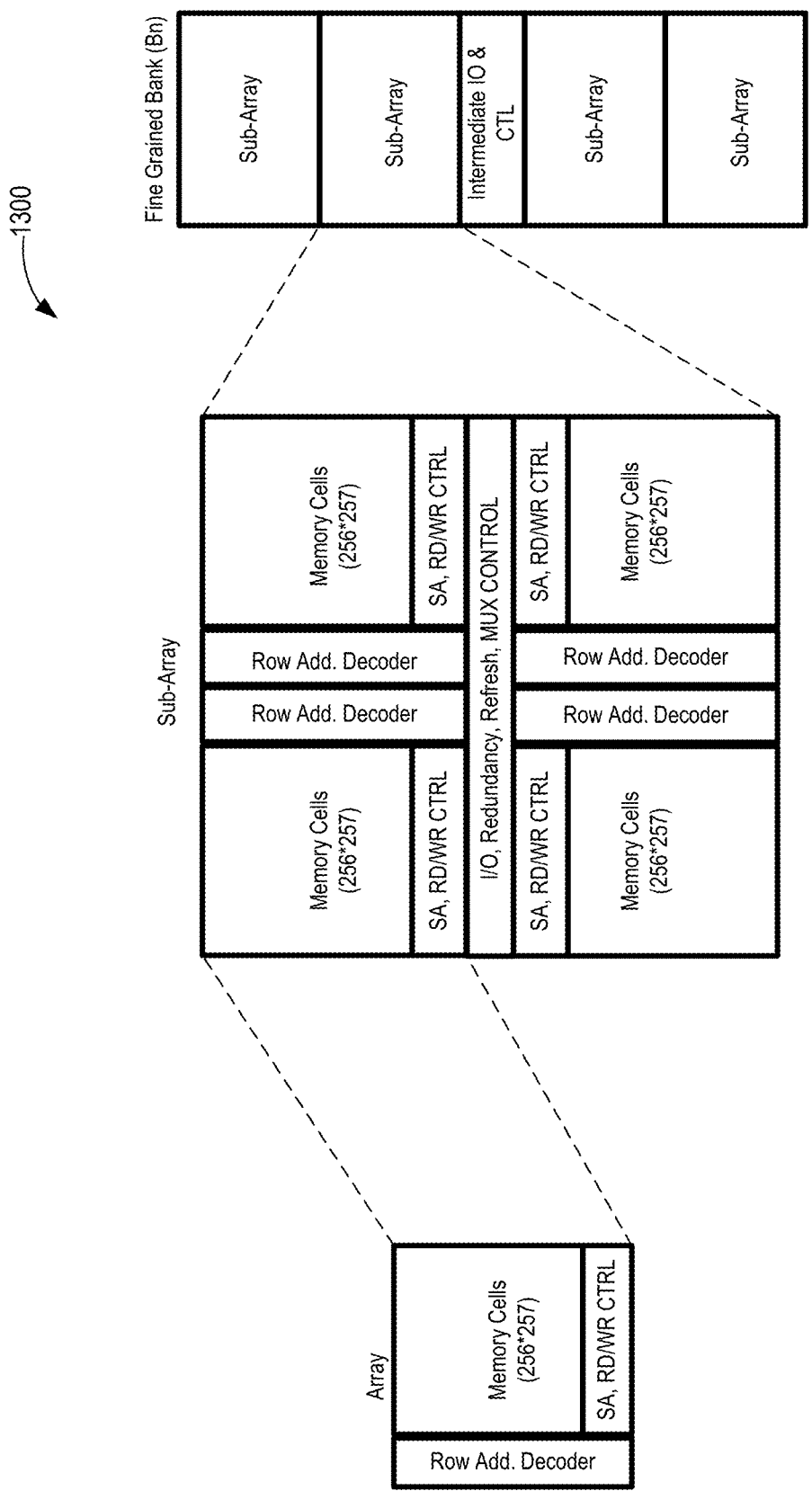
FIG. 13 illustrates memory architecture of part of the memory die, in accordance with some embodiments.

FIG. 13 illustrates memory architecture 1300 of part of memory die 401, in accordance with some embodiments. In some embodiments, memory organization uses fine-grained banks. These fine-grained banks use smaller arrays and sub-arrays. In this example, smaller array size (e.g., 128× 129 or 256×257) is used for improved speed for some applications. In some embodiments, wide bus access is used to reduce undesired activation energy cost. In some embodiments, a memory bank can be built with larger number of sub-arrays. Similarly, sub-arrays with larger number of arrays can also be used.

Figure 14:
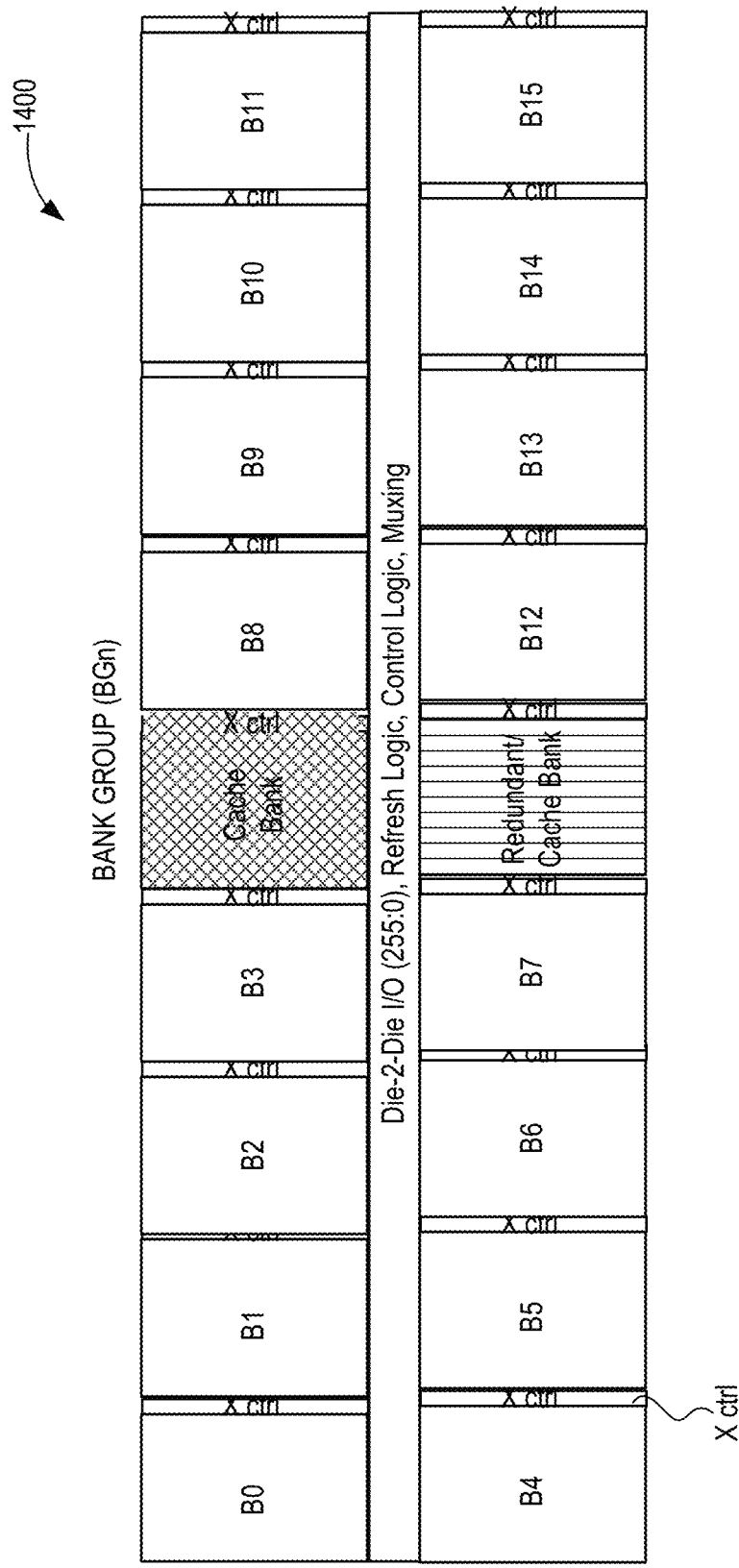
FIG. 14 illustrates a bank group in the memory die, in accordance with some embodiments.

FIG. 14 illustrates bank group 1400 in memory die 401, in accordance with some embodiments. In some embodiments, one bank group (BGn) may comprise multiple fine-grained banks. For example, one bank may comprise a cache bank to allow 1T-SRAM type of interface from timing perspective for DRAM or embedded DRAM (eDRAM) refresh timing management. Refresh timing management in conjunction with DRAM is used to provide high bandwidth, low latency interface that can hide periodic refresh requirements in the background, while not obstructing normal read/write accesses to the memory blocks. In some embodiments, memory die 401 may comprise of redundant banks for remapping. In some embodiments, different number of active banks can be implemented within a bank group by using or organizing larger or smaller count of fine-grained banks. In some embodiments, memory bank refresh (e.g., for eDRAM or DRAM) can happen individually. In some embodiments, logic is provided for smart refresh using cache bank.

Figure 15:
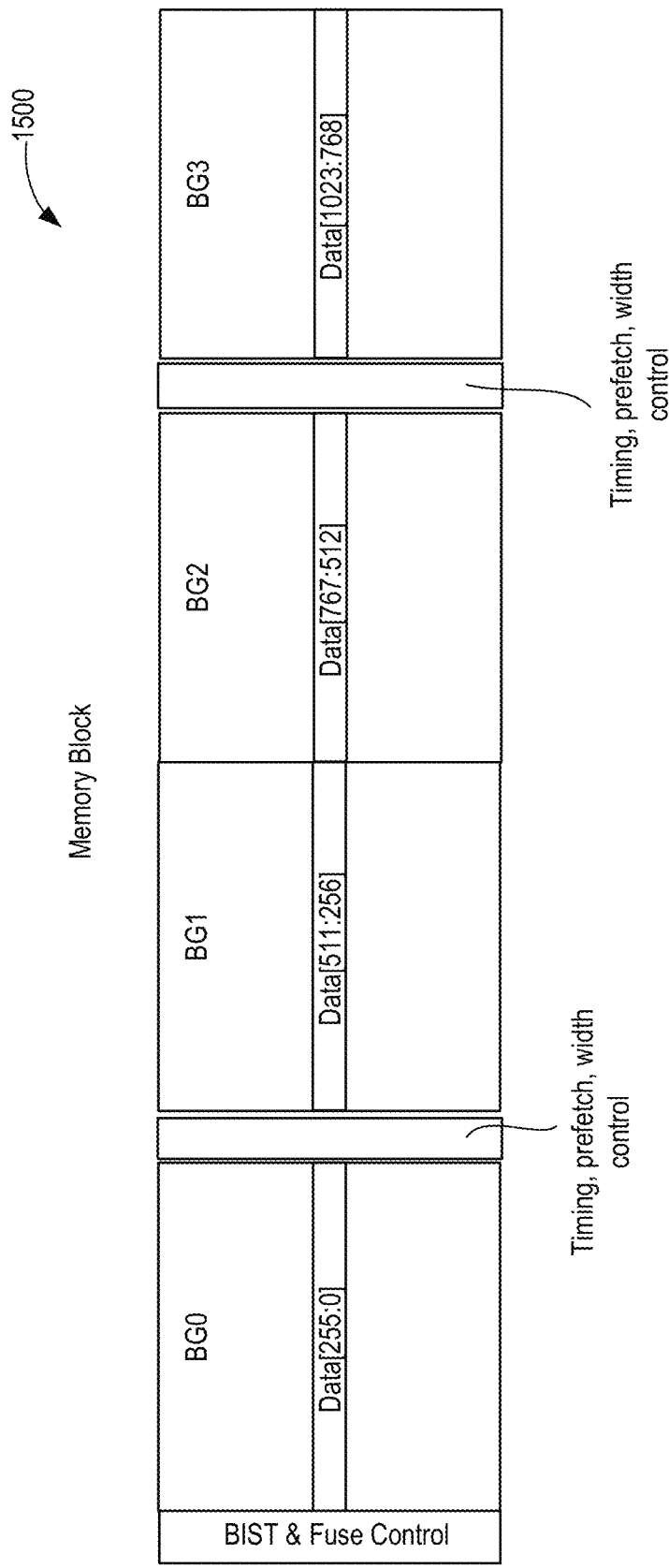
FIG. 15 illustrates a memory channel or block in the memory die, in accordance with some embodiments.

FIG. 15 illustrates memory channel 1500 or block in the memory die, in accordance with some embodiments. A memory channel can comprise one or more bank groups. In some embodiments, intermediate blocks are used to facilitate data width sizing and/or to sequence pre-fetch for each memory access to allow matching of I/O speed with any inherent speed limitations within the memory bank.

FIG. 16 illustrates memory die 1600 partitioned in a plurality of channels, in accordance with some embodiments. In various embodiments, the bottom memory die 401 comprises multiple memory sub-blocks per die. Each sub-block provides independent wide channel access to the top compute die 402. In some embodiments, the bottom die itself may also include network-on-chip (NoC) to facilitate communicate between different memory sub-blocks.

Figure 17:
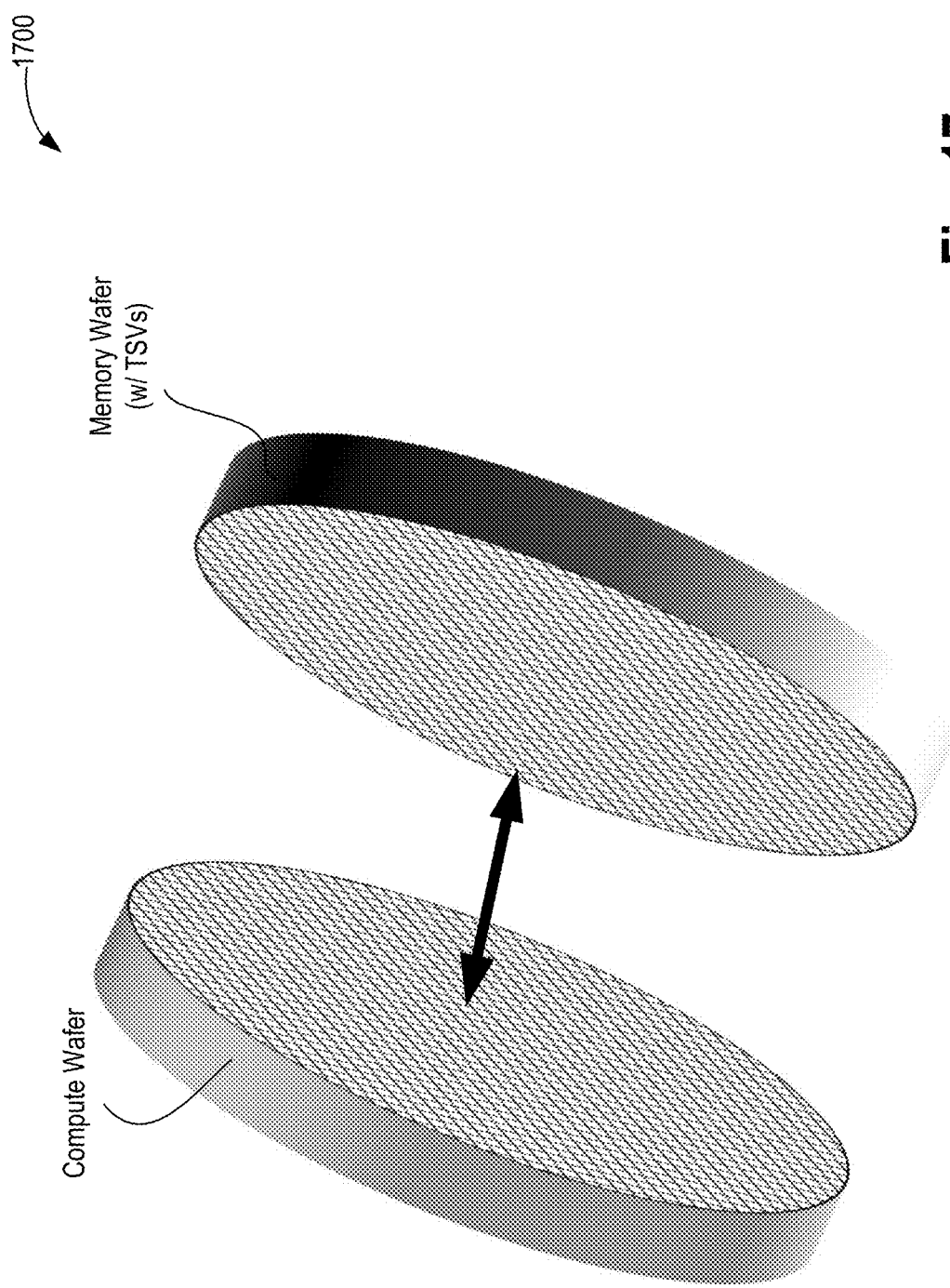
FIG. 17 illustrates an apparatus showing wafer-to-wafer bonding with micro-bumps or Cu—Cu hybrid bonding, in accordance with some embodiments.

FIG. 17 illustrates apparatus 1700 showing wafer-to-wafer bonding with micro-bumps or Cu—Cu hybrid bonding, in accordance with some embodiments. As discussed herein, memory wafer has TSVs to interface with C4 bumps (or package side). In some embodiments, memory wafers are thinned after bonding to reduce the length of TSVs from memory die 401 to compute die 402. As such, tighter TSV pitch is achieved that reduces IR drop and reduces latency (resulting in higher operating speeds).

Figure 18:
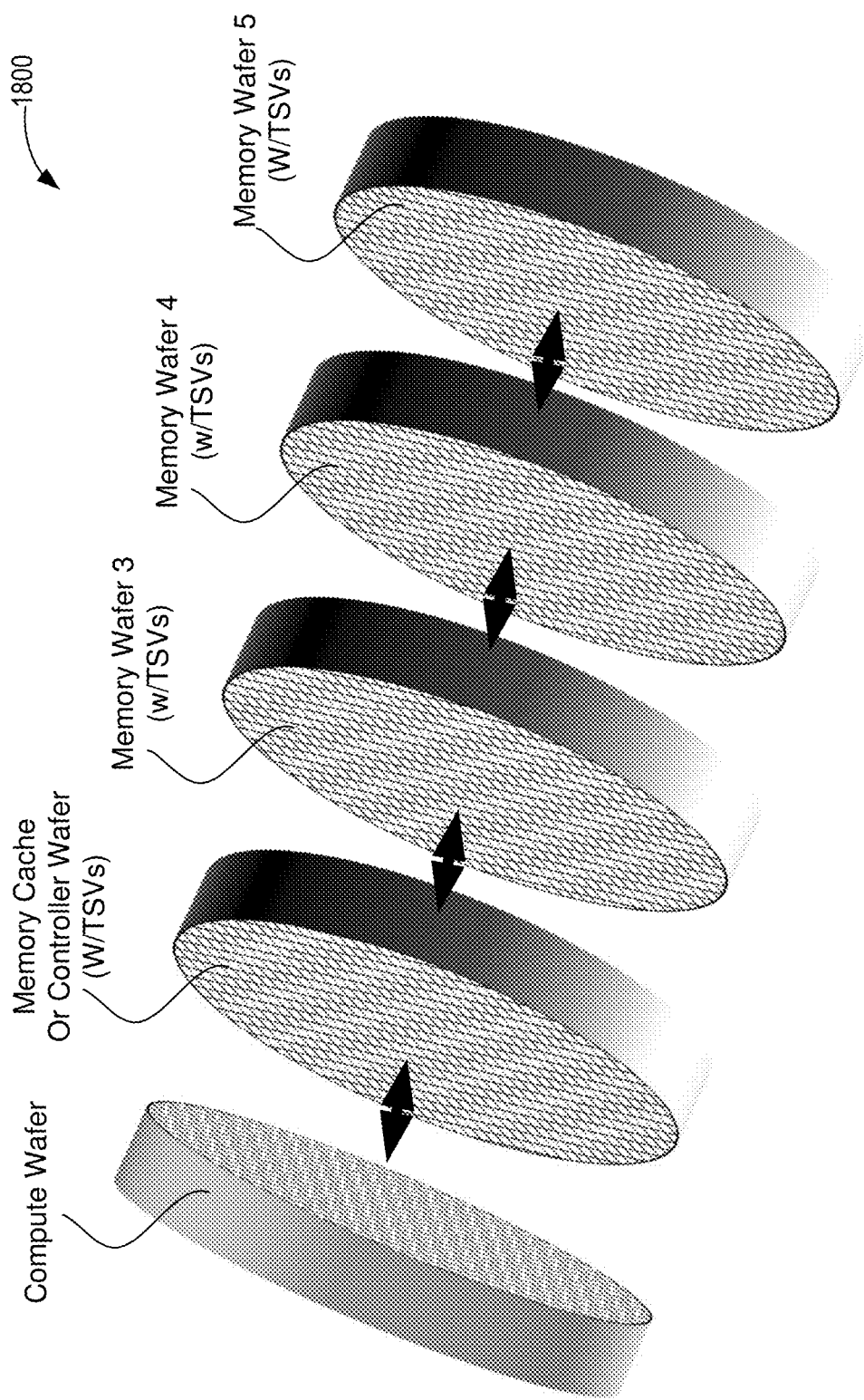
FIG. 18 illustrates an apparatus showing wafer-to-wafer bonding with a stack of memory cells, where first memory wafer of the stack is directly connected with the compute wafer, in accordance with some embodiments.

FIG. 18 illustrates apparatus 1800 showing wafer-to-wafer bonding with a stack of memory cells, where first memory wafer of the stack is directly connected with the compute wafer, in accordance with some embodiments. In this example, the first memory wafer (having memory or controller die 401) is directly connected to the compute wafer (having compute die 402). Such face-to-face bonding allows for higher number of I/O channels. In some embodiments, memory wafers are thinned after bonding to reduce the length of TSVs from memory die 401 to compute die 402. As such, tighter TSV pitch is achieved that reduces IR drop and reduces latency (resulting in higher operating speeds).

Figure 19:
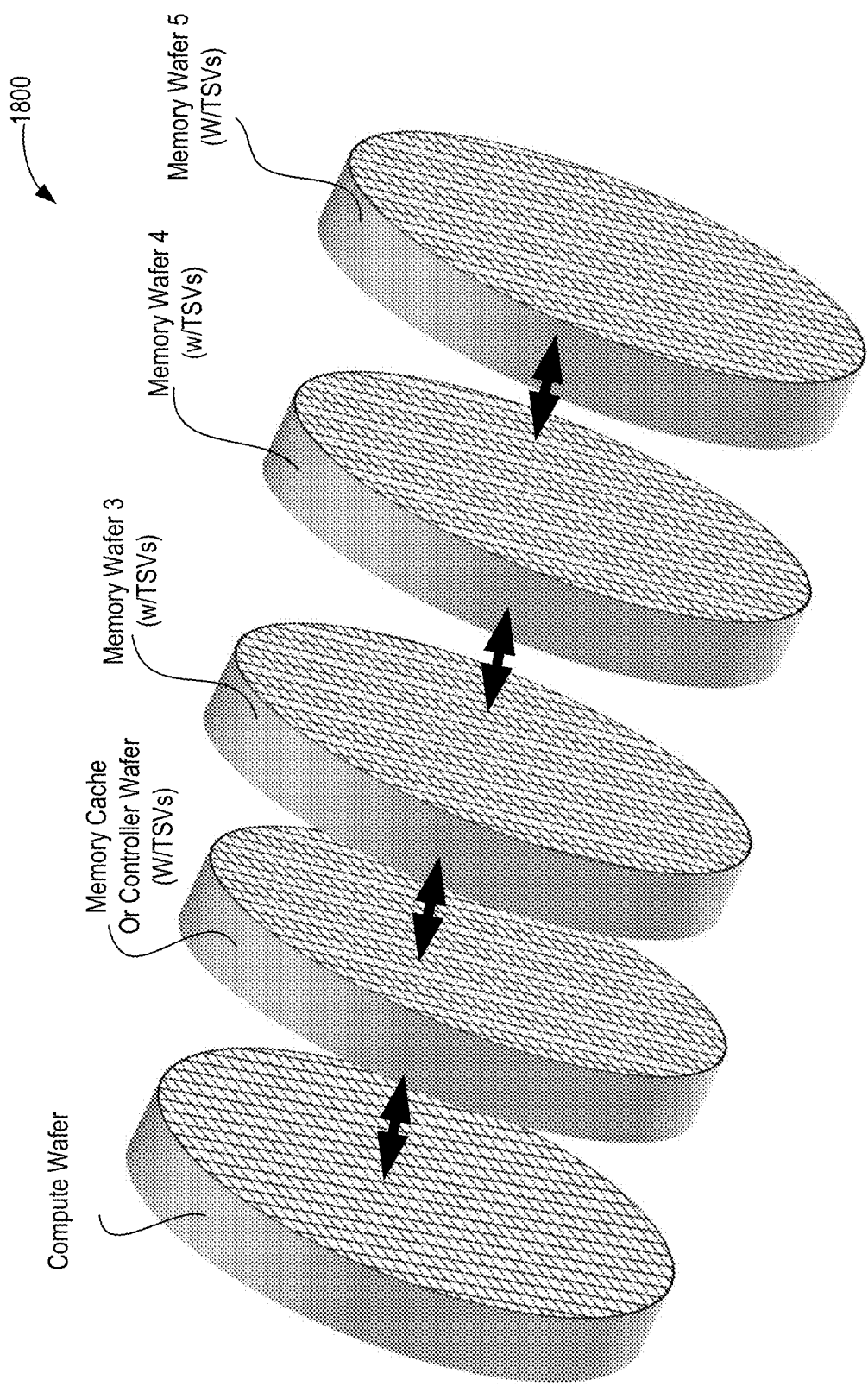
FIG. 19 illustrates an apparatus showing wafer-to-wafer bonding with a stack of memory cells, where first memory wafer of the stack is indirectly connected with the compute wafer, in accordance with some embodiments.

FIG. 19 illustrates apparatus 1900 wafer-to-wafer bonding with a stack of memory cells, where first memory wafer of the stack is indirectly connected with the compute wafer, in accordance with some embodiments. In this example, the stack of wafers (that are died into dies) are not connected face-to-face. For example, the active devices of the dies do not face one another in this example.

Figure 20:
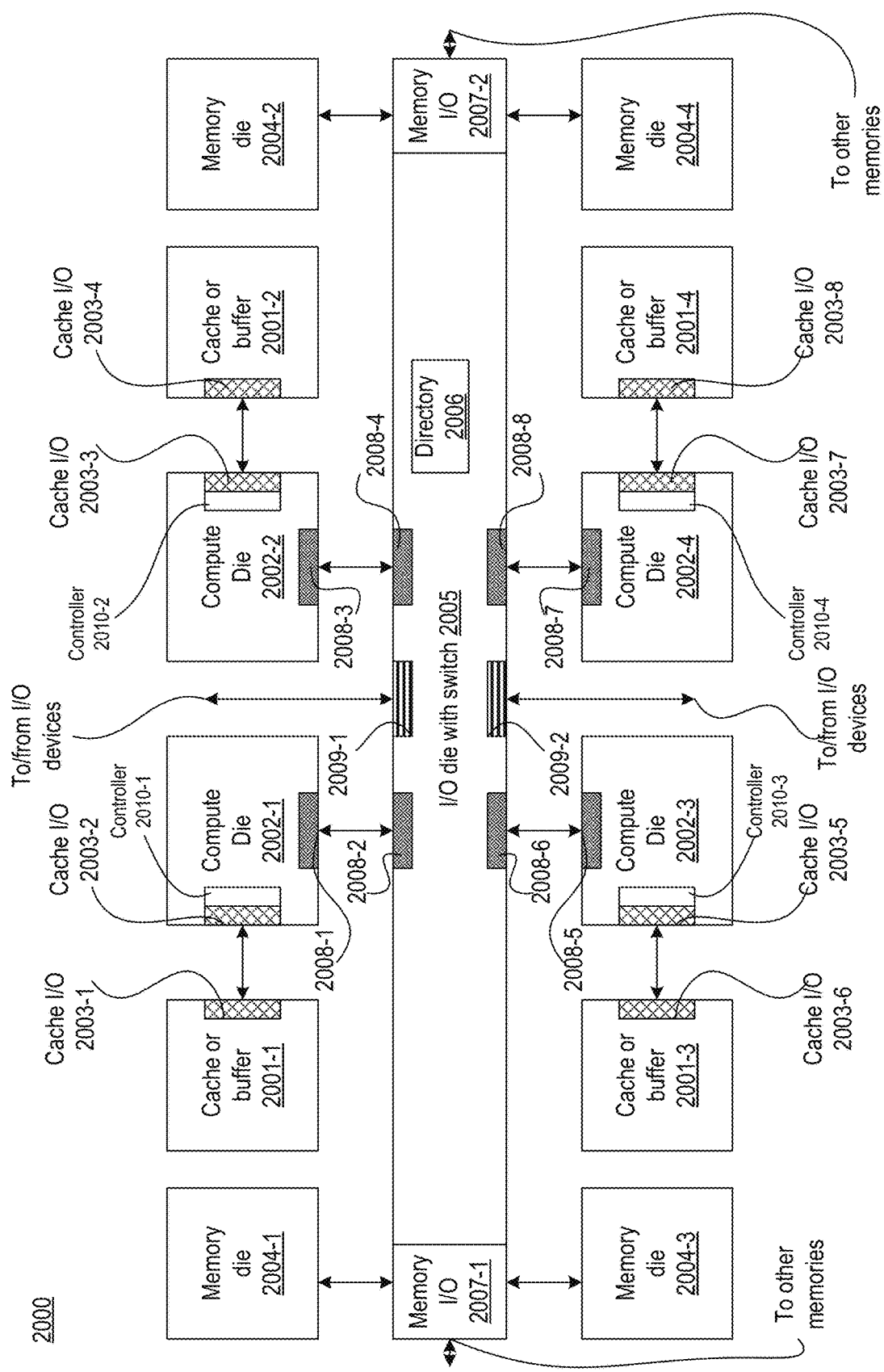
FIG. 20 illustrates a top view of a system-on-chip (SoC) or package architecture with one or more memory chiplets coupled to one or more compute dies and an I/O die with switch, where the memory chiplets have local connections to their respective compute dies, in accordance with some embodiments.

FIG. 20 illustrates a top view of a system-on-chip (SoC) or package architecture 2000 with one or more coherent cache or memory-side buffer chiplets coupled to one or more compute dies and an I/O die with switch, where the coherent cache or memory-side buffer chiplets have local connections to their respective compute dies, in accordance with some embodiments. Here, the term "chiplet" generally refers to a chip or integrated circuit offered as a packaged die, an intellectual property block, or a die to be integrated with other dies, that performs a particular function. For example, a chiplet may be an application specific integrated circuit that offloads one or more tasks by a compute die. A number of chiplets may be communicatively coupled together to form a larger and complex logical chip. Chiplets provides support to larger and complex chips such as graphics processor, general processor, signal processor, etc. Examples of a chiplet is a memory controller, cache, memory buffer, etc. The Chiplet can be implemented on-package or off-package.

Architecture 2000 comprises a plurality of coherent cache or memory-side buffer chiplets (e.g., 2001-1, 2001-2, 2001-3, 2001-4), a plurality of compute dies (e.g., 2002-1, 2002-2, 2002-3, 2002-4), memory dies (e.g., 2004-1, 2004-2, 2004-3, 2004-4), and I/O die with switch 2005. While four instances of compute die, coherent cache or memory-side buffer chiplet, and memory die are shown, any number of these instances can be arranged in a manner similar to the one shown in FIG. 20. Here, discrete labels for components can be expressed by their general label. For example, discrete label for coherent cache or memory-side buffer chiplet 2001-1 may be referred by its general label coherent cache or memory-side buffer chiplet 2001. In that case, the features or functions described with reference to the general label are applicable to the individual labels.

In some embodiments, coherent cache or memory-side buffer chiplet 2001 is a memory (e.g., level-3 cache, level-4 cache, and/or level-5 cache) that comprises ferroelectric memory cells. For example, coherent cache or memory-side buffer chiplet 2001 comprises one or more of: FE-SRAM, FE-DRAM, SRAM, MRAM, resistance RAM (Re-RAM). embedded DRAM (e.g., 1T-1C based memory), or a combination of them. Using FE-SRAM, MRAM, or Re-RAM allows for low power and high-speed memory operation. Chiplet 2001 may also function as a memory buffer. In some embodiments, coherent cache or memory-side buffer chiplet 2001 includes a dedicated cache I/O 2003 to interface with a corresponding cache I/O in compute die 2002. In some embodiments, coherent cache 2001 includes a unified buffer. In some embodiments, coherent cache or memory-side buffer chiplet 2001 is on-package (e.g., part of a single package with other dies) or off-package (e.g., seperate from a processor or SoC).

Unified buffer or unified memory architecture is a unified address space shared by both a compute die 2002 and another chip (e.g., an accelerator). The unified address space is kept coherent by coherence mechanisms. In some embodi-ments, unified memory architecture can be implemented through a shared cache and shared physical memory through a convention coherence mechanism. In some embodiments, both the compute die and the other die (e.g., accelerator) can directly modify the cache line in coherent cache or memory-side buffer chiplet 2001 (e.g., a shared memory) and the coherence framework ensures memory coherence.

In some embodiments, compute die 2002 includes memory controller 2010 that manages traffic between coherent cache or memory-side buffer chiplet 2001 and compute die 2002. In one example, coherent cache or memory-side buffer chiplet 2001-1 includes cache I/O 2003-1 which communicates with cache I/O 2003-2 of compute die 2002-1, where controller 2010-1 manages the data traffic (including error correction).

Having local I/O connections between coherent cache or memory-side buffer chiplet 2001 and corresponding compute die 2002 allows to minimize local latency and power consumption. In some embodiments, coherent cache or memory-side buffer chiplet 2001 can be on-package, on substrate, stacked on compute die, on interposer, embedded in interposer, or embedded in substrate. In some embodiments, the various I/O links herein can be on-package I/O links such as serial-deserializer (SERDES). In some embodiments, the links in the I/O die are wide I/O links. In some embodiments, links between memory I/O and memory dies can be double data rate (DDR) links. In some embodiments, the various interconnect between the I/Os shown here can be one or more of: SERDES, Very Short Reach (VSR), compute express link (CXL), peripheral component interconnect express (PCIe), DDR, low power DDR (LPDDR), graphics DDR (GDDR), open coherent accelerator processor interface (openCAPI), MIPI, Advance Interface Bus (AIB), Embedded multi-die interconnect bridge (EMIB), or any suitable interface.

In various embodiments, compute die 2002 is similar to the compute dies described with reference to various embodiments. For example, any of the compute dies 103, 303, 402, may be used for compute die 2002. Further, features of various compute dies described herein can be mixed in any fashion to realize compute die 2002. In some examples, as coherent cache (e.g., L4 cache) or memory-side buffer chiplet is described as being separate from compute die 2002, other levels of cache such as level-1, level-2, and level-3 are part of compute die 2002. In some embodiments, compute die 2002 includes I/O 2008 to communicate with I/O switch 2005, which allows any compute die 2002 to communicate with any other compute die in architecture 2000. For example, compute die 2002-1 includes I/O 2008-1 which interfaces with I/O 2008-2 of I/O die 2005.

In some embodiments, I/O die switch 2005 includes a number of switches or routers that allow various components coupled to I/O die switch 2005 to communicate with one another. The switches can be organized in a mesh or ring formation (not shown). In some embodiments, I/O die with switch 2005 includes directory 2006. Directory 2006 may include a list of addresses and which caches they can be found in. It minimizes snooping by providing a centralized "directory" to look at where we can find cache lines.

In some embodiments, I/O die with switch 2005 includes I/Os 2009 to communicate with other I/O devices. These I/O devices may include peripherals such as camera, display, mic, speaker, printer, and/or other computing platforms. In some embodiments, I/O die with switch 2005 includes I/Os 2007 to interact with memory die 2004. Memory die 2004 is similar to any memory die described herein with reference to various embodiments. For example, any of memory dies DRAM 102, SRAM 104, DRAM 106, SSD 107, DRAM 304, HBM 334, DRAM 401, HBM 505, RAM 507, RAM 508, and/or SSD 509. In some embodiments, memory die 2004 can be one or more of: FE-SRAM, FE-DRAM, SRAM, MRAM, resistance RAM (Re-RAM), embedded. DRAM (e.g., 1T-1C based memory), 3D cross-point, or a combination of them. Using FE-SRAM, MRAM, or Re-RAM allows for low power and high-speed memory operation. In some embodiments, memory I/O 2007 is any suitable memory I/O such as SERDES, Very Short Reach (VSR), compute express link (CXL), peripheral component interconnect express (PCIe), DDR, low power DDR (LPDDR), graphics DDR (GDDR), open coherent accelerator processor interface (openCAPI), MIPI, Advance Interface Bus (AIB), Embedded multi-die interconnect bridge (EMIB), or any suitable interface. In some embodiments, memory die 2004 is on-package (e.g., part of a single package with other dies) or off-package (e.g., sperate from a processor or SoC). In one embodiments, coherent cache or memory-side buffer chiplet 2001 is on-package (e.g., part of a single package with other dies) while memory die 2004 is off-package (e.g., sperate from a processor or SoC) or on-package.

Figure 21:
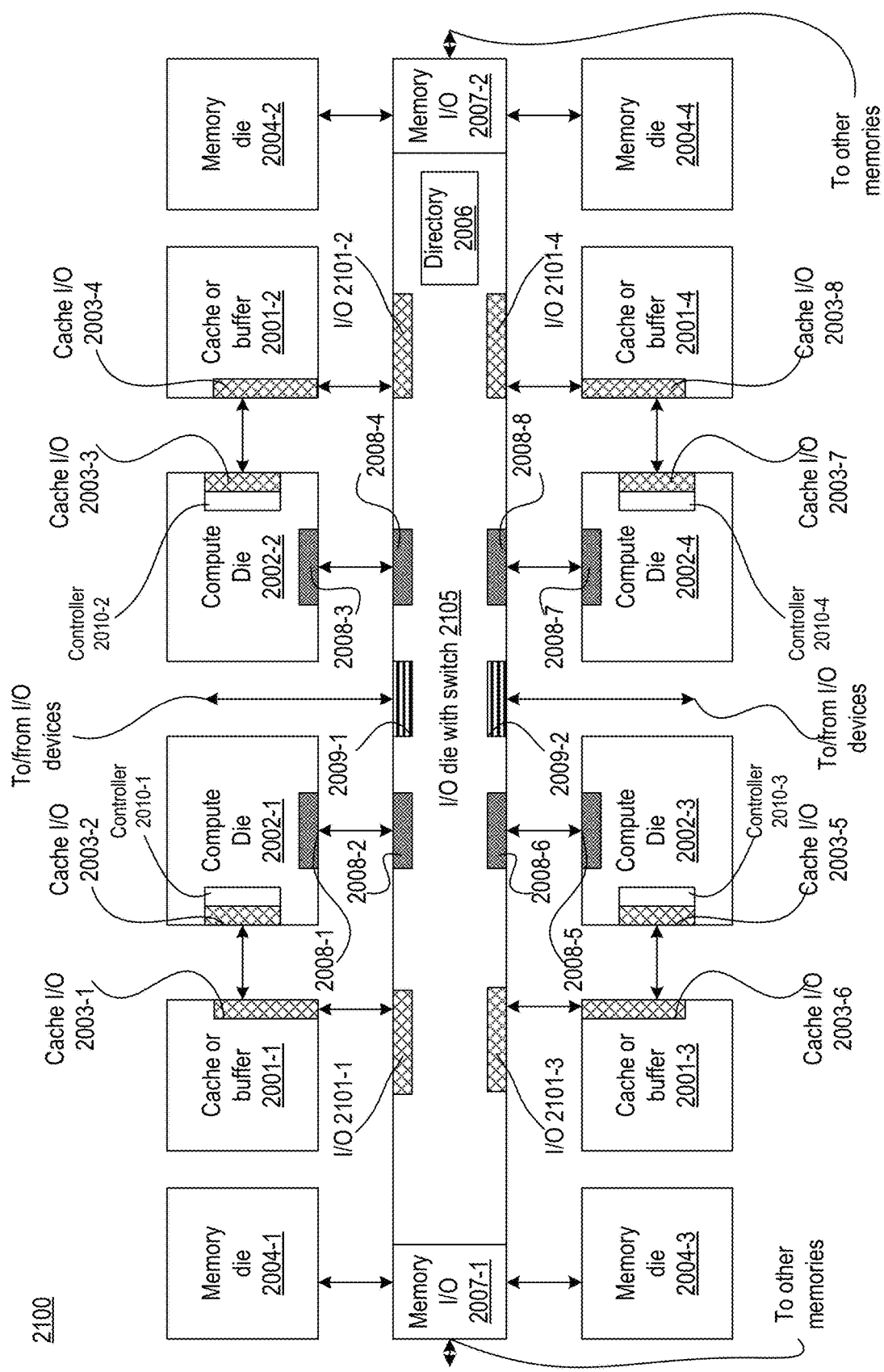
FIG. 21 illustrates a top view of an SoC or package architecture with one or more memory chiplets directly connected to the I/O die in addition to the local connections, in accordance with some embodiments.

FIG. 21 illustrates a top view of an SoC or package architecture 2100 with one or more coherent cache or memory-side buffer chiplets directly connected to the I/O die in addition to the local connections, in accordance with some embodiments. Architecture 2100 is similar to architecture 2000 but for additional I/Os in coherent cache or memory-side buffer chiplet 2001 and I/O die switch 2105 to allow coherent cache or memory-side buffer chiplet to communicate with I/O die 2105 directly. In one example, coherent cache or memory-side buffer chiplet 2001-1 includes I/O 2003-1 which include transceivers to communicate with compute die 2002-1 and I/O die 2105 via corresponding I/Os 2101-1. As such, each coherent cache or memory-side buffer chiplet is able to communicate with other coherent cache or memory-side buffer chiplets coupled to I/O die switch 2105 and also to other compute dies 2002. This organization of coherent cache or memory-side buffer chiplets maximizes compute die access to coherent cache or memory-side buffer cache while also providing a separate I/O channel to I/O die switch 2105 to improve access of coherent cache or memory-side buffer chiplet 2001 to other cores (e.g., one or more processor cores of compute die 2002) and/or memory I/O 2007. In some embodiments, I/O die switch 2105 includes a number of switches or routers that allow various components coupled to I/O die switch 2105 to communicate with one another. The switches can be organized in a mesh or ring formation (not shown).

Figure 22:
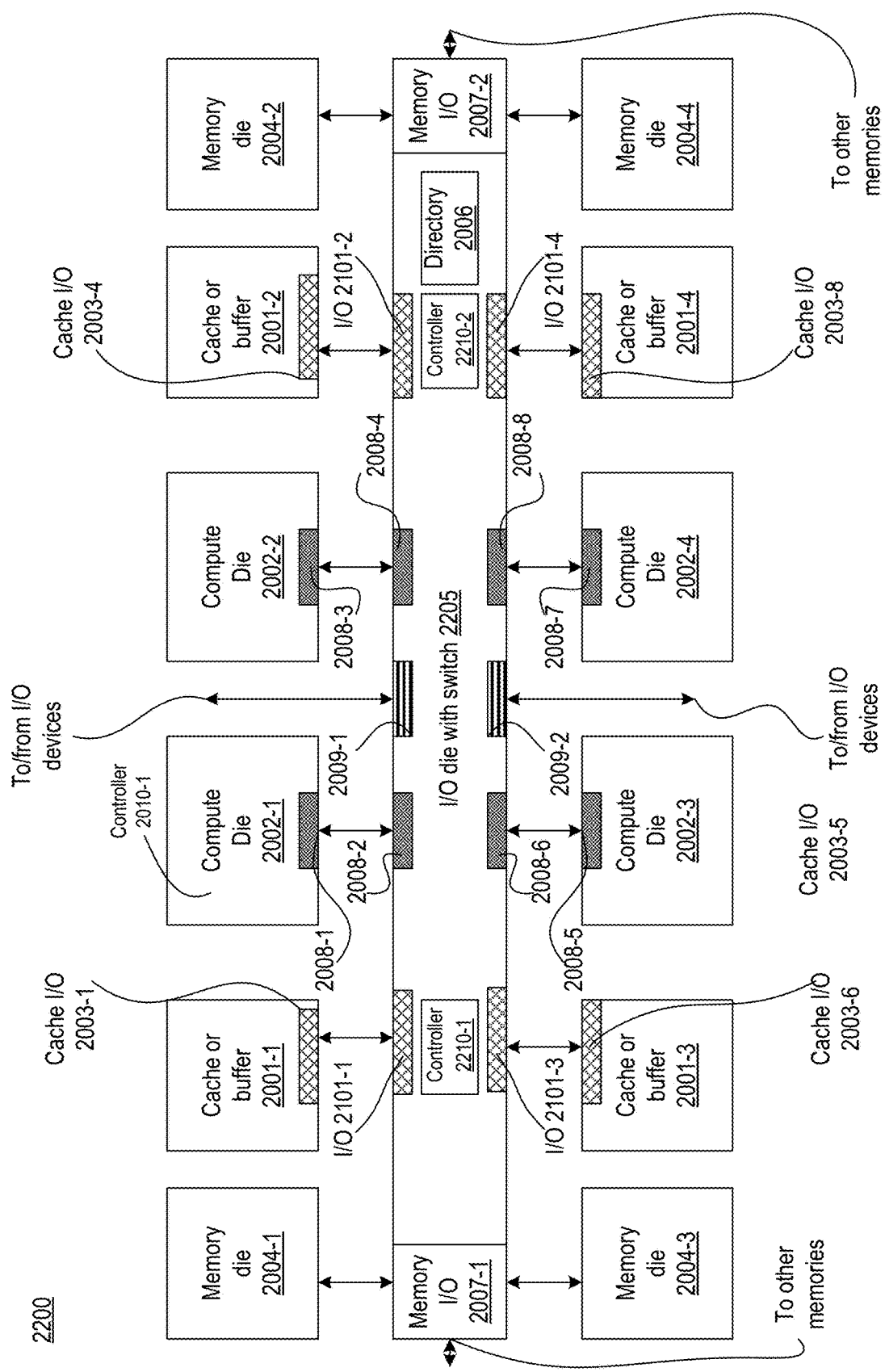
FIG. 22 illustrates a top view of an SoC or package architecture with one or more memory chiplets directly connected to the I/O die but without the local connections to compute dies, in accordance with some embodiments.

FIG. 22 illustrates a top view of an SoC or package architecture 2200 with one or more memory chiplets directly connected to the I/O die but without the local connections to compute dies, in accordance with some embodiments. Architecture 2200 is similar to architecture 2100 but for removing direct I/O interface between compute die 2002 and corresponding coherent cache or memory-side buffer chiplet 2001. In some embodiments, I/O die with switch 2205 comprises I/Os 2101 to communicate with respective coherent cache or memory-side buffer chiplets. In some embodiments, controller 2010 from compute die is removed and added to I/O die with switch 2205. For example, controller 2210-1 manages data traffic for coherent cache or memory-side buffer chiplets 2001-1 and 2001-3, while controller 2210-2 manages data traffic for coherent cache or memory-side buffer chiplets 2001-2 and 2001-4. Here, coherent cache or memory-side buffer chiplets 2001 are connected to I/O die switch 2205 and not to the compute dies 2002 (also referred to as processing units that can have one or more processor cores). All compute dies 2002 in architecture 2200 have a shared path to all coherent cache or memory-side buffer chiplets through I/O due 2205. This architecture improves inter-core access by compute dies to each coherent cache or memory-side buffer chiplet. In some embodiments, I/O die switch 2205 includes a number of switches or routers that allow various components coupled to I/O die switch 2205 to communicate with one another. The switches can be organized in a mesh or ring formation (not shown).

Figure 23:
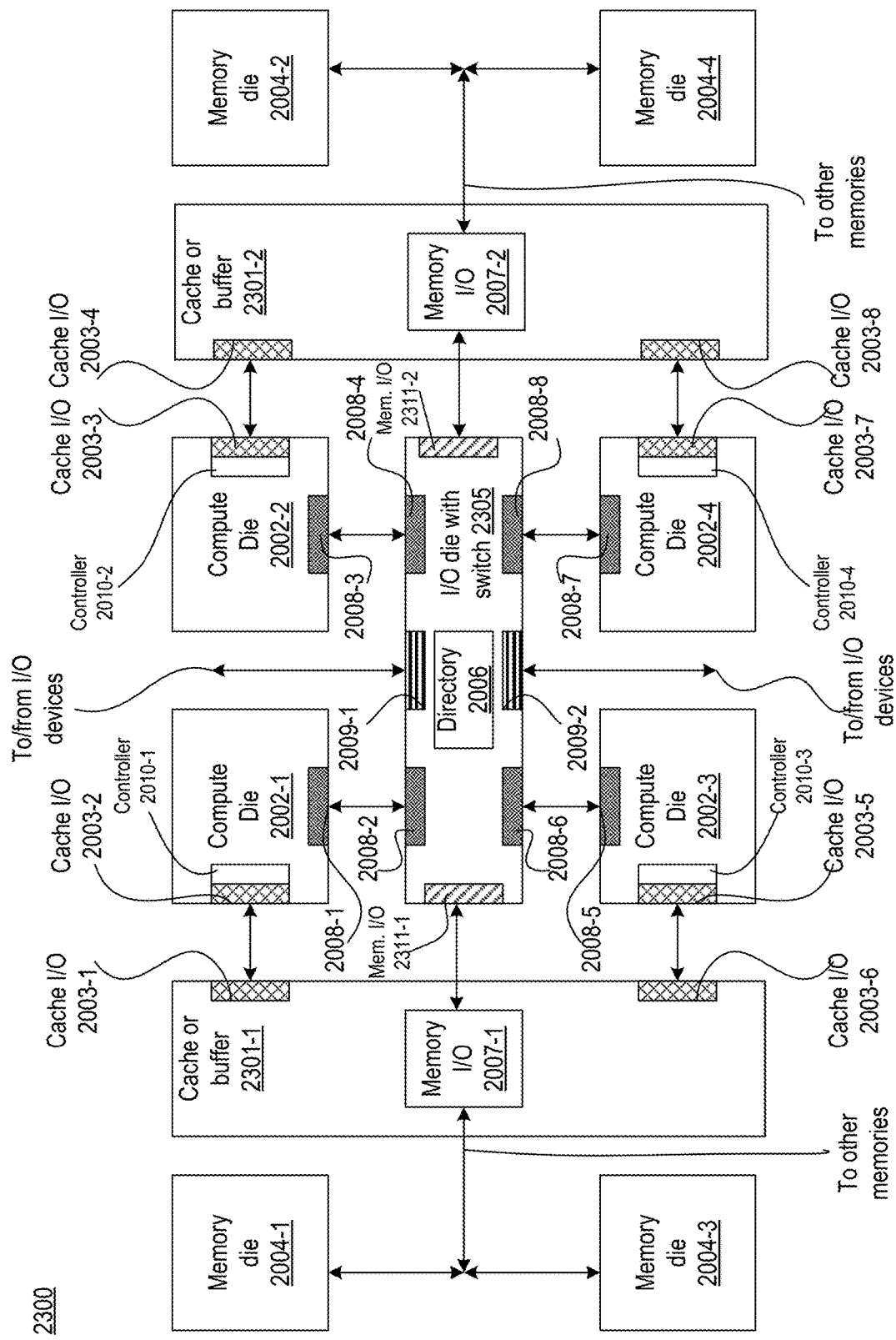
FIG. 23 illustrates a top view of an SoC or package architecture with one or more memory chiplets in extended form, where memory controller is located in the memory chiplets, in accordance with some embodiments.

FIG. 23 illustrates a top view of an SoC or package architecture 2300 with one or more coherent cache or memory-side buffer memory chiplets in extended form, where memory controller is located in the coherent cache or memory-side buffer memory chiplets, in accordance with some embodiments. Architecture 2300 is similar to architecture 2100 but for extending coherent cache or memory-side buffer chiplets to couple or connect with at least two compute dies 2002. For example, coherent cache or memory-side buffer chiplet 2301-1 couples to compute die 2002-1 via I/Os 2003-1 and 2003-2, and also couples to compute die 2002-3 via I/Os 2003-5 and 2003-6. Likewise, coherent cache or memory-side buffer chiplet 2301-2 couples to compute die 2002-2 via I/Os 2003-3 and 2003-4, and also couples to compute die 2002-4 via I/Os 2003-7 and 2003-8. In some embodiments, memory I/O 2007 is relocated from I/O die 2305 and embedded in coherent cache or memory-side buffer chiplet.

For example, memory I/O 2007-1 is relocated from I/O die 2305 and embedded in coherent cache or memory-side buffer chiplet 2301-1, and memory I/O 2007-2 is relocated from I/O die 2305 and embedded in coherent cache or memory-side buffer chiplet 2301-2. Memory I/O 2007-1 (e.g., SERDES, Very Short Reach (VSR), compute express link (CXL), peripheral component interconnect express (PCIe), DDR, low power DDR (LPDDR), graphics DDR (GDDR), open coherent accelerator processor interface (openCAPI), MIPI, Advance Interface Bus (AIB), Embedded multi-die interconnect bridge (EMIB), or any suitable interface) then communicates with other memories (e.g., memory dies 2004-1 through 2004-4). In various embodiments, memory controller for coherent cache or memory-side buffer chiplets 2301 resides compute die 2002. Memory I/O 2007 communicates with I/O due 2405 via a dedicated I/O. For example, memory I/O 2007-1 communicates with I/O die 2405 via memory I/O 2311-1 (e.g., SERDES, Very Short Reach (VSR), compute express link (CXL), peripheral component interconnect express (PCIe), DDR, low power DDR (LPDDR), graphics DDR (GDDR), open coherent accelerator processor interface (openCAPI), MIPI, Advance Interface Bus (AIB), Embedded multi-die interconnect bridge (EMIB), or any suitable interface.), memory I/O 2007-2 communicates with I/O die 2405 via memory I/O 2311-2 (e.g., SERDES, Very Short Reach (VSR), compute express link (CXL), peripheral component interconnect express (PCIe), DDR, low power DDR (LPDDR), graphics DDR (GDDR), open coherent accelerator processor interface (openCAPI), MIPI, Advance Interface Bus (AIB), Embedded multi-die interconnect bridge (EMIB), or any suitable interface). By offloading memory controller for memory I/O 2007-1 from I/O die 2305 to coherent cache or memory-side buffer chiplet 2301, the cost of I/O die 2305 reduces. This architecture also reduces the cost of data movement between memory 2004 and the coherent cache or memory-side buffer chiplet 2301. In some embodiments, compute dies 2002 maintain private local connections to coherent cache or memory-side buffer chiplets 2301 as well as a path through I/O die 2305 to get to memory 2004.

In some embodiments, I/O die switch 2305 includes a number of switches or routers that allow various components coupled to I/O die switch 2305 to communicate with one another. The switches can be organized in a mesh or ring formation (not shown). In some embodiments, coherent cache or memory-side buffer chiplet 2301 is a cache memory that comprises ferroelectric memory cells. For example, coherent cache or memory-side buffer chiplet 2301 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation, coherent cache or memory-side buffer chiplet 2301 may also function as a memory buffer.

Figure 24:
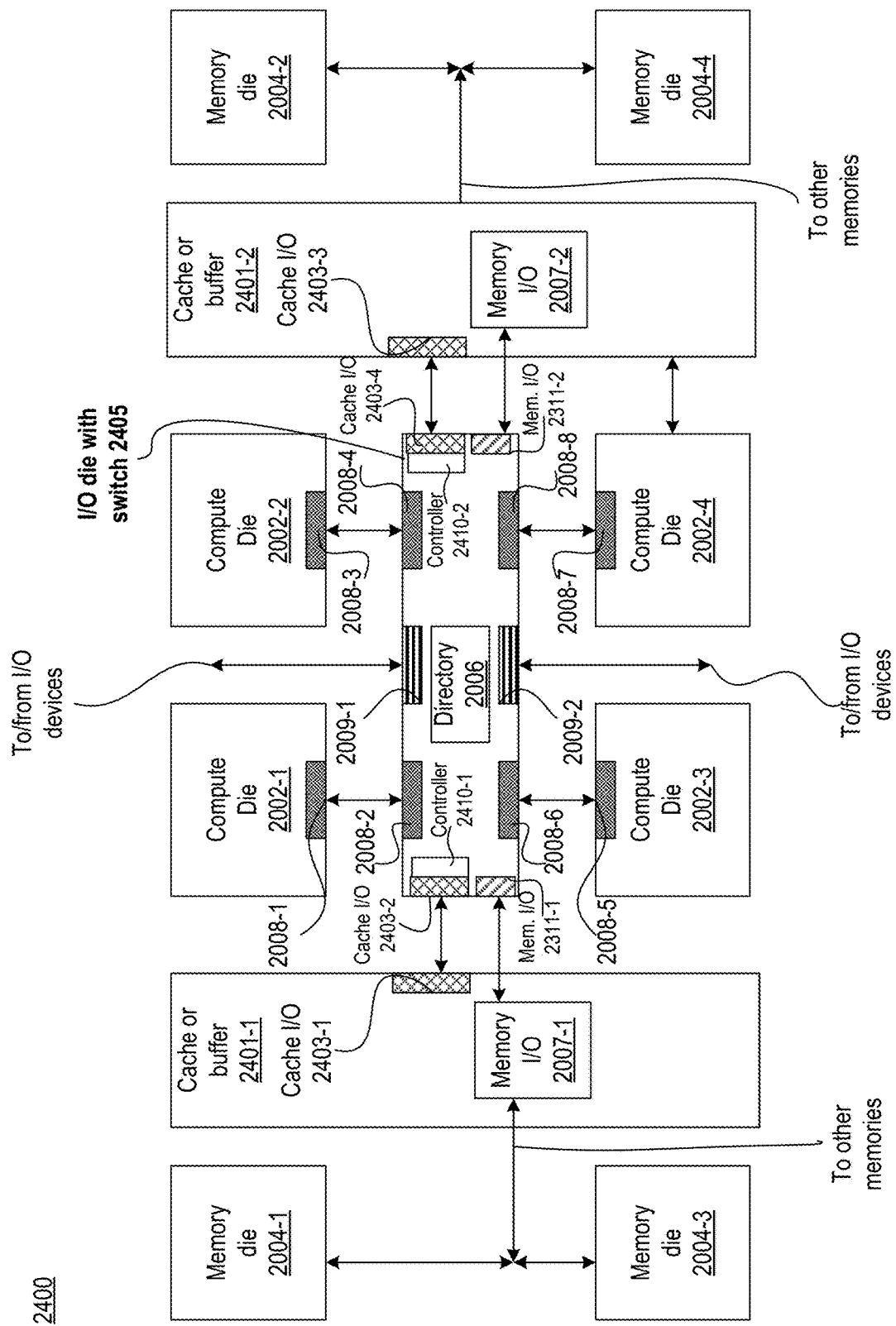
FIG. 24 illustrates a top view of an SoC or package architecture with one or more memory chiplets in extended form, where a memory controller is located in the one or more memory chiplets, in accordance with some embodiments.

FIG. 24 illustrates a top view of an SoC or package architecture 2400 with one or more coherent cache or memory-side buffer memory chiplets in extended form, where memory controller is located in the one or more memory chiplets, in accordance with some embodiments. Architecture 2400 is similar to architecture 2300 but for moving the coherent cache or memory-side buffer chiplet I/Os to communicate with I/O die 2405. The cache or memory buffer I/Os and associate controller of compute dies 2002 are also relocated to I/O die 2405. For example, cache I/O 2304-1 of coherent cache or memory-side buffer chiplet 2401-1 directly communicates with cache I/O 2403-2 of I/O die 2405, and cache I/O 2304-1 of coherent cache or memory-side buffer chiplet 2401-1 directly communicates with cache I/O 2403-2 of I/O die 2405. Since the cache I/Os are moved to I/O die 2405, memory controllers for the cache I/O are also relocated to I/O die 2405. For example, controller 2301-1 in I/O die 2405 controls data traffic to coherent cache or memory-side buffer chiplet 2401-1 via I/Os 2403-1 and 2403-2, and controller 2301-2 in I/O die 2405 controls data traffic to coherent cache or memory-side buffer chiplet 2401-2 via I/Os 2403-3 and 2403-4. In some embodiments, I/O die switch 2405 includes a number of switches or routers that allow various components coupled to I/O die switch 2405 to communicate with one another. The switches can be organized in a mesh or ring formation (not shown). In some embodiments, coherent cache or memory-side buffer chiplet 2401 is a cache memory that comprises ferroelectric memory cells. For example, coherent cache or memory-side buffer chiplet 2401 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 25A:
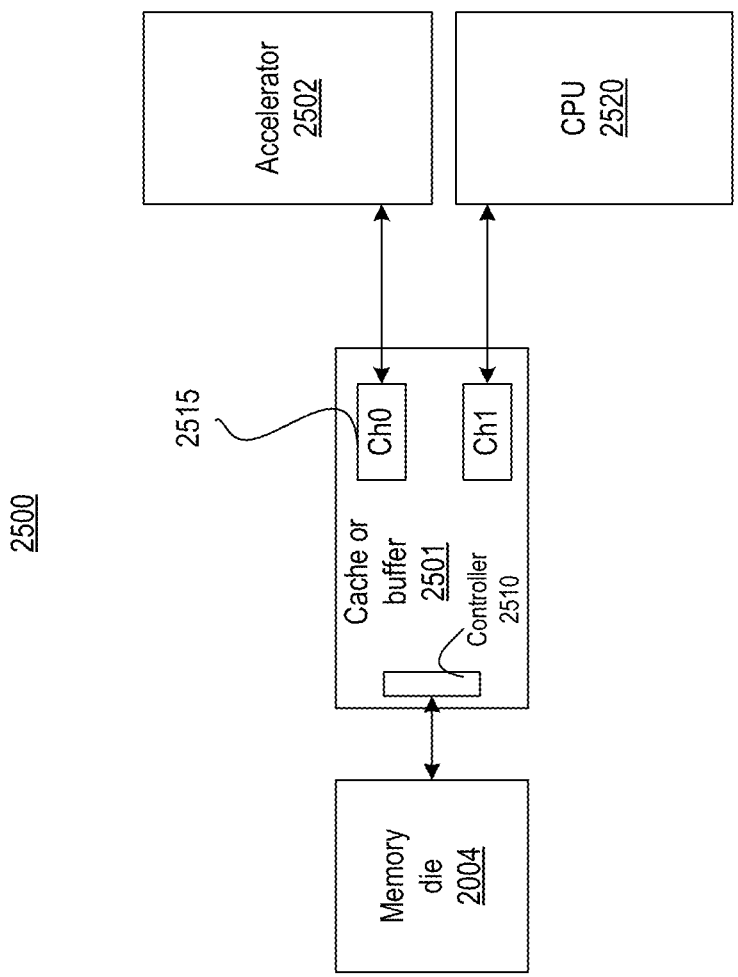
FIG. 25A illustrates a computing architecture with an coherent cache or memory-side buffer chiplet that includes a memory controller, wherein the coherent cache or memory-side buffer chiplet is coupled to an accelerator, a processor, and a memory, in accordance with some embodiments.

FIG. 25A illustrates computing architecture 2500 with a coherent cache or memory-side buffer chiplet that includes a memory controller, wherein the coherent cache or memory-side buffer chiplet is coupled to an accelerator, a processor, and a memory, in accordance with some embodiments. Computing architecture 2500 comprises coherent cache or memory-side buffer chiplet 2501, accelerator 2502 (e.g., inference chip), processor (e.g., central processing unit 2520), and memory die 2004. In some embodiments, coherent cache or memory-side buffer chiplet 2501 comprises at least two channels 2515 which are configured to connect with accelerator 2502 and processor 2520. In some embodiments, coherent cache or memory-side buffer chiplet 2501 comprises I/O and controller 2510 to manage data traffic with memory die 2004. By moving controller 2510 from processor 2520 to coherent cache or memory-side buffer chiplet 2501, cost in terms of power and die area for processor 2520 is reduced. In some embodiments, coherent cache or memory-side buffer chiplet 2501 is a cache memory that comprises ferroelectric memory cells. For example, coherent cache or memory-side buffer chiplet 2501 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 25B:
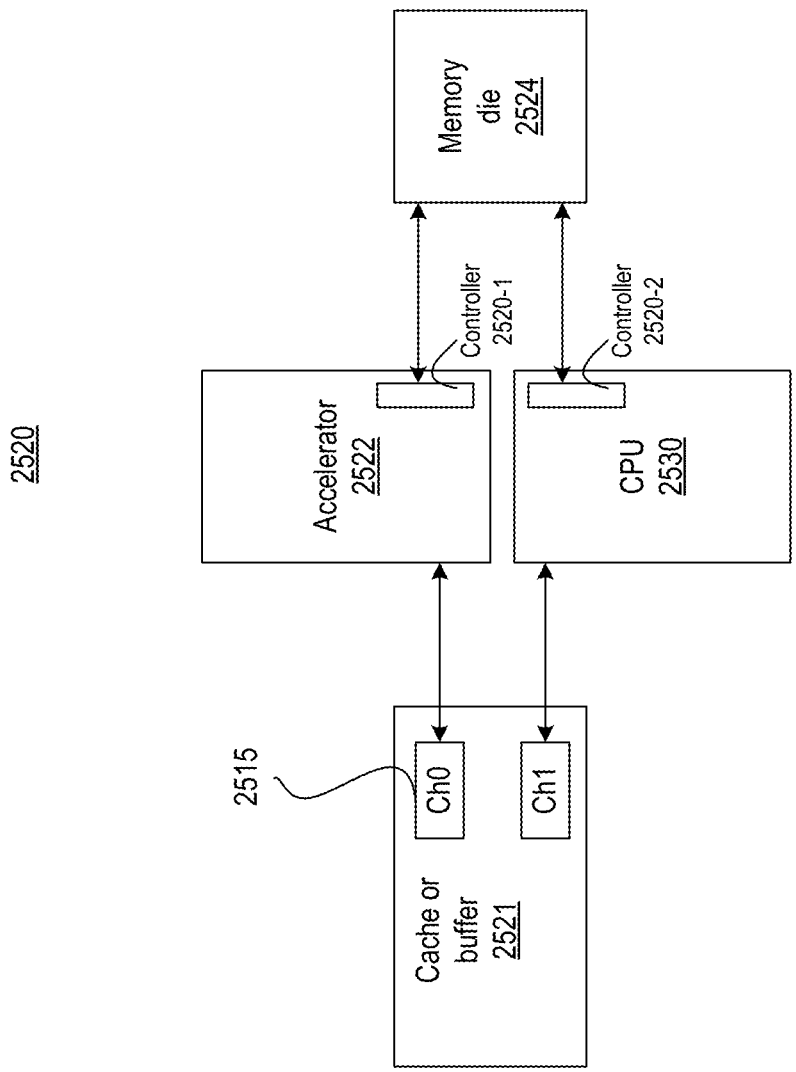
FIG. 25B illustrates a computing architecture with a coherent cache or memory-side buffer chiplet, wherein the coherent cache or memory-side buffer chiplet and a memory is coupled in parallel to an accelerator and a processor, in accordance with some embodiments.

FIG. 25B illustrates computing architecture 2520 with a coherent cache or memory-side buffer chiplet, wherein the coherent cache or memory-side buffer chiplet and a memory is coupled in parallel to an accelerator and a processor, in accordance with some embodiments. Computing architecture 2520 comprises coherent cache or memory-side buffer chiplet 2521, accelerator 2522 (e.g., inference chip), processor (e.g., central processing unit 2530), and memory die 2524. In some embodiments, coherent cache or memory-side buffer chiplet 2521 (similar to coherent cache or memory-side buffer 2501) chiplet comprises at least two channels 2515 which are configured to connect with accelerator 2522 and processor 2530. In some embodiments, accelerator 2522 comprises I/O and controller 2510-1 to manage data traffic with memory die 2524. In some embodiments, processor 2530 comprises I/O and controller 2510-2 to manage data traffic with memory die 2524. Computing architecture 2520 allows for coherent cache or memory-side buffer chiplet 2521 and memory die 2524 to have simultaneous (or substantially simultaneous) access to accelerator 2522 and processor 2530. Memory die 2524 can be similar to Memory die 2004. In some embodiments, coherent cache or memory-side buffer chiplet 2521 is a cache memory that comprises ferroelectric memory cells. For example, coherent cache or memory-side buffer chiplet 2521 comprises one or more of: FE-SRAM, FE-DRAM. SRAM, MRAM, resistance RAM (Re-RAM), embedded DRAM (e.g., 1T-1C based memory), or a combination of them. Using MRAM, or Re-RAM allows for low power and high-speed memory operation. Coherent cache or memory-side buffer chiplet 2521 may also function as a memory buffer.

Figure 26A:
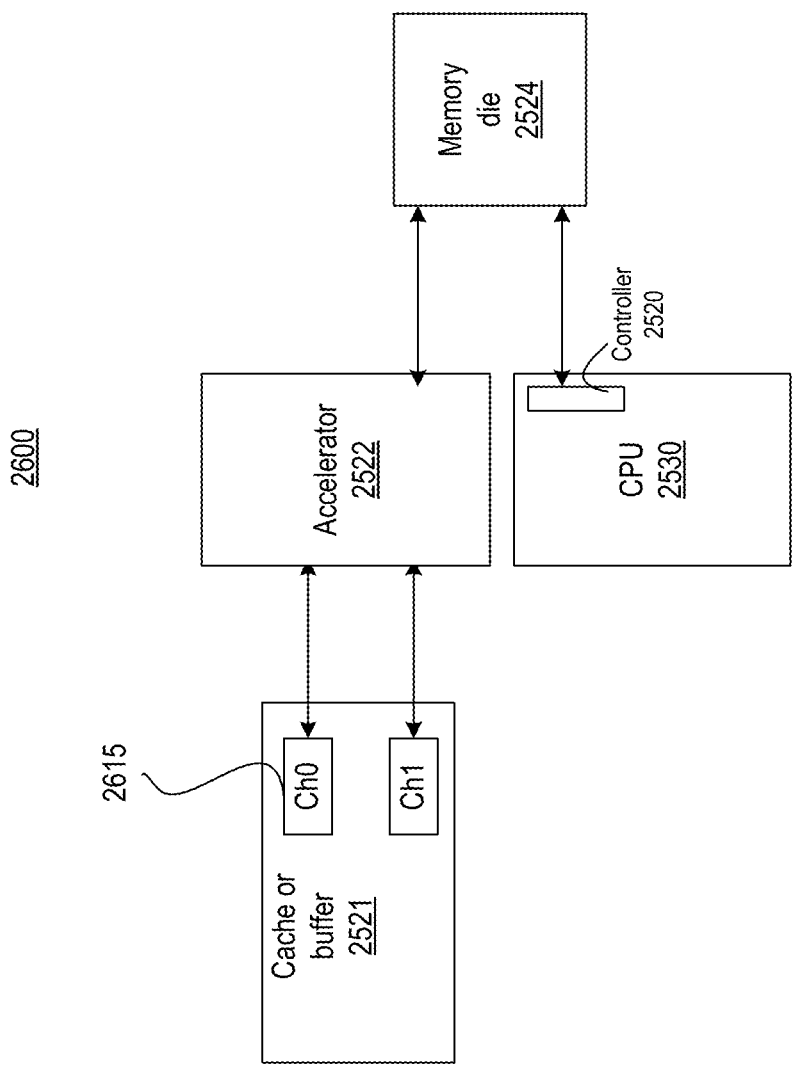
FIG. 26A illustrates a computing architecture with a coherent cache or memory-side buffer chiplet optimized for accelerator access, in accordance with some embodiment.

FIG. 26A illustrates computing architecture 2600 with a coherent cache or memory-side buffer chiplet optimized for accelerator access, in accordance with some embodiment. Compared to architecture 2520, here coherent cache or memory-side buffer chiplet 2521 is optimized for access to accelerator 2522. As such, accelerator 2522 (e.g., an inference chip) gets access is high bandwidth memory in coherent cache or memory-side buffer chiplet 2521.

Figure 26B:
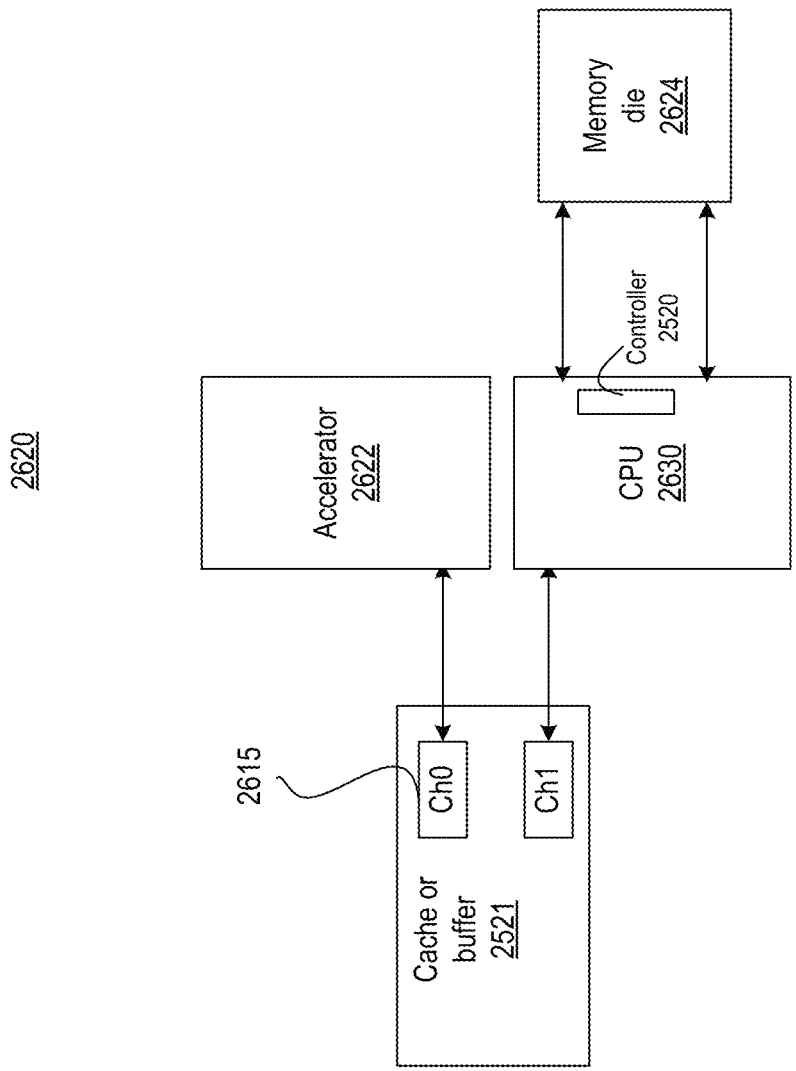
FIG. 26B illustrates a computing architecture where memory is controlled by a processor and coherent cache or memory-side buffer chiplet is shared between the accelerator and the processor, in accordance with some embodiments.

FIG. 26B illustrates computing architecture 2620 where memory is controlled by a processor and coherent cache or memory-side buffer chiplet is shared between the accelerator and the processor, in accordance with some embodiments. Compared to architecture 2620, here memory die 2624 is directly coupled to processor 2630. As such, processor 2630 controls memory die 2624 via controller 2520 and has access to high bandwidth memory in memory 2624. Coherent cache or memory-side buffer chiplet 2521 is shared between accelerator 2622 and processor 2630.

Memory die 2624 is similar to any memory die described herein with reference to various embodiments. For example, any of memory dies DRAM 102, SRAM 104, DRAM 106, SSD 107, DRAM 304, HBM 334, DRAM 401, HBM 505, RAM 507, RAM 508, and/or SSD 509. In some embodiments, memory die 2624 can be one or more of: FE-SRAM, FE-DRAM, SRAM, MRAM, resistance RAM (Re-RAM), embedded DRAM (e.g., 1T-1C based memory), 3D crosspoint, or a combination of them. Using FE-SRAM, MRAM, or Re-RAM allows for low power and high-speed memory operation. In some embodiments, the memory I/O in processor 2630 and memory die 2624 is any suitable memory I/O such as SERDES, Very Short Reach (VSR), compute express link (CXL), peripheral component interconnect express (PCIe), DDR, low power DDR (LPDDR), graphics DDR (GDDR), open coherent accelerator processor interface (openCAPI), MIPI, Advance Interface Bus (AIB), Embedded multi-die interconnect bridge (EMIB), or any suitable interface.

Figure 27:
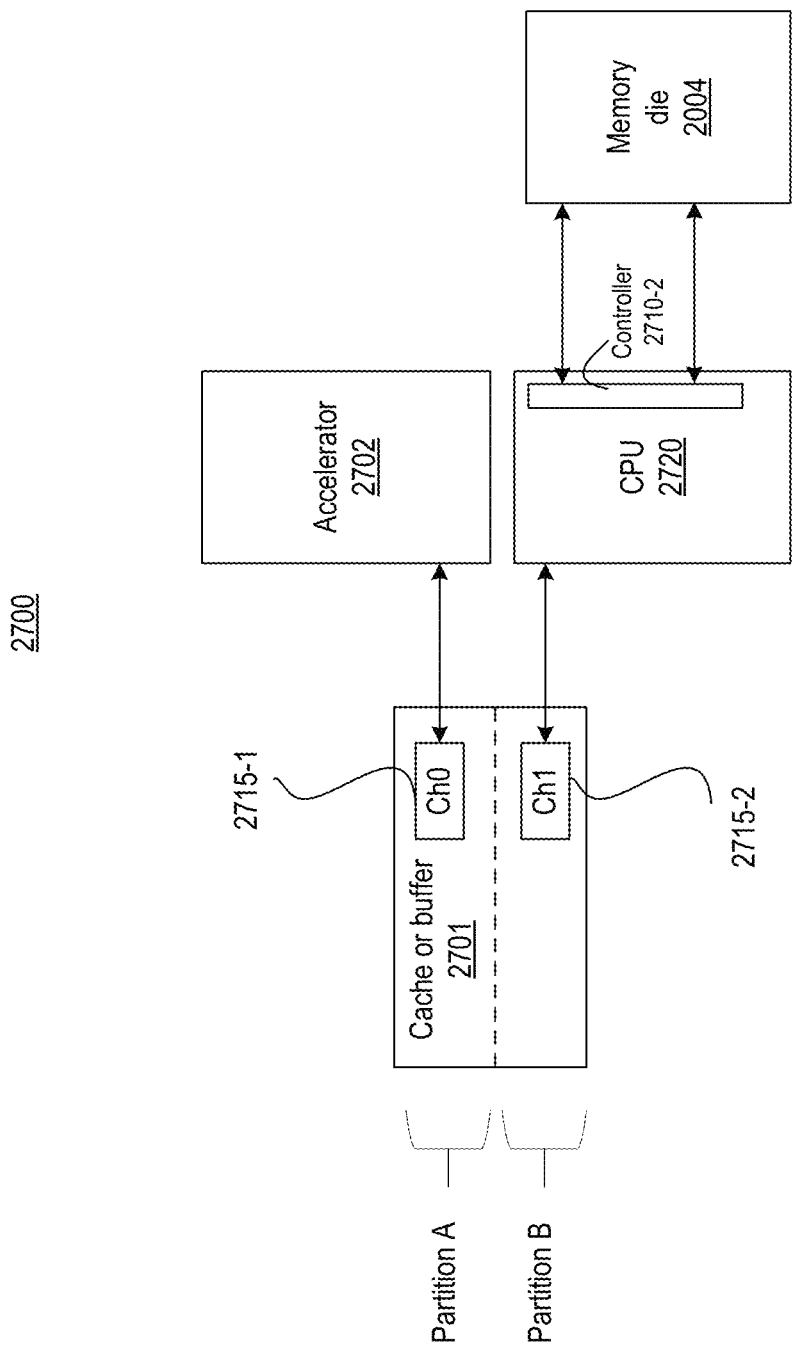
FIG. 27 illustrates a computing architecture where the coherent cache or memory-side buffer chiplet is partitioned between accelerator and the processor, in accordance with some embodiments.

FIG. 27 illustrates computing architecture 2700 where coherent cache or memory-side buffer chiplet is partitioned between accelerator and the processor, in accordance with some embodiments. Compared to computing architecture 2620, here coherent cache or memory-side buffer chiplet 2701 is portioned into partition A having channel 0 (Ch0) 2715-1 dedicated to accelerator 2702, and partition B having channel 1 (Ch1) 2715-2 dedicated to processor 2720. Coherent cache or memory-side buffer chiplet 2701 is a cache memory that comprises ferroelectric memory cells. For example, coherent cache or memory-side buffer chiplet 2701 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. Coherent cache or memory-side buffer chiplet 2701 may also function as a memory buffer.

Figure 28:
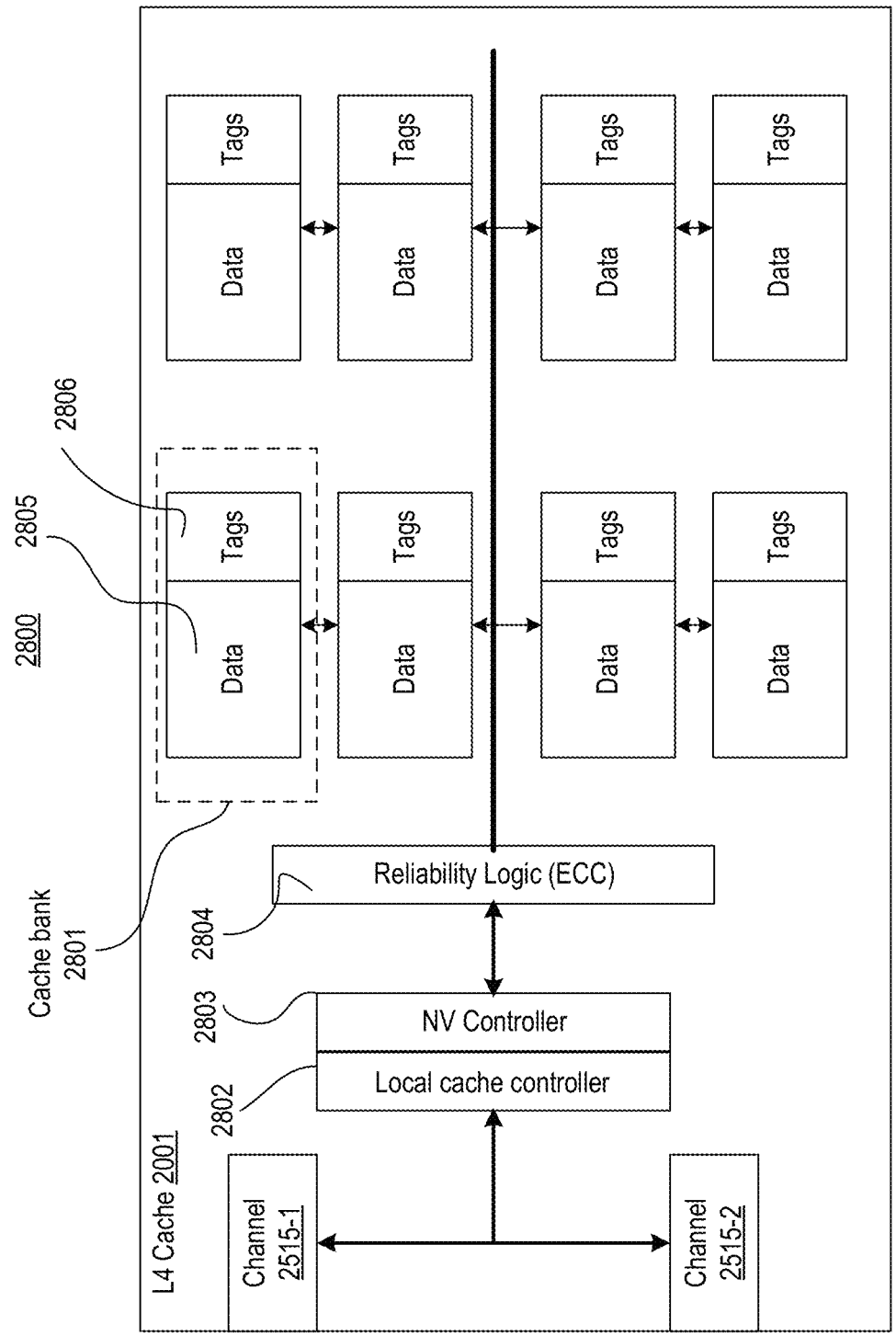
FIG. 28 illustrates an architecture of the coherent cache or memory-side buffer chiplet with multiple controllers and multiple cache banks, in accordance with some embodiments.

FIG. 28 illustrates architecture 2800 of the coherent cache or memory-side buffer chiplet (e.g., 2001) with multiple controllers and multiple cache banks, in accordance with some embodiments. In some embodiments, architecture 2800 comprises channels (e.g., ch0 2515-1 and ch1 2515-2), cache banks 2801, local cache controller 2802, non-volatile (NV) controller 2803, and reliability logic 2804. Coherent cache or memory-side buffer chiplet 2001 may function as a cache or memory buffer. In some embodiments, cache lookups can map a large physical memory into a small physical cache through the use of indirection via tags. Here, indirection refers to the use of tags to specify which address maps to which physical location. If multiple addresses can map to a single physical location, a tag is used to figure out which address is currently mapped.

In some embodiments, each cache bank 2801 includes data bank 2805 (e.g., comprising memory cells) and associated tags 2806. In some embodiments, data bank 2805 comprises ferroelectric memory cells. In some embodiments, data bank 2805 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 2805 includes ferroelectric memory, it uses NV controller 2803 and a stronger reliability logic (e.g., error correction code) for security compared to non-ferroelectric memory for data bank 2805.

When data region 2805 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, a tag 2806 may be coupled with each physical line. Tag 2806 may comprise some address bits, sufficient to uniquely identify which address currently occupies the physical line coupled with the tag.

In some embodiments, cache controller 2802 could be used to control state transitions required for cache look ups such as comparing requested addresses with tags stored in the tag array 2806, and identifying a candidate for replacement (replacement algorithm) when a cache miss occurs. In addition, the cache controller could be tasked with initializing the cache when the cache powers on. When FE memory of data region 2805, which retains state across power cycles, is used, cache controller 2802 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 2802 would skip locations marked thus when initializing memory.

In some embodiments, reliability logic 2804 performs error correction to the data. Any suitable error correction scheme (e.g., with error correction code (ECC)) may be used by reliability logic 2804. In some embodiments, NV controller 2803 is provided to explicitly clear the cache when using a non-volatile memory, such as FM memory for data region 2805. NV controller 2803 may include an NV bit which indicates cache lines that should not be cleared but are expected to retain their contents across power cycles. The functions of NV controller 2803 can be combined in cache controller 2802, or vice versa.

Figure 29:
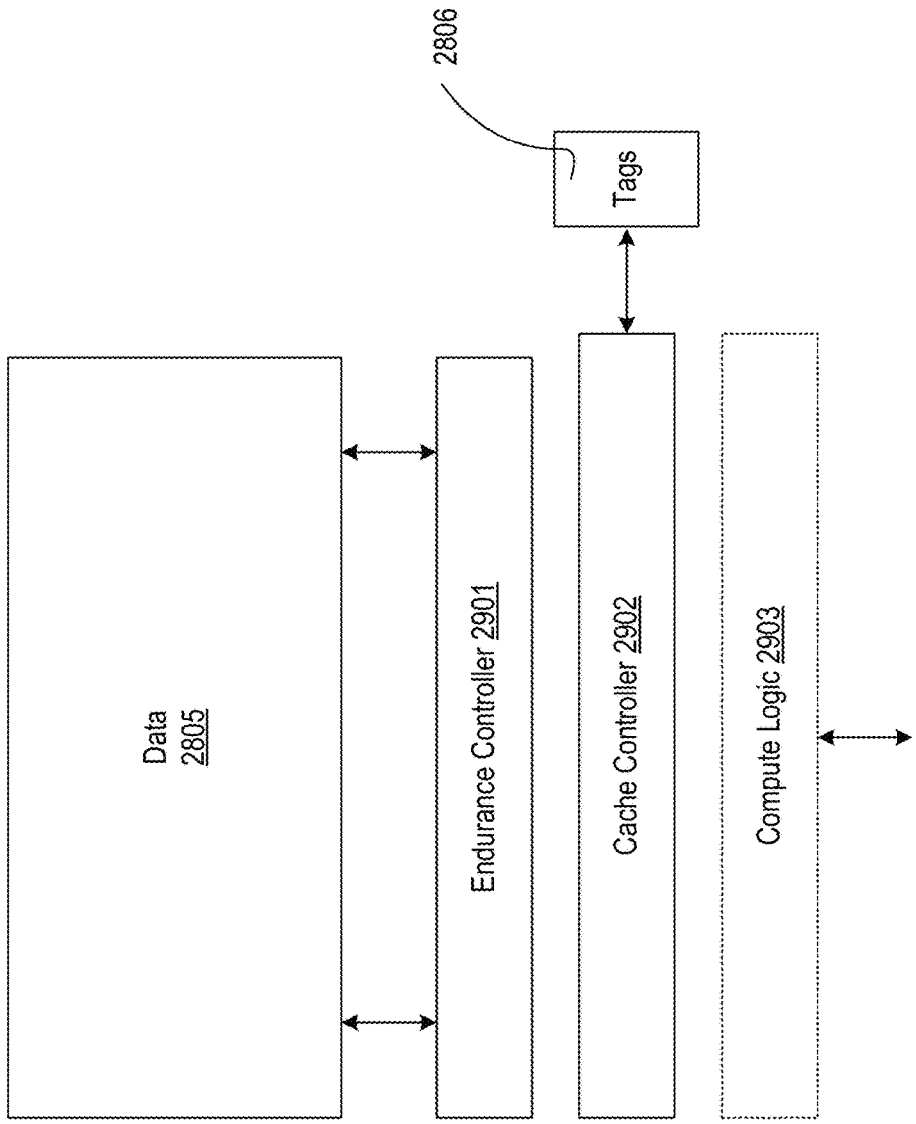
FIG. 29 illustrates an architecture of the cache bank with endurance controller to mitigate ferroelectric memory wear out, in accordance with some embodiments.

FIG. 29 illustrates architecture 2900 of the cache bank (e.g., 2801) with endurance controller to mitigate ferroelectric memory wear out, in accordance with some embodiments. In some embodiments, cache bank 2801 comprises endurance controller 2901, lookup logic 2902, and compute logic 2903. In some embodiments, data bank 2805 is coupled to endurance controller 2901. In some embodiments, endurance controller 2901 mitigates ferroelectric memory wear out. In some embodiments, endurance controller 2901 remaps data to different locations in data bank 2805 to even out the stress in data bank 2805.

In some embodiments, cache controller 2902 comprises a state machine that controls the tag lookup. Cache controller 2902 compares tags and identifies the location of requested lines. In some embodiments, compute logic 2903 comprises logic operations that could be applied broadly over a large region of memory, including logic to set memory bits to 1 or to 0, or even more complex logic such as logic add a constant across the region of memory, or to multiple a number to the values in data region 2805.

Figure 30:
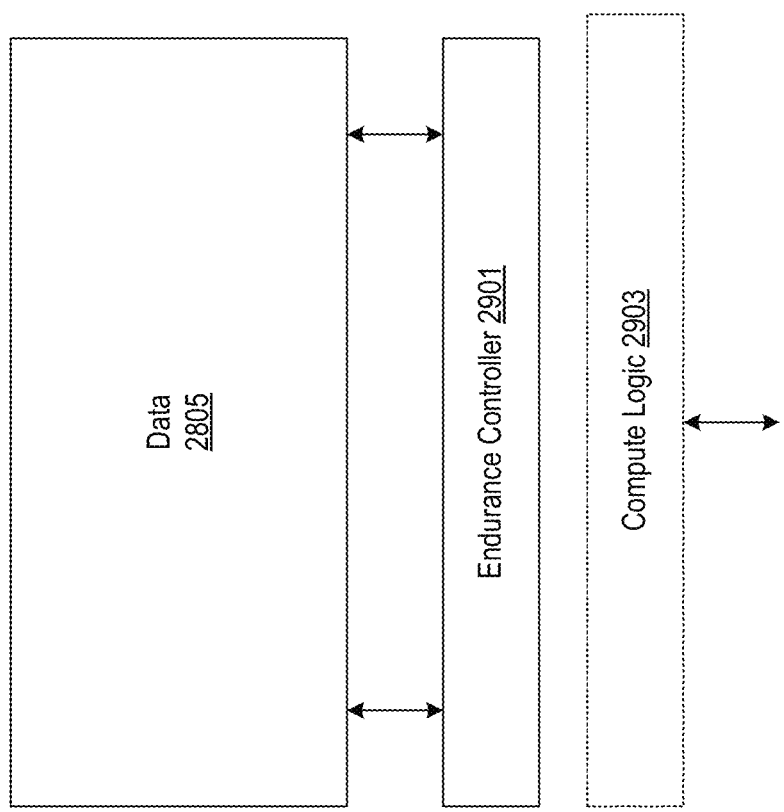
FIG. 30 illustrates an architecture of the memory bank with a flat memory address space with no lookup logic or tags, in accordance with some embodiments.

FIG. 30 illustrates architecture 3000 of the memory bank with a flat memory address space with no lookup logic or tags, in accordance with some embodiments. Compared to architecture 2900 tags 2806 are removed. As such, lookup table and its logic 2902 is also removed. Architecture 3000 is a flat memory address space with no lookup logic or tags.

Figure 31:
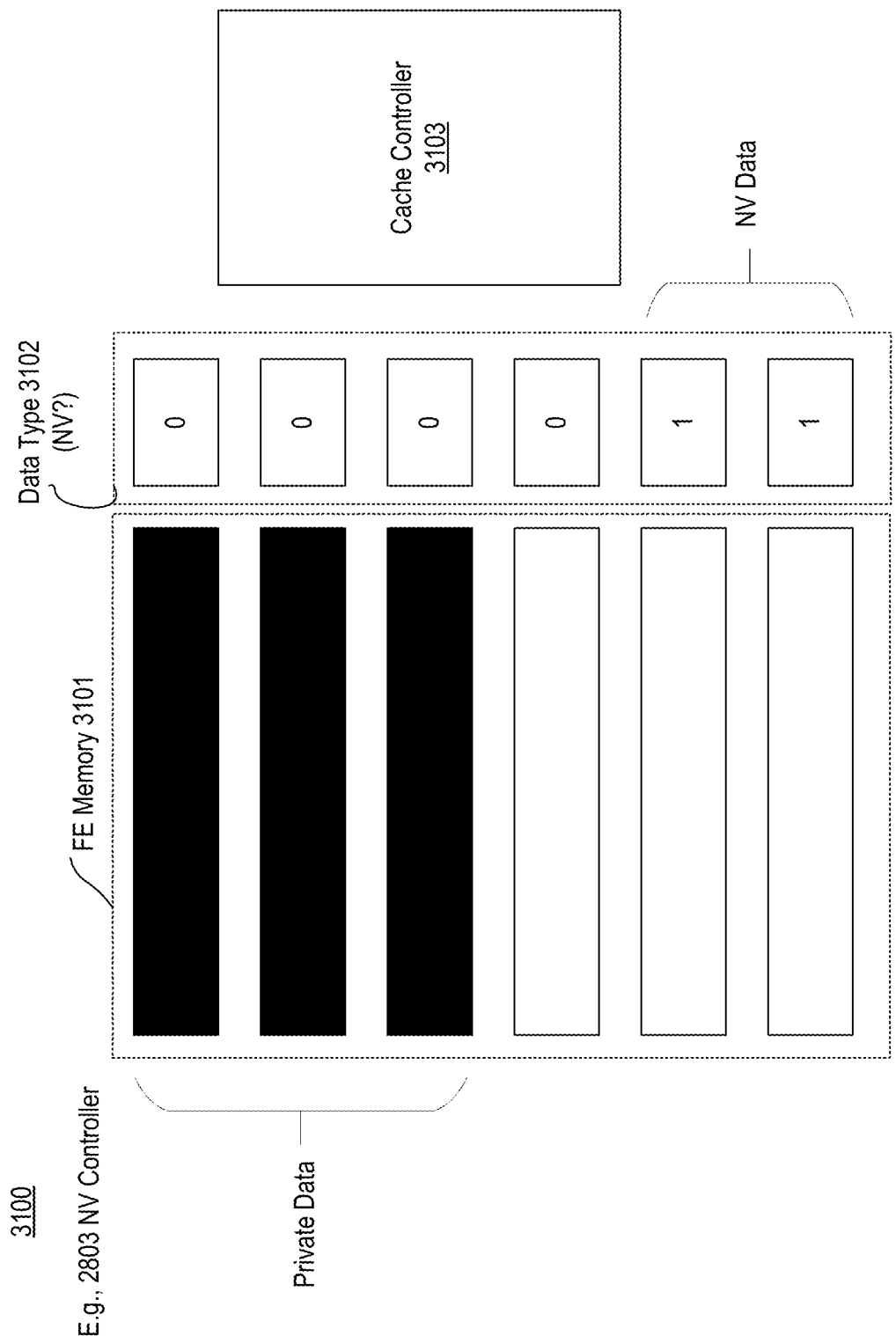
FIG. 31 illustrates a non-volatile controller of the coherent cache or memory-side buffer chiplet, in accordance with some embodiments.

FIG. 31 illustrates non-volatile (NV) controller 3100 (e.g., 2803) of the coherent cache or memory-side buffer chiplet, in accordance with some embodiments. NV controller 3100 comprises FE memory 3101 and bits 3102 for marking data type of a row of FE memory 3101. In some embodiments, memory which is not marked as NV (e.g., memories with data type '0'), is protected from access by programs. For example, subsequent programs are unable to access memory in the private data space because that space is marked by data type '0', which is not non-volatile. In some embodiments, NV controller 3100 explicitly clears the cache when using a non-volatile memory. The NV bit indicates cache lines that should not be cleared but are expected to retain their contents across power cycles.

In various embodiments, each access (e.g., read and/or write) proceed through cache controller 3103. In one example, debugging channel (JTAG) also proceeds through cache controller 3103. In some embodiments, cache controller is aware of power on. In various embodiments, bits indicating data type 3102 cannot be flipped through combination of thermal, magnetic, or electrical stress. In some embodiments, FE memory 3101 cannot be read through magnetic and electrical probing. In some embodiments, cache controller 3103 clears all volatile data (e.g., when bit for data type 3102 is 0) on power up.

Figure 32:
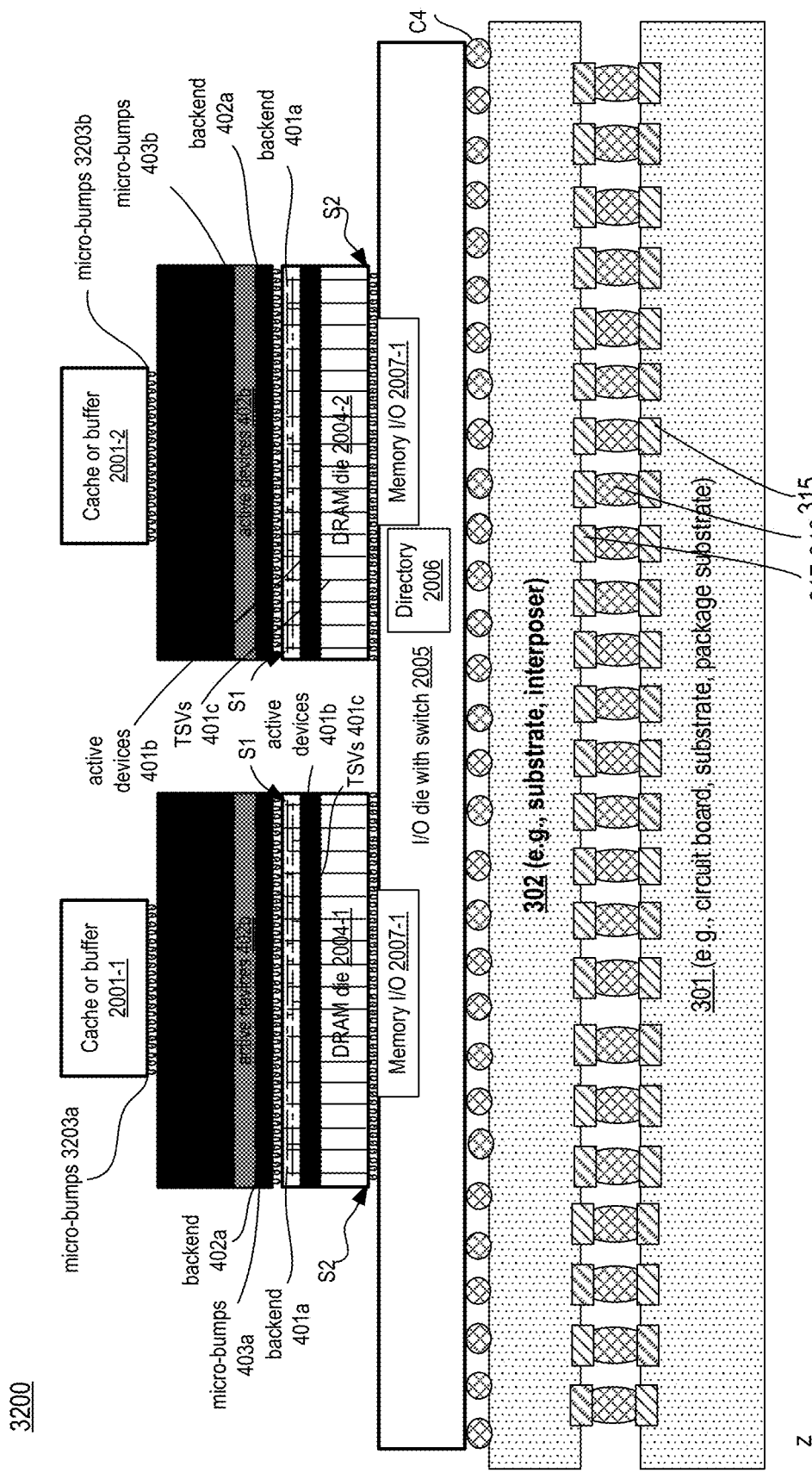
FIG. 32 illustrates a cross-section of a package with a coherent cache or memory-side buffer chiplet above or over the compute die, a memory below the compute die, and an I/O die below the memory die, in accordance with some embodiments.

FIG. 32 illustrates cross-section 3200 of a package with coherent cache or memory-side buffer chiplet above or over the compute die, a memory below the compute die, and an I/O die below the memory die, in accordance with some embodiments. Cross-section 3200 shows two stacks corresponding to top half of FIG. 20. The first stack comprises coherent cache or memory-side buffer chiplet 2001-1, compute die 2002-1, and memory die 2004-1. The second stack comprises coherent cache or memory-side buffer chiplet 2001-2, compute die 2002-2, and memory die 2004-2. The following embodiment is described with reference to the first stack. The same explanation is valid for the second stack.

Memory die 2004-1 is positioned under compute die 2002-1 and the two dies are wafer-to-wafer bonded via micro-bumps 403, copper-to-copper (Cu-to-Cu) pillars, hybrid Cu-to-Cu pillars 403. In some embodiments, Cu-to-Cu pillars are fabricated with copper pillars formed on each wafer substrate which is to be bonded together. In various embodiments, a conductive material (e.g., Nickel) is coated between the copper pillars of the two wafer dies. Here, coherent cache or memory-side buffer chiplet 2001-1 is on the top of the stack and over or on top of compute die 2002-1. In some embodiments, dies 2001-1 and 2002-1 are wafer-to-wafer bonded via micro-bumps 403, copper-to-copper (Cu-to-Cu) pillars, hybrid Cu-to-Cu pillars 403, wire bond, flip-chip ball grid array routing, chip-on-wafer substrate (COWOS), or embedded multi-die interconnect bridge.

In some embodiments, dies 2002-1 and 2004-1 are bonded such that their respective BE layers and active devices 401a/b and 403a/b face one another. As such, transistors between the two dies are closest where the die-to-die bonding happens. This configuration reduces the latency because active devices 401a and 402a are closer to one another compared to the active devices 301a and 302a of FIG. 3B.

In various embodiments, I/O die 2005 is under memory dies 2004-1 and 2004-2. I/O die 2005 may be positioned over substrate 302 or interposer 302. I/O die 2005 includes memory I/O 2007-1 to communicate with memory 2004-1. In various embodiments, memory I/O 2007-1 is SERDES, Very Short Reach (VSR), compute express link (CXL), peripheral component interconnect express (PCIe), DDR, low power DDR (LPDDR), graphics DDR (GDDR), open coherent accelerator processor interface (openCAPI) compliant I/O, MIPI, Advance Interface Bus (AIB), Embedded multi-die interconnect bridge (EMIB), or any suitable interface. In other embodiments, other memory interfaces may be used.

Compared to the configuration of FIG. 3B. TSVs 401c are decoupled from micro-bumps (or Cu-2-Cu pillars). For example, the number of TSVs 401c are not directly related to the number of micro-bumps 403. As such, memory die TSV perforation requirement is minimized as die-to-die I/O density is independent of TSV density. The Ultra high bandwidth also comes from the tight micro-bump spacing. In some embodiments, the micro-bump spacing 403 is tighter than the micro-bump spacing 310 of FIG. 3B because memory 2004-1 is not perforated at the same pitch as in compute die 302 of FIG. 3B. For example, in FIG. 3B micro-bump density is dependent on TSV pitch and overall signal routing design of compute die 302. Package configuration 3200 has no such limitation.

In some embodiments, memory die 2004-1 is perforated to form few TSVs 401c that carry DC signals such as power and ground from substrate 302 to compute die 2002-1. In some embodiments, these DC signals are carried to coherent cache or memory-side buffer chiplet 2001-1. External signals (e.g., external to package 3200) can also be routed to compute die 2002-1 via TSVs 401c. The bulk of all communication between compute die 2002-1 and memory die 2004-1 takes place though micro-bumps 403 or face-to-face interconnects 403. In various embodiments, there is no perforation of compute die 2002-1 because TSVs may not be needed. Even if TSVs were used to route to coherent cache or memory-side buffer chiplet 2001-1 on top of compute die 2002-1, those number of TSVs may not be related to the number of micro-bumps 403 in that they may not have to be the same number. In various embodiments, TSVs 401c pass through active region or layers (e.g., transistor regions) of memory die 2004-1.

In various embodiments, compute die 2002-1 comprises logic portions of an inference die. An inference die or chip is used to apply inputs and fixed weights associated with a trained model to generate an output. By separating the memory 2004-1 associated with inference die 2002-1, the AI performance increases. Further, such topology allows for better use of thermal solution such as heat sink 315 (that is formed over coherent cache or memory-side buffer chiplet 3001-1), which radiates heat away from the power consuming source, inference die 20024. While memory for die 20044 is illustrated as DRAM 401, different types of memories can also be used. For example, in some embodiments, memory 2004-1 can be one or more of: FE-SRAM, FE-DRAM, SRAM, MRAM, resistance RAM (Re-RAM), embedded DRAM (E.g., 1T-1C based memory), 3D crosspoint or a combination of them. Using FE-SRAM, MRAM, or Re-RAM allows for low power and high-speed memory operation. This allows for placing memory die 2004-1 below compute die 2002-1 to use the thermal solution more efficiently for compute die 2002-1. In some embodiments, memory die 2004-1 is a high bandwidth memory (HBM).

In some embodiments, compute die 2002-1 is an application specific circuit (ASIC), a processor, or some combination of such functions. Compute die 2002-1 may include multiple processing units or cores. In some embodiments, one or all of memory die 2004-1, compute die 402, and coherent cache or memory-side buffer chiplet 2001-1 may be embedded in encapsulant (not shown). In some embodiments, encapsulant can be any suitable material, such as epoxy-based build-up substrate, other dielectric/organic materials, resins, epoxies, polymer adhesives, silicones, acrylics, polyimides, cyanate esters, thermoplastics, and/or thermosets.

The memory circuitry of some embodiments can have active and passive devices in the front side of the die too. Memory die 2004-1 may have a first side S1 and a second side S2 opposite to the first side S1. The first side S1 may be the side of the die commonly referred to as the "inactive" or "back" side of the die. The backside of memory die 2004-1 may include active or passive devices, signal and power routings, etc. The second side S2 may include one or more transistors e.g., access transistors), and may be the side of the die commonly referred to as the "active" or "front" side of the die. The second side S2 of memory die 2004-1 may include one or more electrical routing features 310. Compute die 2002-1 may include an "active" or "front" side with one or more electrical routing features connected to micro-bumps 403. In some embodiments, electrical routing features may be bond pads, solder balls, or any other suitable coupling technology.

Compared to package configuration 320, here the thermal issue is mitigated because heat sink 315 is partially directly attached to compute die 2002-1, which generates most of the heat in this packaging configuration. For example, the empty space on either side of coherent cache or memory-side buffer chiplet 2001-1 above compute die 2002-1 may include part of heat sink 315. While the embodiment of FIG. 32 is illustrated as wafer-to-wafer bonding between dies 2002-1, 2003-1 and 2004-1, in some embodiments, these dies can also be bonded using wafer-to-die bonding technologies. Compared to package configuration 320, higher bandwidth is achieved between memory die 2002-1 and compute die 2004-1 as higher number of channels are available between memory die 2004-1 and compute die 2002-1. Further, memory access energy is reduced compared to memory access energy of package configuration 320 because memory access is direct and uniform as opposed to indirect and distributed. Due to local access of memory in die by processing elements (PE) of compute die 2002-1, latency is reduced compared to latency in package configuration 320. The close and direct connection between compute die 2002-1 and memory die 2004-1 allows memory of memory die 2004-1 to behave as a fast-accessible cache memory.

In some embodiments, coherent cache or memory-side buffer chiplet 2001-1 also has comparable (or almost the same) number of channels between compute die 2002-1 and coherent cache or memory-side buffer chiplet 2001-1 as they are between memory die 2002-1 and compute die 2004-1. Coherent cache or memory-side buffer cache access energy is reduced compared to memory access energy of package configuration 320 because memory access is direct and uniform as opposed to indirect and distributed. In some embodiments, coherent cache or memory-side buffer chiplet 2001-1 may include a stack of memory dies tightly coupled together in a vertical and/or horizontal fashion.

In some embodiments, the IC package assembly may include, for example, combinations of flip-chip and wire-bonding techniques, interposers, multi-chip package configurations including system-on-chip (SoC) and/or package-on-package (POP) configurations to route electrical signals.

Figure 33:
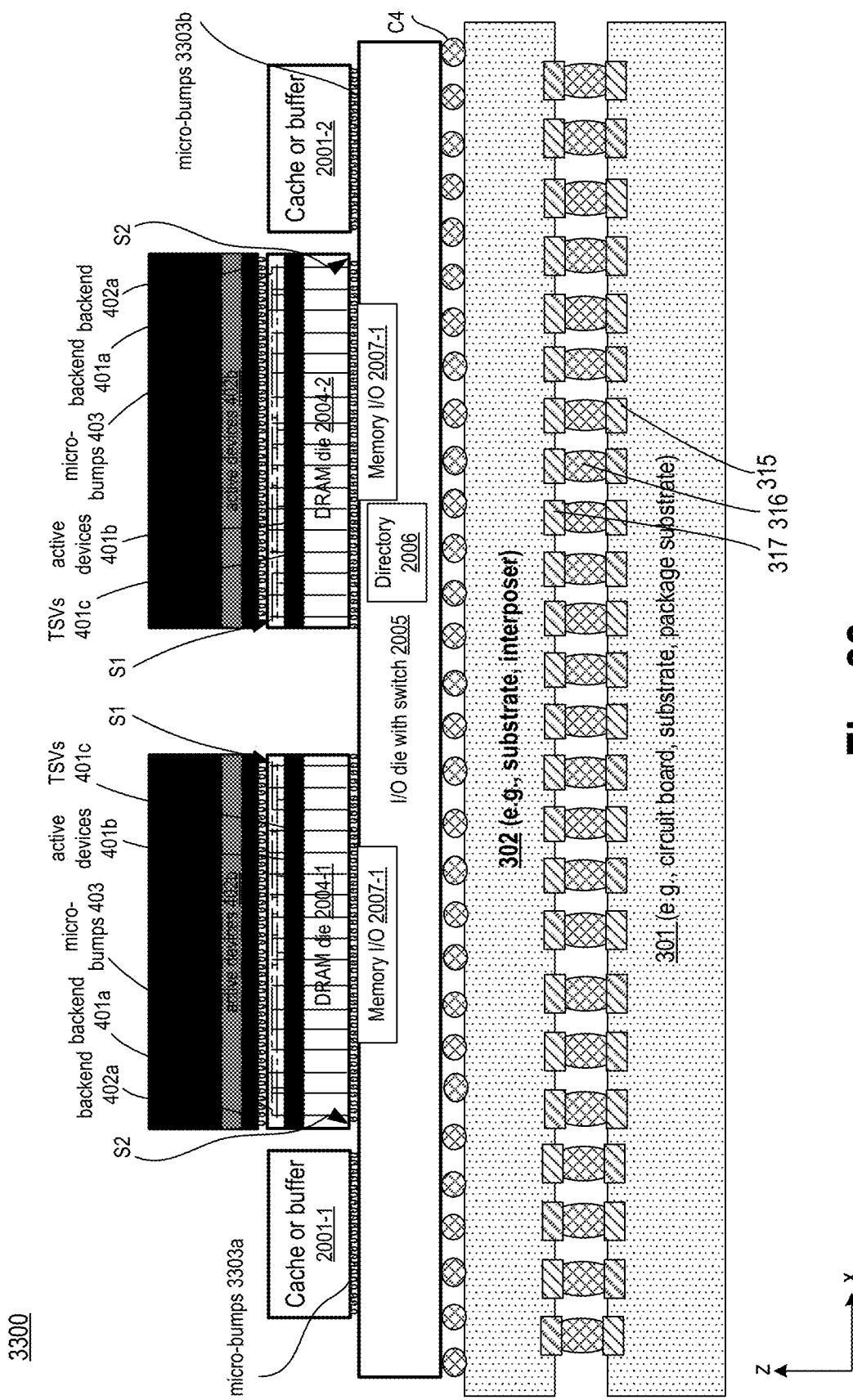
FIG. 33 illustrates a cross-section of a package with a coherent cache or memory-side buffer chiplet directly above an I/O die, a memory below the compute die, and the I/O die below the memory die, in accordance with some embodiments.

FIG. 33 illustrates cross-section 3300 of a package with coherent cache or memory-side buffer chiplet directly above an I/O die, a memory below the compute die, and the I/O die below the memory die, in accordance with some embodiments. Cross-section 3300 shows four stacks corresponding to top half of FIG. 21 where the coherent cache or memory-side buffer chiplet comprises I/Os 2003-1 that are directly coupled with I/O 2101-1 of I/O die 2005. Compared to FIG. 33, here coherent cache or memory-side buffer chiplet is placed on I/O die 2005. This embodiment allows for heat sink 315 to be directly and fully attached to compute die 2002-1, which generates most of the heat in this packaging configuration. Coherent cache or memory-side buffer chiplet 2001-1 is coupled to I/O die 2005 via wafer-to-wafer bonding, in accordance with some embodiments. For example, coherent cache or memory-side buffer chiplet 2001-1 and I/O die 2005 are wafer-to-wafer bonded via micro-bumps 3303a, copper-to-copper (Cu-to-Cu) pillars, hybrid Cu-to-Cu pillars, wire bond, flip-chip ball grid array routing, chip-on-wafer substrate (COWOS), or embedded multi-die interconnect bridge, or a combination on them.

Figure 34:
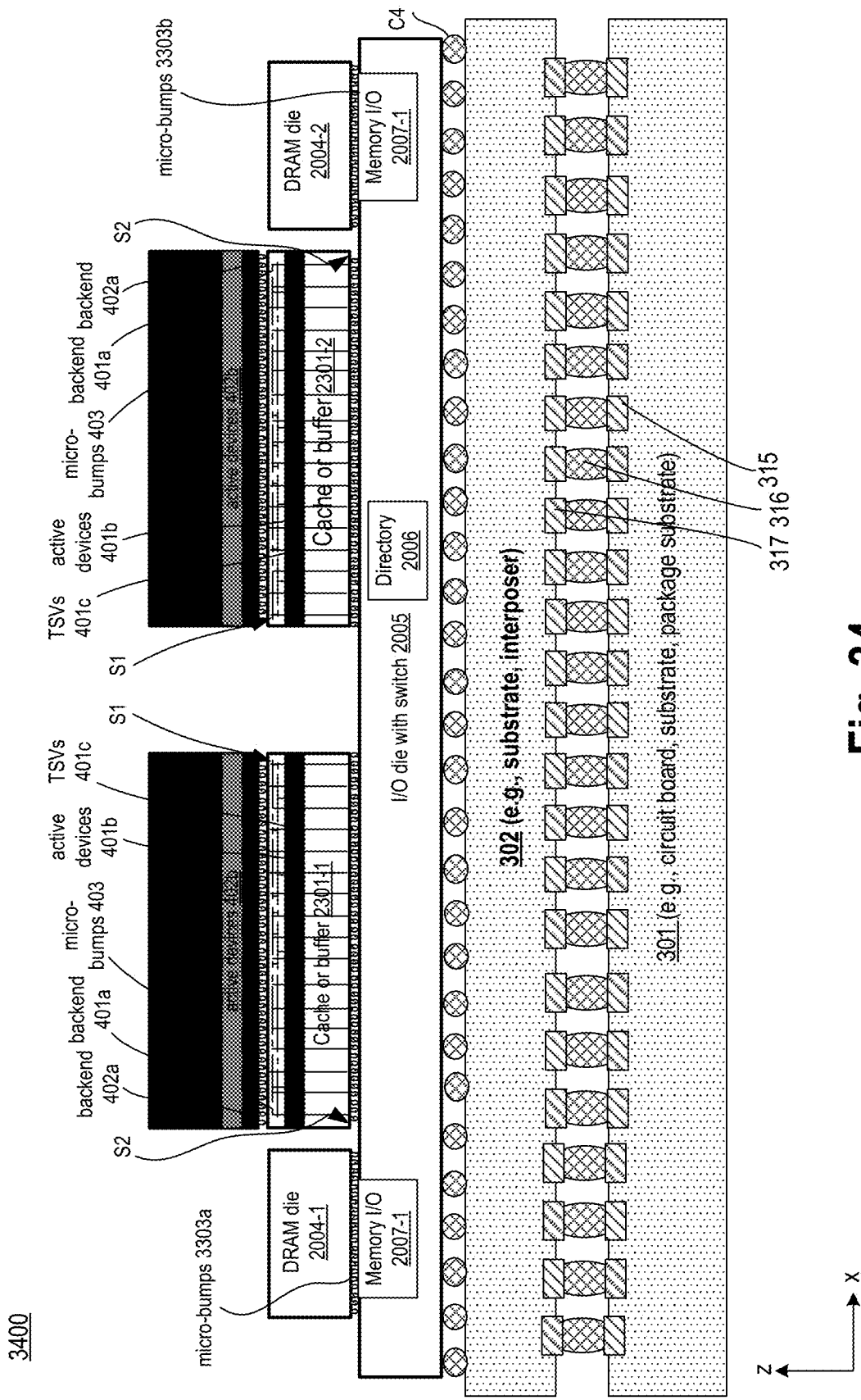
FIG. 34 illustrates a cross-section of a package with a memory directly above an I/O die, a coherent cache or memory-side buffer chiplet below the compute die, and the I/O die below the coherent cache or memory-side buffer chiplet, in accordance with some embodiments.

FIG. 34 illustrates cross-section 3400 of a package with a memory directly above an I/O die, a coherent cache or memory-side buffer chiplet below the compute die, and the I/O die below the coherent cache or memory-side buffer chiplet, in accordance with some embodiments. Cross-section 3400 covers various embodiments of FIGS. 20-24 where coherent cache or memory-side buffer chiplet is coupled to compute die 2002-1 and I/O die 2005. In various embodiments, compute die 2002-1 is placed over coherent cache or memory-side buffer chiplet 2301-1. In some embodiments, memory die 2004-1 is directly coupled to I/O switch 2005 but is directly under compute die 2002-1. The first stack comprises coherent cache or memory-side buffer chiplet 2301-1 and compute die 2002-1. The second stack comprises coherent cache or memory-side buffer chiplet 2301-2, compute die 2002-2. The third stack comprises memory die 2004-1. The fourth stack comprises memory die 2004-2. In some embodiments, coherent cache or memory-side buffer chiplet 2301-1 may include a stack of coherent cache or memory-side buffer dies that are wafer-to-wafer bonded via micro-bumps, copper-to-copper (Cu-to-Cu) pillars, hybrid Cu-to-Cu pillars, wire bond, flip-chip ball grid array routing, chip-on-wafer substrate (COWOS), or embedded multi-die interconnect bridge, or a combination of them. In some embodiments, memory die 2004 comprises a stack of memory dies that are wafer-to-wafer bonded via micro-bumps, copper-to-copper (Cu-to-Cu) pillars, hybrid Cu-to-Cu pillars, wire bond, flip-chip ball grid array routing, chip-on-wafer substrate (COWOS), or embedded multi-die interconnect bridge, or a combination of them. The following embodiment is described with reference to the first stack and the third stack. The same explanation is valid for the second stack and the fourth stack, respectively.

Coherent cache or memory-side buffer chiplet 2301-1 is positioned under compute die 2002-1 and the two dies are wafer-to-wafer bonded via micro-bumps 403, copper-to-copper (Cu-to-Cu) pillars, hybrid Cu-to-Cu pillars 403 wire bond, flip-chip ball grid array routing, chip-on-wafer substrate (COWOS), or embedded multi-die interconnect bridge, or a combination of them. In some embodiments, Cu-to-Cu pillars are fabricated with copper pillars formed on each wafer substrate which is to be bonded together. In various embodiments, a conductive material (e.g., Nickel) is coated between the copper pillars of the two wafer dies. In some embodiments, die 2002-1 and coherent cache or memory-side buffer chiplet 2301-1 are bonded such that their respective BE layers and active devices 401a/b and 403a/b face one another. As such, transistors between the two dies are closest where the die-to-die bonding happens. This configuration reduces the latency because active devices 401a and 402a are closer to one another compared to the active devices 301a and 302a of FIG. 3B.

In various embodiments, I/O die 2005 is under memory dies 2004-1 and 2004-2 and coherent cache or memory-side buffer chiplet 2301-1. I/O die 2005 may be positioned over substrate 302 or interposer 302. I/O die 2005 includes memory I/O 2007-1 to communicate with memory 2004-1. In various embodiments, memory I/O 2007-1 is DDR compliant I/O. In other embodiments, other memory interfaces may be used.

Compared to the configuration of FIG. 3B. TSVs 401c are decoupled from micro-bumps (or Cu-2-Cu pillars). For example, the number of TSVs 401c are not directly related to the number of micro-bumps 403. As such, memory die TSV perforation requirement is minimized as die-to-die I/O density is independent of TSV density. The Ultra high bandwidth also comes from the tight micro-bump spacing. In some embodiments, the micro-bump spacing 403 is tighter than the micro-bump spacing 310 of FIG. 3B because memory 2004-1 is not perforated at the same pitch as in compute die 302 of FIG. 3B. For example, in FIG. 3B micro-bump density is dependent on TSV pitch and overall signal routing design of compute die 302. Package configuration 3400 has no such limitation.

In some embodiments, coherent cache or memory-side buffer chiplet 2301-1 is perforated to form few TSVs 401c that carry DC signals such as power and ground from substrate 302 to compute die 2002-1. External signals (e.g., external to package 3400) can also be routed to compute die 2002-1 via TSVs 401c. The bulk of all communication between compute die 2002-1 and coherent cache or memory-side buffer chiplet 2301-1 takes place though micro-bumps 403 or face-to-face interconnects 403. In various embodiments, there is no perforation of compute die 2002-1 because TSVs may not be needed. In various embodiments, TSVs 401c pass through active region or layers (e.g., transistor regions) of coherent cache or memory-side buffer chiplet 2301-1.

In various embodiments, compute die 2002-1 comprises logic portions of an inference die. An inference die or chip is used to apply inputs and fixed weights associated with a trained model to generate an output. By separating the memory 2004-1 associated with inference die 2002-1, the AI performance increases. Further, such topology allows for better use of thermal solution such as heat sink 315 which radiates heat away from the power consuming source, inference die 2002-1. In some embodiments, coherent cache or memory-side buffer chiplet 2301-1 can be one or more of: FE-SRAM, FE-DRAM, SRAM, MRAM, resistance RAM (Re-RAM), embedded DRAM (E.g., 1T-1C based memory), 3D cross-point or a combination of them. Using FE-SRAM, MRAM, or Re-RAM allows for low power and high-speed memory operation. This allows for placing coherent cache or memory-side buffer chiplet 2301-1 below compute die 2002-1 to use the thermal solution more efficiently for compute die 2002-1.

In some embodiments, compute die 2002-1 is an application specific circuit (ASIC), a processor, or some combination of such functions. Compute die 2002-1 may include multiple processing units or cores. In some embodiments, one or all of memory die 2004-1, compute die 402, and coherent cache or memory-side buffer chiplet 2001-1 may be embedded in encapsulant (not shown). In some embodiments, encapsulant can be any suitable material, such as epoxy-based build-up substrate, other dielectric/organic materials, resins, epoxies, polymer adhesives, silicones, acrylics, polyimides, cyanate esters, thermoplastics, and/or thermosets.

The memory circuitry of coherent cache or memory-side buffer chiplet 2301-1 of some embodiments can have active and passive devices in the front side of the die too. Coherent cache or memory-side buffer chiplet 2301-1 may have a first side S1 and a second side S2 opposite to the first side S1. The first side S1 may be the side of the die commonly referred to as the "inactive" or "back" side of the die. The backside of coherent cache or memory-side buffer chiplet 2301-1 may include active or passive devices, signals and power routings, etc. The second side S2 may include one or more transistors (e.g., access transistors), and may be the side of the die commonly referred to as the "active" or "front" side of the die. The second side S2 of coherent cache or memory-side buffer chiplet 2301-1 may include one or more electrical routing features 310. Compute die 2002-1 may include an "active" or "front" side with one or more electrical routing features connected to micro-bumps 403. In some embodiments, electrical routing features may be bond pads, solder balls, or any other suitable coupling technology.

Compared to package configuration 320, here the thermal issue is mitigated because heat sink 315 is directly attached to compute die 2002-1, which generates most of the heat in this packaging configuration. While the embodiment of FIG. 34 is illustrated as wafer-to-wafer bonding between dies 2002-1 and coherent cache or memory-side buffer chiplet 2301-1, in some embodiments, these dies can also be bonded using wafer-to-die bonding technologies. Compared to package configuration 320, higher bandwidth is achieved between coherent cache or memory-side buffer chiplet 2301-1 and compute die 2004-1 as higher number of channels are available between coherent cache or memory-side buffer chiplet 2301-1 and compute die 2002-1. Further, memory access energy is reduced compared to memory access energy of package configuration 320 because memory access is direct and uniform as opposed to indirect and distributed. Due to local access of memory in die by processing elements (PE) of compute die 2002-1, latency is reduced compared to latency in package configuration 320. The close and direct connection between compute die 2002-1 and coherent cache or memory-side buffer chiplet 2301-1 allows memory of memory die 2004-1 to behave as a fast-accessible cache memory.

In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

Figure 35:
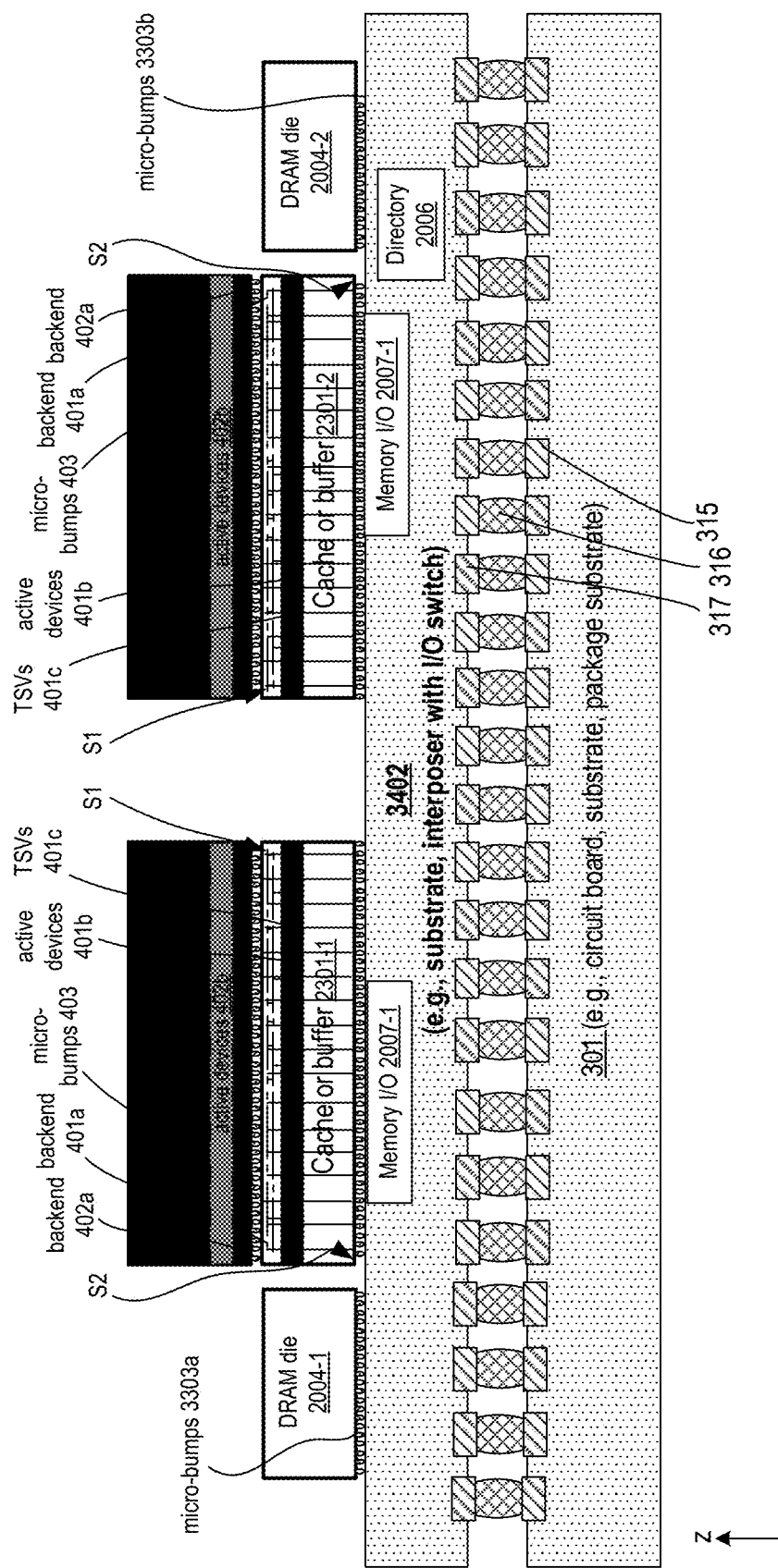
FIG. 35 illustrates a cross-section of a package with a memory directly above an I/O die, a coherent cache or memory-side buffer chiplet below the compute die, and the I/O die below the coherent cache or memory-side buffer chiplet, wherein the I/O die is part of an interposer or substrate, in accordance with some embodiments.

FIG. 35 illustrates cross-section 3500 of a package with a memory directly above an I/O die, a coherent cache or memory-side buffer chiplet below the compute die, and the I/O die below the coherent cache or memory-side buffer chiplet, wherein the I/O die is part of an interposer or substrate, in accordance with some embodiments. Cross-section is same as cross-section 3400 but for I/O die 2005 being embedded in substrate or interposer as indicated by reference label 3402.

Figure 36:
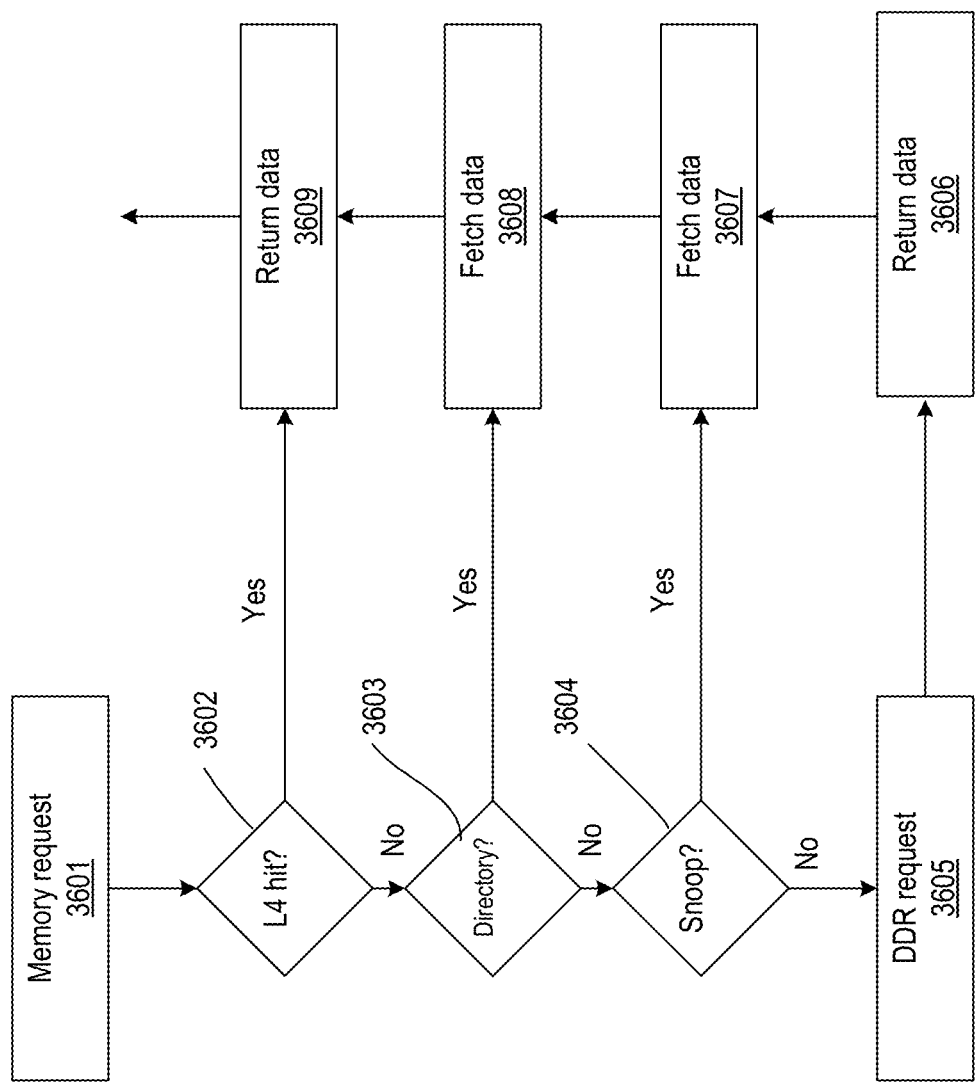
FIG. 36 illustrates a flowchart of a method for handling coherent cache or memory-side buffer requests, from a ferroelectric based coherent cache or memory-side buffer chiplet, where the requests include coherent access and non-coherent requests, in accordance with some embodiments.

FIG. 36 illustrates flowchart 3600 of a method for handling coherent cache or memory-side buffer requests, from a ferroelectric based coherent cache or memory-side buffer chiplet, where the requests include coherent access and non-coherent requests, in accordance with some embodiments. While various blocks in the flowchart are illustrated in a particular order, the order can be modified. For example, some blocks can be performed in parallel and some blocks can be performed before others. Functions performed by some or all blocks described herein are implemented in software, hardware, or a combination of them.

Coherent caches allow multiple copies of the same data in different caches (e.g., L4 caches). A protocol like MESI is applied to track which cache lines are dirty, valid, invalid, shared, etc. With coherent caches, when an L3 miss occurs, the latest copy of the desired cache line is identified. Generally, this can be done by checking other caches first and then going to memory if no other copies are found. A directory can be used as a central tracking mechanism to identify where the latest copies of the cache line can be found.

At block 3601, compute die 2002-1 makes a memory request. Before, memory 2004 is accessed, compute die 2002 checks coherent cache or memory-side buffer chiplet 2001. At block 3602, compute die 2002-1 determines whether there is a hit in coherent cache or memory-side buffer chiplet 2001. If there is a cache hit, the process proceeds to block 3609 where data is retrieved from coherent cache or memory-side buffer chiplet 2001 and returned to compute die 2002-1. If there is no hit, the process proceeds to block 3603. At block 3603, the request is sent to directory 2006 where the request address is compared against current contents of directory 2006. Directory 2006 may have the request address and may be able to forward it to a particular coherent cache or memory-side buffer chiplet to retrieve the data.

In a directory-based system, the address for data being shared is placed in a common directory 2006 that maintains the coherence between caches. Directory 2006 acts as a filter through which the compute die 2002 must ask permission to load an entry from the primary memory to its cache. When an entry is changed, directory 2006 either updates or invalidates the other caches with that entry. If the request address is found in common directory 2006, the process proceeds to block 3608 where data is fetched from directory 2006. The data is then returned to compute die 2002-1. If directory 2006 does not contain the request address, then the request may need to snoop other coherent cache or memory-side buffer chiplets, as indicated by block 3604, to check coherent cache or memory-side buffer addresses not reflected in the directory contents.

Snooping is a process where the individual caches monitor address lines for accesses to memory locations that they have cached. This mechanism is used by the write-invalidate protocols and write-update protocols. For the snooping mechanism, a snoop filter reduces the snooping traffic. The snooping traffic is reduced by maintaining a plurality of entries. Each entry represents a cache line that may be owned by one or more nodes. When replacement of one of the entries is required, the snoop filter selects for the replacement the entry representing the cache line or lines owned by the fewest nodes, as determined from a presence vector in each of the entries. In some embodiments, a temporal or other type of algorithm may be used to refine the selection if more than one cache line is owned by the fewest nodes.

At block 3604, other caches (e.g., coherent cache or memory-side buffer chiplets) are snooped to see if an up to date copy of the data is available in other caches. If the data is available, it can be fetched from the cache that holds it at block 3607. If no copy up to date copy of the data is identified through a snoop, the request is handed off to the memory controller to as indicated by block 3605. The data is then retrieved from memory 2004 and returned to compute die 2002 at block 3606.

Figure 37:
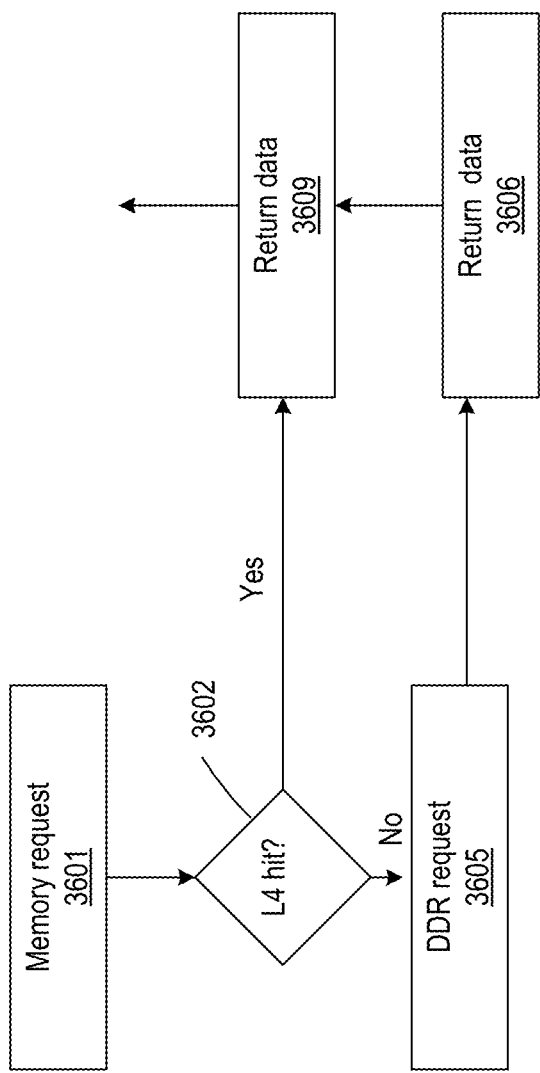
FIG. 37 illustrates a flowchart of a method for handling coherent cache or memory-side buffer requests, from a ferroelectric based coherent cache or memory-side buffer chiplet, where the requests include requests from memory side cache, in accordance with some embodiments.

FIG. 37 illustrates flowchart 3700 of a method for handling coherent cache or memory-side buffer requests, from a ferroelectric based coherent cache or memory-side buffer chiplet, where the requests include requests from memory side cache, in accordance with some embodiments. While various blocks in the flowchart are illustrated in a particular order, the order can be modified. For example, some blocks can be performed in parallel and some blocks can be performed before others. Functions performed by some or all blocks described herein are implemented in software, hardware, or a combination of them.

Compared to accessing data from coherent caches, flowchart 3700 uses orthogonal indexing. Orthogonal indexing eliminates the complexity of coherence by allowing each address to exist in a single cache. Each cache maps a subset of non-overlapping addresses e.g., address %4=0 goes to processor 0 of compute die 2002-1, address %4=1 goes to processor 1 of compute die 2002-1, address %4=3 goes to processor 2 of compute die 2002-1, and address %4 goes to processor 3 of compute die 2002-1. In this, address in 1 L4 (L4 which is mapped) is looked at, and if not found, the data is fetched from memory 2004. Compared to flowchart 3600, processes 3603, 3604, 3607, and 3608 are removed.

Elements of embodiments are also provided as a machine-readable medium (e.g., memory) for storing the computer-executable instructions (e.g., instructions to implement any other processes discussed herein). In some embodiments, a computing platform comprises a memory, a processor, a machine-readable storage media (also referred to as tangible machine readable medium), a communication interface (e.g., wireless or wired interface), and a network bus coupling them.

In some embodiments, the processor is a Digital Signal Processor (DSP), an Application Specific Integrated Circuit (ASIC), a general-purpose Central Processing Unit (CPU), or a low power logic implementing a simple finite state machine to perform the method of various embodiments, etc.

In some embodiments, the various logic blocks of the system are coupled together via the network bus. Any suitable protocol may be used to implement the network bus. In some embodiments, the machine-readable storage medium includes instructions (also referred to as the program software code/instructions) for intelligent prediction of processor idle time as described with reference to the various embodiments and flowchart.

Program software code/instructions associated with flowchart(s) (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowchart 1200 (and/or various embodiments) are executed by the computer system.

In some embodiments, the program software code/instructions associated with flowcharts (and/or various embodiments) are stored in a computer executable storage medium and executed by the processor. Here, computer executable storage medium is a tangible machine-readable medium that can be used to store program software code/instructions and data that, when executed by a computing device, causes one or more processors to perform a method(s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowcharts and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, magnetic random-access memory, ferroelectric memory, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, the tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 38:
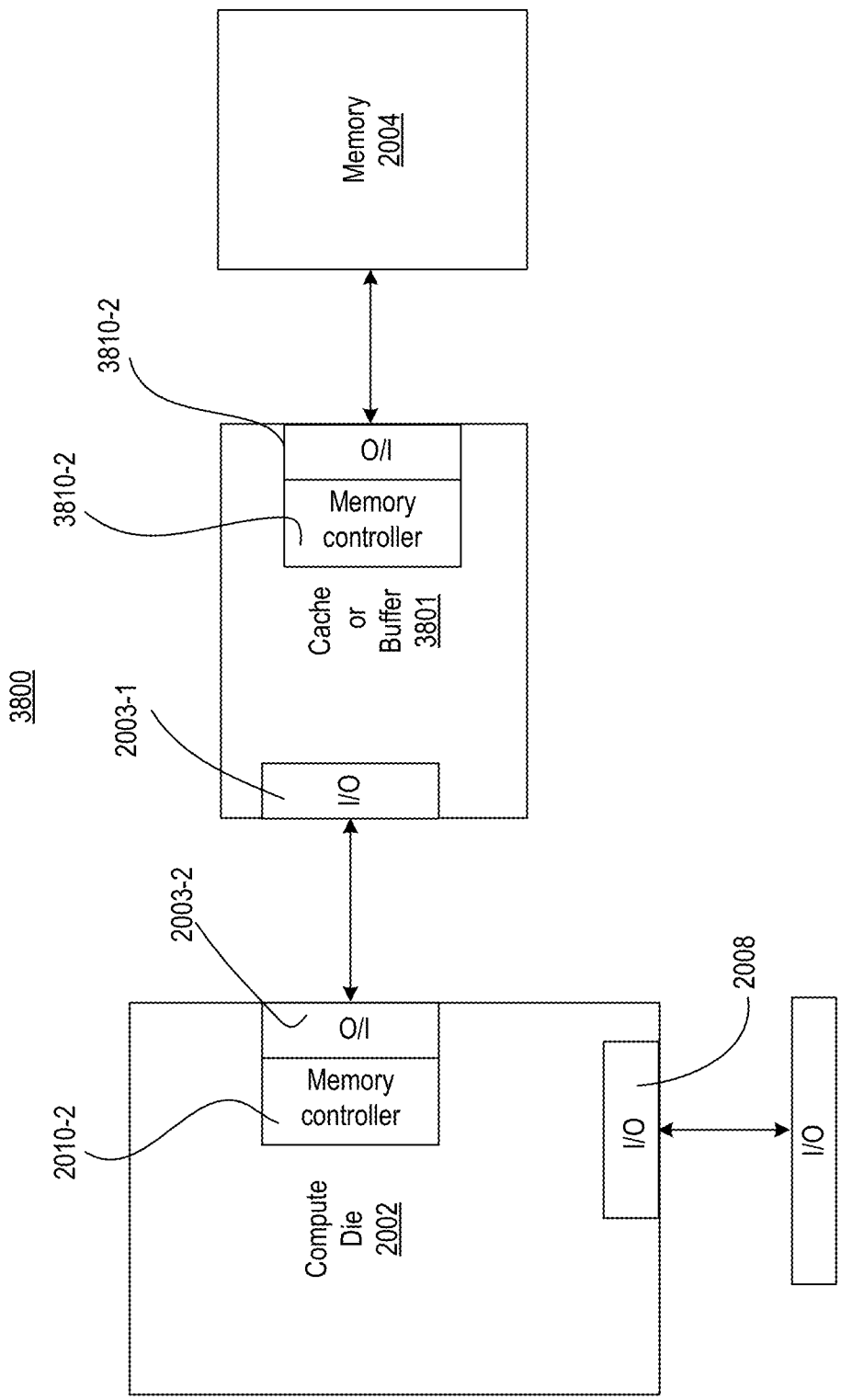
FIG. 38 illustrates a computing system with ferroelectric based coherent cache or memory-side buffer chiplet having a memory controller to connect with a memory, in accordance with some embodiments.

FIG. 38 illustrates computing system 3800 with ferroelectric based coherent cache or memory-side buffer chiplet having a memory controller to connect with a memory, in accordance with some embodiments. Computing system 3800 comprises compute die 2002, ferroelectric based coherent cache or memory-side buffer chiplet 3801, and memory 2004. As discussed with reference to various embodiments, compute die 2002 includes memory controller 2010 (e.g., 2010-2) and associated I/O (e.g., 2003-2) to communicate with ferroelectric based coherent cache or memory-side buffer chiplet 3801. To allow late binding of various computing system configurations, in some embodiments, ferroelectric based coherent cache or memory-side buffer chiplet 3801 includes memory controller (e.g., 3810-2) and associated I/O (e.g., 3810-2) to communicate with memory 2004. With the memory controller of ferroelectric based coherent cache or memory-side buffer chiplet 3801, compute die 2002 can communicate with memory 2004 via memory controller 3810-2. In one such case, memory controller 2010-2 of compute die 2002 is disabled. In some embodiments, memory requests from compute die 2002 are first compared against contents in coherent cache or memory-side buffer chiplet 3801, and misses are forwarded to memory controller 3810-2 to fetch data from memory 2004.

Figure 39:
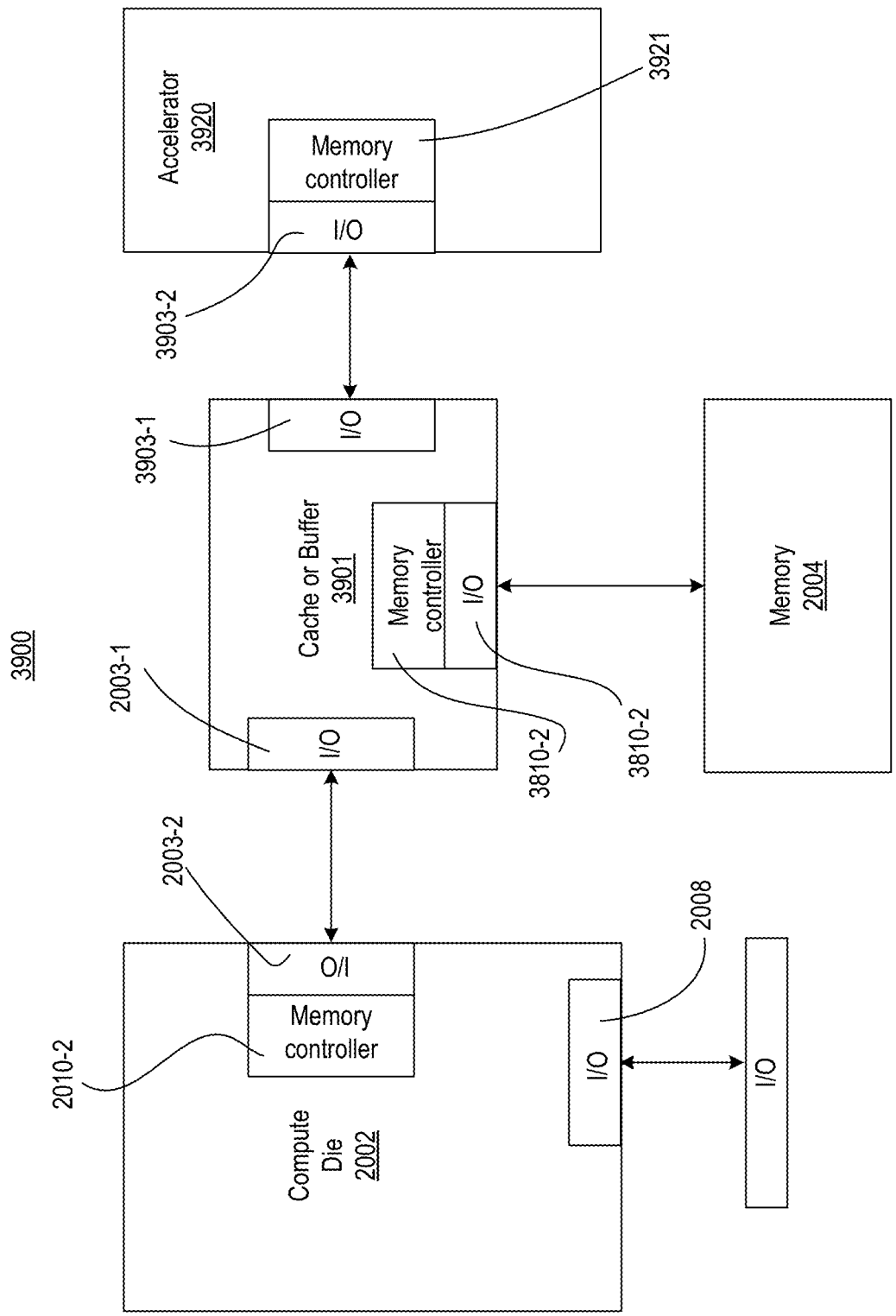
FIG. 39 illustrates a computing system with ferroelectric based coherent cache or memory-side buffer chiplet configured as a unified memory, in accordance with some embodiments.

FIG. 39 illustrates computing system 3900 with ferroelectric based coherent cache or memory-side buffer chiplet configured as a unified memory, in accordance with some embodiments. Computing system 3900 comprises compute die 2002, ferroelectric based coherent cache or memory-side buffer chiplet 3901, accelerator 39020, and memory 2004. Ferroelectric based coherent cache or memory-side buffer chiplet 3901 includes memory controller 3810-2 associated I/O 3810-2, I/O 2003-1 to communicate with compute die 2002, and I/O 3903-1 to communicate with accelerator 3901. In some embodiments, accelerator 3920 is a graphics chip such as a graphics processing unit. In some embodiments, accelerator 3920 includes memory controller 3921 and corresponding I/O 3903-2.

In some embodiments, coherent cache or memory-side buffer chiplet is configured as a unified memory where it allows compute die 2002 and/or accelerator 3920 to access data from coherent cache or memory-side buffer chiplet 3901, and any misses of data requests are handled by memory controller 3810-2 to fetch data from memory 2004. While two dies are shown coupled to chiplet 3901, any number of compute dies and/or accelerators can be coupled to chiplet 3901 and use chiplet 3901 as a unified memory. System 3900 allows for efficiency memory data transfer from both compute die 2002 and accelerator 3920. In some embodiments, memory controllers 2010-2 and/or 3921 are disabled, and memory data transfer control is managed by memory controller 3810-2 of coherent cache or memory-side buffer chiplet 3901. For example, an option is provided to bypass memory controllers 2010-2 and/or 3921, and enable or use the memory controller 3810-2 of memory chiplet 3901. This option can be in any suitable form such as software (e.g., firmware, operating system) or hardware (e.g., register or fuses).

In some embodiments, the various I/Os links herein can be on-package I/O links such as serial-deserializer (SERDES). In some embodiments, the links in the I/O die are wide I/O links. In some embodiments, links between memory I/O and memory dies can be double data rate (DDR) links. In some embodiments, the various interconnect between the I/Os shown here can be one or more of: SERDES, Very Short Reach (VSR), compute express link (CXL), peripheral component interconnect express (PCIe), DDR, low power DDR (LPDDR), graphics DDR (GDDR), open coherent accelerator processor interface (openCAPI), MIPI, Advance Interface Bus (AIB), Embedded multi-die interconnect bridge (EMIB), or any suitable interface.

In some embodiments, memory die 2004 is under compute die 2002. In some embodiments, coherent cache or memory-side buffer chiplet 3901 is over compute die 2002. In some embodiments, accelerator 3920 is adjacent to compute die 2002. In some embodiments, coherent cache or memory-side buffer chiplet 3901 is under compute die 2002. In one such case, memory die 2004 may be under coherent cache or memory-side buffer chiplet 3901 or adjacent to (e.g., on the side of) compute die 2002. In some embodiments, the various dies are stacked horizontally over a substrate or interposer. In some embodiments, some of the dies are in a vertical stack and some of the dies are in a horizontal stack. In some embodiments, when coherent cache or memory-side buffer chiplet 3901 is a memory-side buffer, it includes cache with orthogonal indexing.

Figure 40:
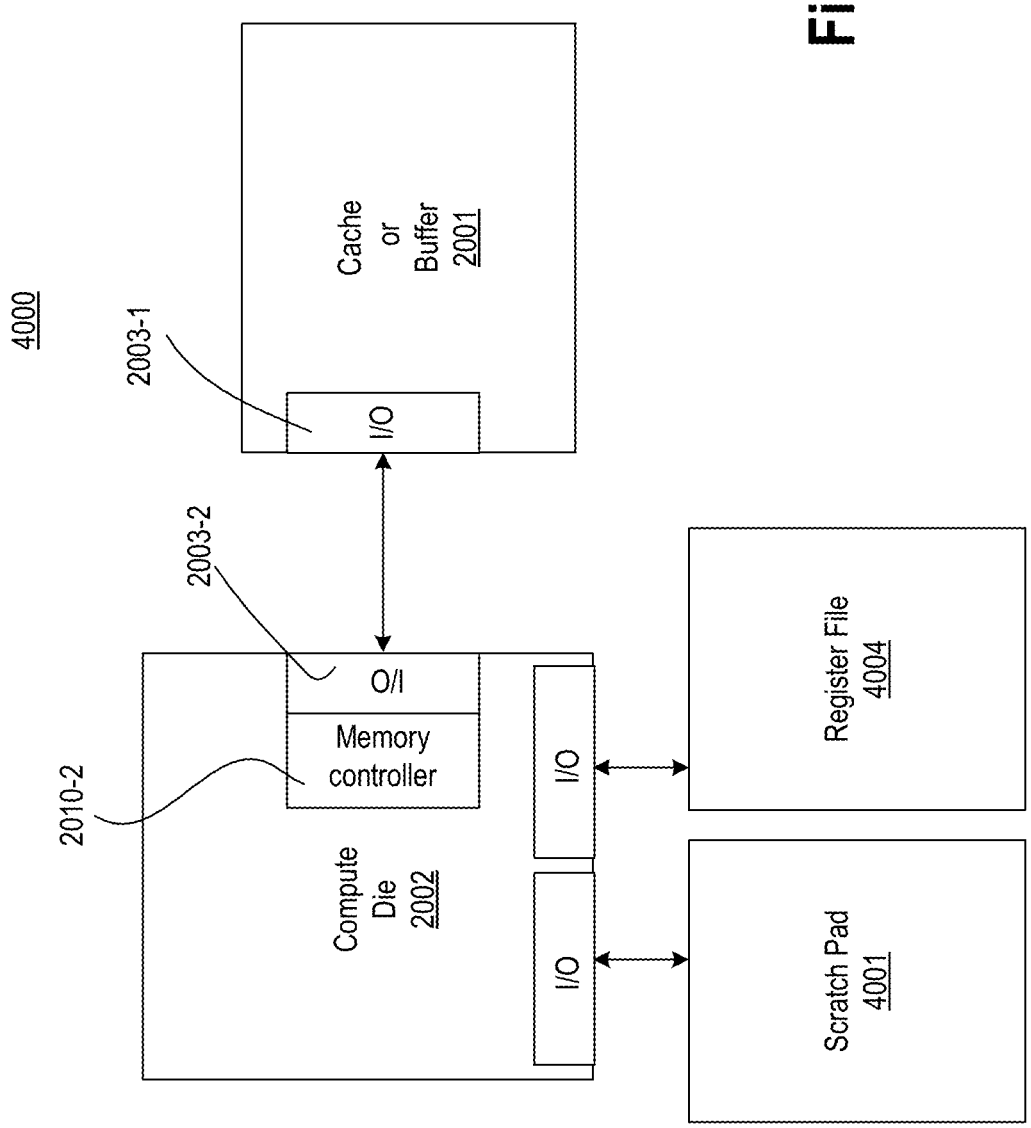
FIG. 40 illustrates a computing system with ferroelectric based memory chiplet configured as a scratch pad, in accordance with some embodiments.

FIG. 40 illustrates computing system 4000 with ferroelectric based memory chiplet configured as a scratch pad, in accordance with some embodiments. In some embodiments, in addition to or instead of coherent cache or memory-side buffer chiplet 2001, system 4000 comprises scratch pad 4001 and/or register file 4004. Scratchpad memory 4001 differs from caches in two ways. First, scratch pads are directly addressed without tags or levels of indirection, scratchpads are not mapped into the physical address space. While caches will generally contain copies of memory locations from physical memory, scratchpads will have their own address space and data is explicitly moved between scratchpads and physical memory, through the use of specialized instructions. Since scratchpads do not map the physical memory address space, there is no need for coherence with scratchpad memories, in accordance with some embodiments. In some embodiments, coherent cache or memory-side buffer chiplet 2001 is used as a physical memory. Physical memory is the physical address space available to compute die 2002 to execute programs. Physical memory can be virtualized through virtual memory, page tables, and use of Translation Lookaside Buffers (TLBs). In some embodiments, caches operate in the same address space as physical memory. Data stored in caches is a subset of the data stored in the physical memory, hence the use for coherence, to present a single version of physical memory to all processing units. Register file 4004 is an array of registers can be implemented as multiport SRAMs. In some embodiments, register files can also be implemented with ferroelectric memory cells. One function of register files is to stage data between memory 2001 (and/or 4001) and functional units of compute die 2002.

Figure 41:
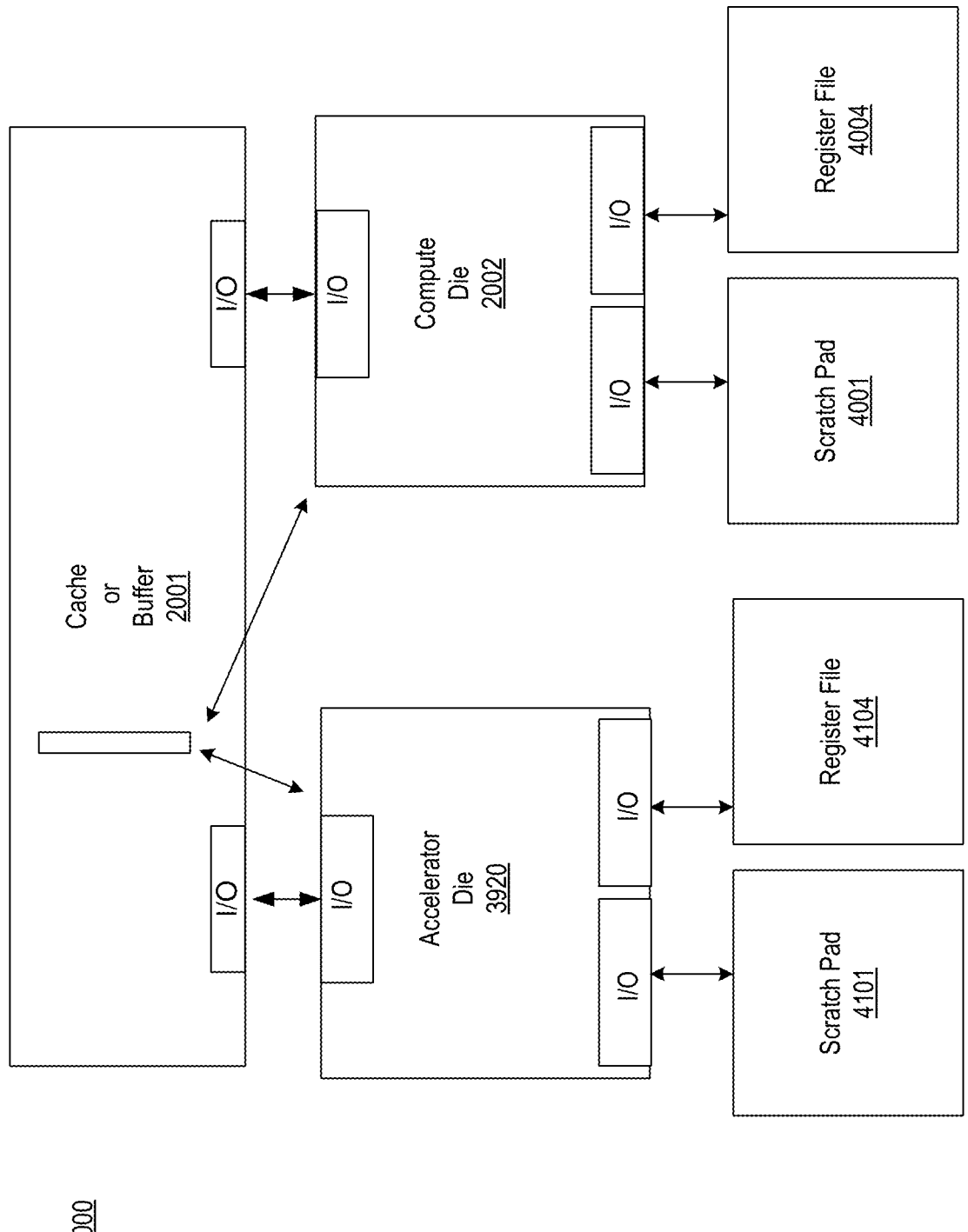
FIG. 41 illustrates a unified memory architecture using ferroelectric based coherent cache or memory-side buffer chiplet, in accordance with some embodiments.

FIG. 41 illustrates unified memory architecture 4100 using ferroelectric based coherent cache or memory-side buffer chiplet, in accordance with some embodiments. Unified memory architecture 4100 comprises ferroelectric based memory chiplet 2001, compute die 2002, accelerator die 3920 (e.g., a graphics processor), scratch pad 4001, register file 4004, scratch pad 4101, and register file 4104. In various embodiments, scratch pad 4001 and register file 4004 are coupled to compute die 2002, and scratch pad 4101 and register file 4104 are coupled to accelerator die 2002. Scratch pads 4001 and 4101 operate as described with reference to scratch pad 4001 of FIG. 40. Register files 4004 and 4104 operate as describe with reference to register file 4001 of FIG. 41.

Unified buffer or unified memory architecture is a unified address space shared by both compute die 2002 and accelerator die 3920. The unified address space is kept coherent by coherence mechanisms. In some embodiments, unified memory architecture can be implemented through ferroelectric based coherent cache or memory-side buffer chiplet (e.g., a shared cache) and shared physical memory through a convention coherence mechanism. In some embodiments, both compute die 2002 and accelerator die 3920 can directly modify a cache line in coherent cache or memory-side buffer chiplet 2001 (e.g., a shared memory) and the coherence framework ensures memory coherence.

Figure 42:
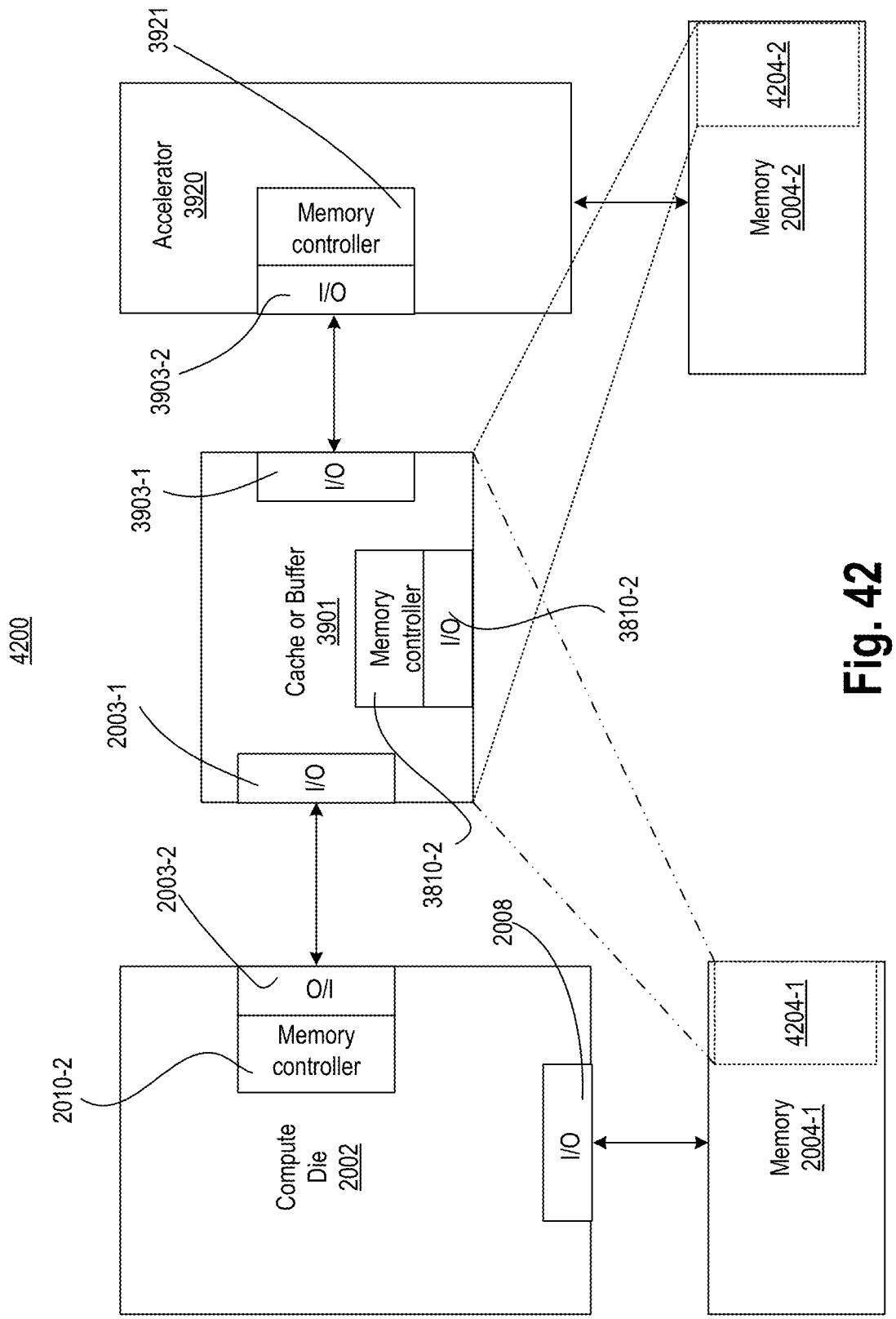
FIGS. 42-44 illustrate system architecture having a ferroelectric based coherent cache or memory-side buffer chiplet mapped into physical address space of a compute die and an accelerator, in accordance with some embodiments.
Figure 43:
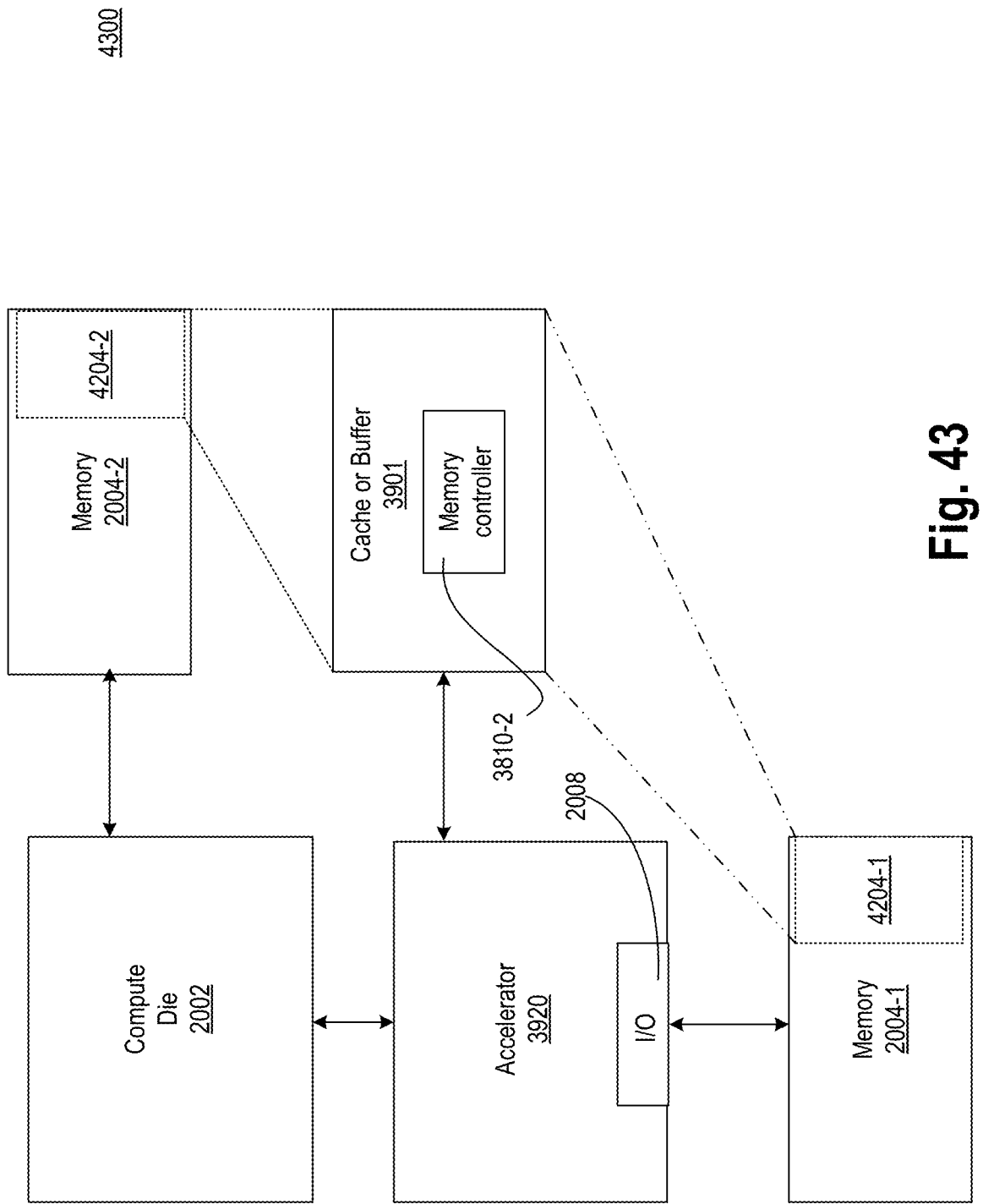
Figure 44:
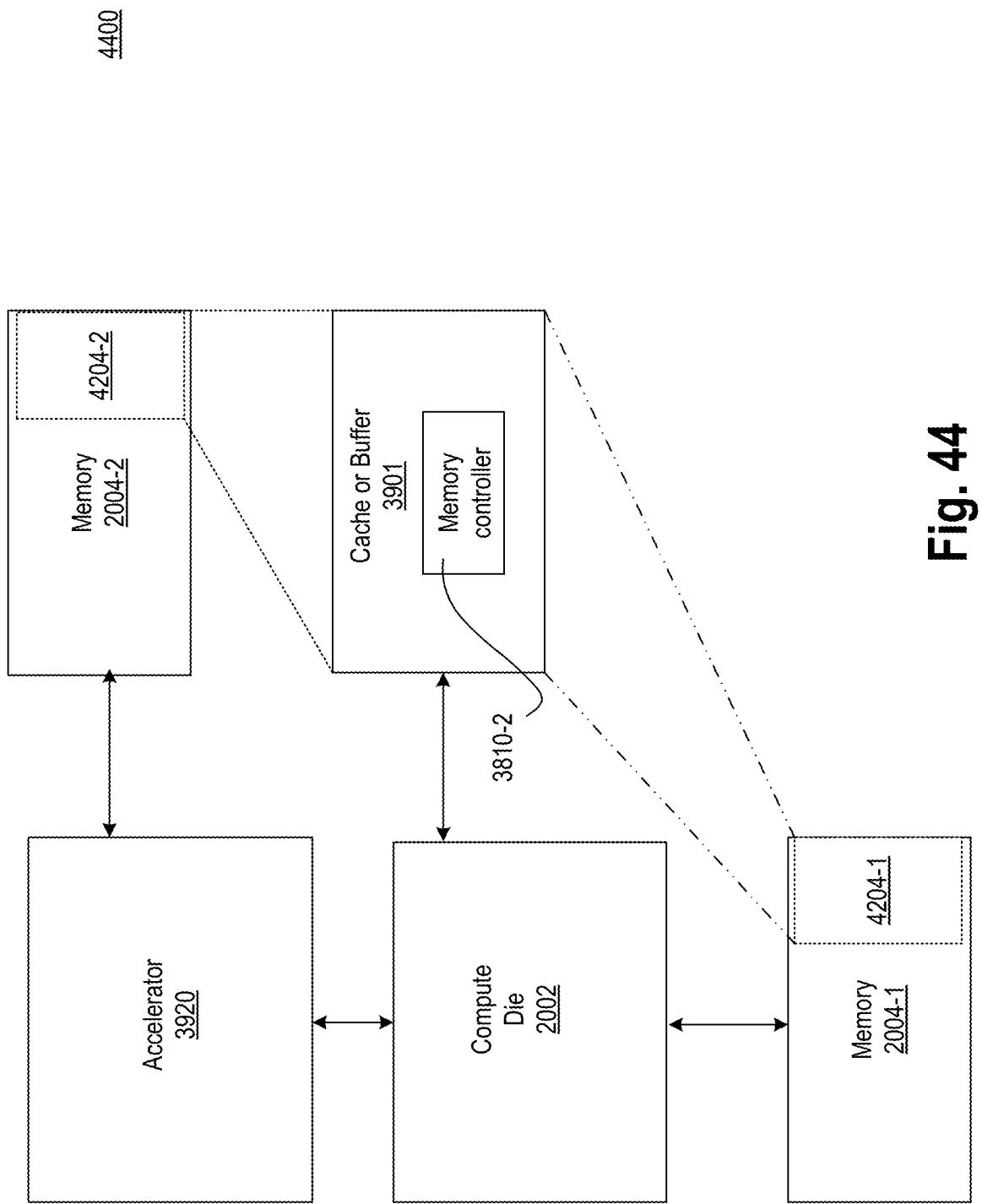

FIGS. 42-44 illustrate system architectures 4200, 4300, and 4400, respectively, having a ferroelectric based coherent cache or memory-side buffer chiplet mapped into physical address space of a compute die and an accelerator, in accordance with some embodiments. Architecture 4200 comprises compute die 2002, ferroelectric based coherent cache or memory-side buffer chiplet 3901 (e.g., 2001), accelerator die 3920, memory 2004-1 and memory 2004-2 coupled as shown. In some embodiments, memory of ferroelectric based coherent cache or memory-side buffer chiplet 3901 is mapped into physical address space of both respective memories (e.g., 2004-1 and 2004-2) of compute die 2002 and accelerator 3920. This physical address space is indicated by regions 4204-1 (of memory 2004-1) and 4204-2 (of memory 2004-2).

For example, addresses 0x00000 to 0x20000 in the compute physical memory 2004-1 might map to chiplet memory 3901, and addresses 0x20000 through 0x1000000 might map to another memory (e.g., another region of memory 2004-1 or another memory such as a DRAM memory or another FeRAM). Similarly, addresses 0x00000 to 0x20000 might map to chiplet memory 3901 for accelerator 3920 and 0x20000 to 0x60000 might map other memory devices such as a DRAM memory or another FeRAM. The memory architecture 4200 allows for direct connections between both compute die 2002 and accelerator die 3920 and chiplet memory 3901 (e.g., 2001) to enable high-speed access by both compute die 2002 and accelerator 3920 as well as the high-speed movement of data between them. Coherence mechanism ensures the coherence of data shared by compute die 2002 and accelerator 3920. In some embodiments, controller 3810-2 arbitrates requests from compute die 2002 and accelerator 3920.

Architecture 4300 is similar to architecture 4200 but for providing preference to accelerator die 3920 for frequency accesses to ferroelectric based coherent cache or memory-side buffer chiplet 3901. Architecture 4400 is similar to architecture 4300 but for providing preference to compute die 2002 for frequent accesses to ferroelectric based coherent cache or memory-side buffer chiplet 3901.

In some embodiments, compute die 2002, ferroelectric based coherent cache or memory-side buffer chiplet 3901 (e.g., 2001), accelerator die 3920, memory 2004-1 and/or memory 2004-2 are coupled to one another via at least one of: micro-bumps, copper-to-copper hybrid bond, or wire bond, Flip-chip ball grid array routing, chip-on-wafer substrate (COWOS), or embedded multi-die interconnect bridge. In some embodiments, the various dies are in a 3D stack. For example, chiplet 3901 is on a substrate, compute die 2002 is on chiplet 3901, and accelerator 3920 is on compute die 2002. In some embodiments, memories 2004-2 and 2004-1 are on either side of chiplet 3901 and on the substrate. In some embodiments, chiplet 3901 is on a substrate, accelerator die 3920 is on chiplet 2002, and compute die 3920 in on accelerator die 3920.

In some embodiments, chiplet 3901 is on substrate, and on either side of chiplet 3901 are compute die 2002 and accelerator 3920. In one such embodiment, memory 2004-1 is under compute die 2002 and, on the substrate, and memory 2004-2 is under accelerator die 3920 and on the substrate. In this case, chiplet 3901 can be replaced without changing the remaining stack of dies.

FIGS. 45A-B illustrate pseudocodes 4500 and 4520, respectively, for implementing unified memory architecture (UMA) between compute die 2001 and accelerator 3920, and for compute die 2001 only. Here, shared address space allows for pointer passing. Pseudocode 4500 is for a unified memory architecture where a pointer to a data buffer is allocated (char *data) and a data buffer is allocated in a special region of memory that is shared between compute die 2001 (e.g., CPU) and accelerator 3920 (e.g., a graphics processor unit (GPU)). The contents of a file are loaded into the data buffer with function call "fread", the contents are then sorted using function call "accelerator_qsort". Compute die 2001 and accelerator 3920 synchronize after the sorting is complete to ensure that accelerator 3920 has completed its task. Compute die 2001 then proceeds to perform further work on the sorted data set. Pseudocode 4520 is for compute die 2001 where a pointer to a data buffer is allocated (char *data) and a data buffer is allocated in the memory of compute die 2001. The contents of a file are loaded into the data buffer with function call "fread", and the contents are sorted using function call "cpu_qsort". Compute die 2001 then proceeds to perform further work on the sorted data set.

Figure 46:
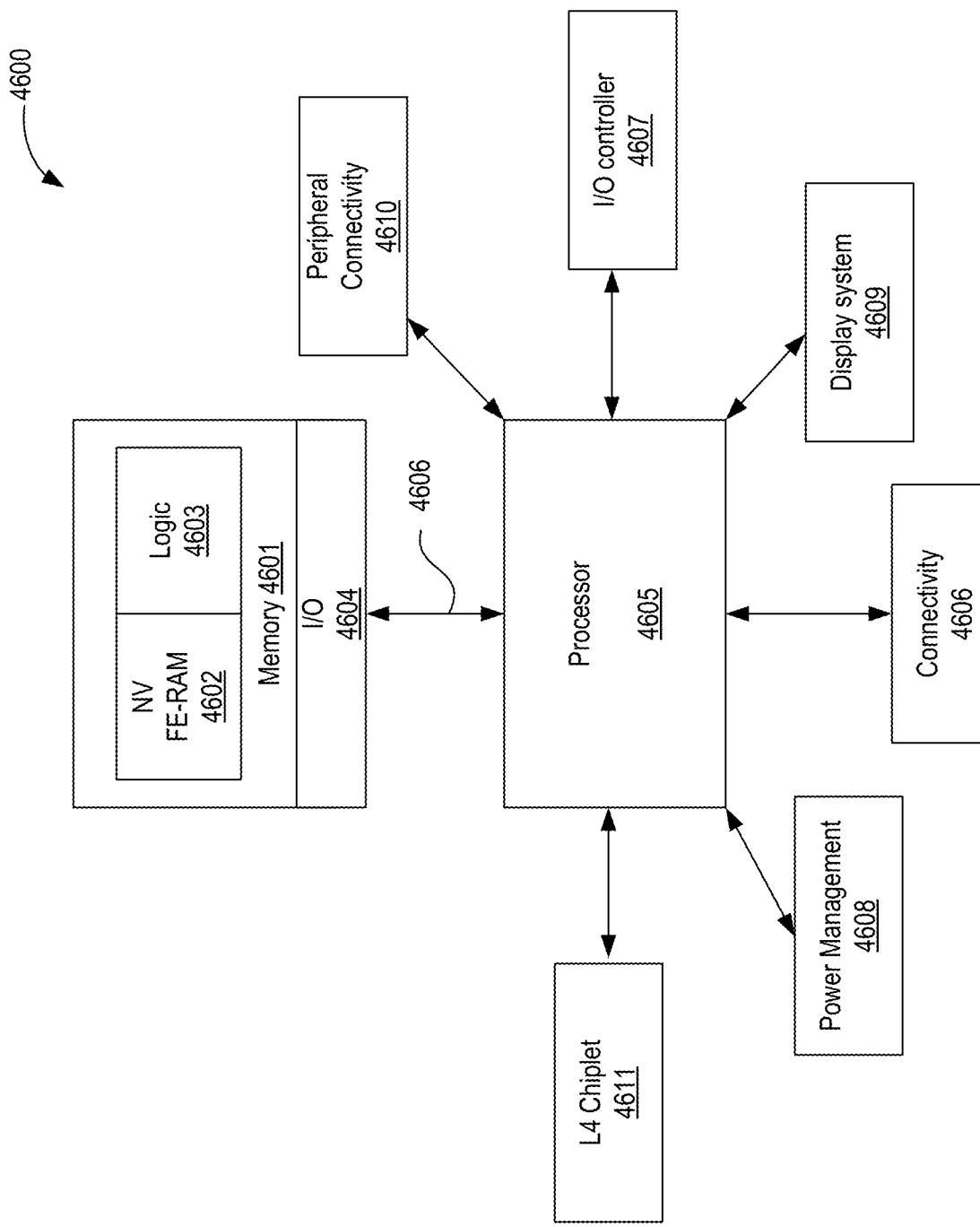
FIG. 46 illustrates a computing system with processor coupled to a ferroelectric memory chiplet such as coherent cache or memory-side buffer chiplet comprising ferroelectric memory cells, in accordance with some embodiments.

FIG. 46 illustrates computing system 4600 with processor coupled to a ferroelectric memory chiplet such as coherent cache or memory-side buffer chiplet comprising ferroelectric memory cells, in accordance with some embodiments. System-on-chip (SOC) 4600 comprises memory 4601 having static random-access memory (SRAM) or FE based random-access memory FE-RAM, or any other suitable memory. The memory can be non-volatile (NV) or volatile memory. Memory 4601 may also comprise logic 4603 to control memory 4602. For example, write and read drivers are part of logic 4603. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 4604. The interface may be double-data rate (DDR) compliant interface or any other suitable interface to communicate with a processor. Processor 4605 of SOC 4600 can be a single core or multiple core processor. Processor 4605 can be a general-purpose processor (CPU), a digital signal processor (DSP), or an Application Specific Integrated Circuit (ASIC) processor. In some embodiments, processor 4605 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor has reduced latency of computing the training model and using the training model, which reduces the power consumption of such AI processor systems.

Processor 4605 may be coupled to a number of other chip-lets that can be on the same die as SOC 4600 or on separate dies. These chip-lets include connectivity circuitry 4606, I/O controller 4607, power management 4608, and display system 4609, and peripheral connectivity 4606.

Connectivity 4606 represents hardware devices and software components for communicating with other devices. Connectivity 4606 may support various connectivity circuitries and standards. For example, connectivity 4606 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 4606 may support non-cellular standards such as WiFi.

I/O controller 4607 represents hardware devices and software components related to interaction with a user. I/O controller 4607 is operable to manage hardware that is part of an audio subsystem and/or display subsystem. For example, input through a microphone or other audio device can provide input or commands for one or more applications or functions of SOC 4600. In some embodiments, I/O controller 4607 illustrates a connection point for additional devices that connect to SOC 4600 through which a user might interact with the system. For example, devices that can be attached to the SOC 4600 might include microphone devices, speaker or stereo systems, video systems or other display devices, keyboard or keypad devices, or other I/O devices for use with specific applications such as card readers or other devices.

Power management 4608 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 4608 may accordingly put such logic into low power state without the worry of losing data. Power management may select a power state according to Advanced Configuration and Power Interface (ACPI) specification for one or all components of SOC 4600.

Display system 4609 represents hardware (e.g., display devices) and software (e.g., drivers) components that provide a visual and/or tactile display for a user to interact with the processor 4605. In some embodiments, display system 4609 includes a touch screen (or touch pad) device that provides both output and input to a user. Display system 4609 may include a display interface, which includes the particular screen or hardware device used to provide a display to a user. In some embodiments, the display interface includes logic separate from processor 4605 to perform at least some processing related to the display.

Peripheral connectivity 4610 may represent hardware devices and/or software devices for connecting to peripheral devices such as printers, chargers, cameras, etc. Peripheral connectivity 4610 say support communication protocols, e.g., PCIe (Peripheral Component Interconnect Express), USB (Universal Serial Bus), Thunderbolt, High Definition Multimedia Interface (HDMI), Firewire, etc.

In various embodiments, SoC 4600 includes coherent cache or memory-side buffer chiplet 4611 which include ferroelectric memory. Coherent cache or memory-side buffer chiplet 4611 can be coupled to processor 4605 and/or memory 4601 according to the various embodiments described herein.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a substrate; a first die on the substrate, wherein the first die comprises a dynamic random-access memory (DRAM) having bit-cells, wherein each bit-cell comprises an access transistor and a capacitor; and a second die stacked over the first die, wherein the second die comprises a computational block coupled to the DRAM of the first die.

Example 2: The apparatus of example 1, wherein the first and second dies are wafer-to-wafer bonded or die-to-die bonded.

Example 3: The apparatus of example 1, wherein the first and second dies are coupled via at least one of: micro-bumps, copper-to-copper hybrid bond, wire bond, flip-chip ball grid array routing, chip-on-wafer substrate (COWOS), or embedded multi-die interconnect bridge.

Example 4: The apparatus of example 3, wherein the first die includes through-silicon-vias (TSVs), wherein a number of TSVs is substantially less than a number of the micro-bumps.

Example 5: The apparatus of example 4, wherein the TSVs include power and ground lines, and lines to couple a device external to the apparatus.

Example 6: The apparatus of example 4, wherein the second die is independent of TSVs.

Example 7: The apparatus of example 3, wherein the first and second dies are coupled such that active devices of the first die and active devices of the second die are closer to the micro-bumps than to a heat sink.

Example 8: The apparatus of example 1, wherein the first die is coupled to the substrate via C4 bumps.

Example 9: The apparatus of example 1, wherein the first or second dies include a network-on-chip (NoC).

Example 10: The apparatus of example 1, wherein the compute die includes an array of multiplier cells, and wherein the DRAM includes an array of memory bit-cells.

Example 11: The apparatus of example 10 comprising an interconnect fabric coupled to the array of multiplier cells such that each multiplier cell is coupled to the interconnect fabric.

Example 12: The apparatus of example 1, wherein the DRAM is partitioned into a first partition operable as buffers; and a second partition to store weight factors.

Example 13: The apparatus of example 12, wherein the compute die is to receive data from the first partition and the second partition, and wherein an output of the computational logic is received by logic circuitry.

Example 14: The apparatus of example 12, wherein the AI processor is operable to multiply at least two matrices.

Example 15: The apparatus of example 1, wherein the substrate comprises active or passive devices.

Example 16: The apparatus of example 1, wherein a third die is on the substrate, and wherein a fourth die comprising a DRAM which is stacked over the third die.

Example 17: The apparatus of example 1, wherein a heat sink is coupled to the second die.

Example 18: The apparatus of example 1, wherein the DRAM comprises an embedded DRAM (eDRAM).

Example 19: The apparatus of example 1, wherein the compute die includes one of: FPGA, ASIC, CPU, AI processor, DSP, or GPU.

Example 20: A method comprising: forming a substrate; forming a first die on the substrate, wherein forming the first die comprises forming a dynamic random-access memory (DRAM) having bit-cells; and forming a second die, wherein forming the second die comprises forming an artificial intelligence (AI) processor; and stacking the second die over the first die, wherein stacking the second die over the first die comprises coupling the AI processor to the DRAM of the first die.

Example 21: The method of example 20, wherein: coupling the AI processor to the DRAM of the first die comprises wafer-to-wafer bonding the first and second dies; or coupling the AI processor to the DRAM of the first die comprises coupling the first and second dies via micro-bumps; forming the first die includes forming through-silicon-vias (TSVs) in the first die, wherein a number of TSVs is substantially fewer than a number of micro-bumps; and coupling the first and second dies via micro-bumps comprises coupling the first and second dies are coupled such that active devices of the first die and active devices of the second die are closer to the micro-bumps than to a heat sink.

Example 22: The method of example 20 comprises: supplying the TSVs with power and ground supplies; coupling a device external to the apparatus via the TSVs, wherein the second die is independent of TSVs; forming the first die on the substrate comprises coupling the first die to the substrate via C4 bumps; forming network-on-chip (NoC) on the first or second die; and coupling a heat sink to the second die.

Example 23: The method of example 20, wherein forming the AI includes forming an array of multiplier cells, and wherein the DRAM includes an array of memory bit-cells, and wherein the AI processor is operable to multiply at least two matrices.

Example 24: The method of example 20 comprising: forming an interconnect fabric; and coupling the interconnect fabric to the array of multiplier cells such that each multiplier cell is coupled to the interconnect fabric.

Example 25: The method of example 20, wherein the DRAM is partitioned into a first partition operable as buffers; and a second partition to store weight factors, wherein the method comprises: receiving data by the computational logic from the first partition and the second partition; and providing an output of the AI processor to a logic circuitry.

Example 26: A system comprising: a first memory comprising non-volatile memory (NVM) cells; a second memory, wherein the first memory is coupled to the second memory; a third memory coupled to the first memory; a first processor coupled to the second memory; and a second processor coupled to the third memory and the first processor, wherein the second processor comprises: a substrate; a first die on the substrate, wherein the first die comprises a memory having bit-cells; and a second die stacked over the first die, wherein the second die comprises computational block coupled to the memory of the first die.

Example 27: The system of example 26, wherein: the first and second dies are wafer-to-wafer bonded or die-to-wafer bonded; the first and second dies are coupled via micro-bumps; the first die includes through-silicon-vias (TSVs), wherein a number of TSVs is substantially less than a number of micro-bumps; the TSVs include power and ground lines, and lines to couple a device external to the apparatus; the second die is independent of TSVs; and the first and second dies are coupled such that active devices of the first die and active devices of the second die are closer to the micro-bumps than to a heat sink.

Example 28: The system of example 26, wherein memory of the second processor includes one of: DRAM, flash, eDRAM, MRAM, ReRAM, SRAM, or FeRAM.

Example 29: An apparatus comprising: a substrate; a first die on the substrate, wherein the first die comprises memory having bit-cells; and a second die stacked over the first die, wherein the second die comprises a computational block coupled to the memory of the first die.

Example 30: The apparatus of example 29, wherein the second die includes one of: FPGA, ASIC, CPU, AI processor, DSP, or GPU.

Example 31: The apparatus of example 29, wherein the memory includes one of: DRAM, flash, eDRAM, MRAM, ReRAM, SRAM, or FeRAM.

Example 32: An apparatus comprising: a substrate; a stack of memory dies including a first die which comprises memory having bit-cells, and a second die comprising controller logic, cache, or memory, wherein one of the dies of the stack is on the substrate; and a compute die stacked over the second die of the stack of memory dies.

Example 33: The apparatus of example 32, wherein the memory includes one of: DRAM, flash, eDRAM, MRAM, ReRAM, SRAM, or FeRAM.

Example 34: The apparatus of example 32, wherein the first die and the compute die are wafer-to-wafer bonded or die-to-wafer bonded.

Example 35: The apparatus of example 32, wherein the first and second dies are coupled via at least one of: micro-bumps, copper-to-copper hybrid bond, wire bond, flip-chip ball grid array routing, chip-on-wafer substrate (COWOS), or embedded multi-die interconnect bridge.

Example 36: The apparatus of example 32, wherein the first die and the compute die are coupled via at least one of: micro-bumps, copper-to-copper hybrid bond, or wire bond, flip-chip ball grid array routing, chip-on-wafer substrate (COWOS), or embedded multi-die interconnect bridge.

Example 37: The apparatus of example 36, wherein the die of the stack which is on the substrate includes through-silicon-vias (TSVs), wherein a number of TSVs is substantially less than a number of the micro-bumps, copper-to-copper hybrid bond, or wire bond.

Example 38: The apparatus of example 32, wherein the compute die is independent of TSVs.

Example 39: The apparatus of example 32, wherein at least one of the dies in the stack or the compute die includes a network-on-chip (NoC).

Example 40: The apparatus of example 32, wherein the compute die includes one of: FPGA, ASIC, CPU, AI processor, DSP, or GPU.

Example 41: An apparatus comprising: a substrate; a stack of memory dies including a first die which comprises memory having bit-cells, and a second die comprising controller logic, cache or memory, wherein one of the dies of the stack is on the substrate; and an artificial intelligence processor die stacked over the second die of the stack of memory dies.

Example 42: The apparatus of example 41, wherein the memory includes one of: DRAM, flash, eDRAM, MRAM, ReRAM, SRAM, or FeRAM.

Example 43: The apparatus of example 41, wherein the first die and the compute die are wafer-to-wafer bonded or die-to-wafer bonded.

Example 44: The apparatus of example 41, wherein the first and second dies are coupled via at least one of: micro-bumps, copper-to-copper hybrid bond, or wire bond.

Example 45: The apparatus of example 41, wherein the first die and the artificial intelligence processor die are coupled via at least one of: micro-bumps, copper-to-copper hybrid bond, or wire bond.

Example 46: The apparatus of example 45, wherein the die of the stack which is on the substrate includes through-silicon-vias (TSVs), wherein a number of TSVs are substantially fewer than a number of the micro-bumps, copper-to-copper hybrid bond, or wire bond.

Example 47: The apparatus of example 41, wherein the artificial intelligence processor die is independent of TSVs.

Example 48: A system comprising: a first memory comprising non-volatile memory (NVM) cells; a second memory, wherein the first memory is coupled to the second memory; a third memory coupled to the first memory; a first processor coupled to the second memory; and a second processor coupled to the third memory and the first processor, wherein the second processor comprises: a substrate; a stack of memory dies including a first die which comprises memory having bit-cells, and a second die comprising controller logic, cache, or memory, wherein one of the dies of the stack is on the substrate; and a compute die stacked over the second die of the stack of memory dies.

Example 49: The system of example 48, wherein the memory of the first die includes one of: DRAM, flash, eDRAM, MRAM, ReRAM, SRAM, or FeRAM.

Example 50: The system of example 17, wherein: the first die and the compute die are wafer-to-wafer bonded or die-to-wafer bonded; the first and second dies are coupled via at least one of: micro-bumps, copper-to-copper hybrid bond, or wire bond; the first die and the compute die are coupled via at least one of: micro-bumps, copper-to-copper hybrid bond, or wire bond; and wherein the die of the stack which is on the substrate includes through-silicon-vias (TSVs), wherein a number of TSVs are substantially fewer than a number of the micro-bumps, copper-to-copper hybrid bond, or wire bond, flip-chip ball grid array routing, chip-on-wafer substrate (COWOS), or embedded multi-die interconnect bridge.

Example 51: The system of example 48, wherein the compute die is independent of TSVs.

Example 52: The system of example 48, wherein at least one of the dies in the stack or the compute die includes a network-on-chip (NoC).

Example 53: The system of example 48, wherein the compute die includes one of: FPGA, ASIC, CPU, AI processor, DSP, or GPU.

Example 1a: An apparatus comprising: a first die comprising a switch and a first plurality of input-output transceivers; a second die comprising a processor, wherein the second die includes a second plurality of input-output transceivers coupled to the first plurality of input-output transceivers; and a third die comprising a coherent cache or memory-side buffer, wherein the coherent cache or memory-side buffer comprises ferroelectric memory cells, wherein the coherent cache or memory-side buffer is coupled to the second die via I/Os.

Example 2a: The apparatus of example 1a comprising a substrate, wherein the first die is on the substrate.

Example 3a: The apparatus of example 1a comprising a substrate, wherein the first die is in the substrate.

Example 4a: The apparatus of example 2a comprises a memory die coupled to the first die via a memory interface, wherein the first die includes a memory controller to manage data traffic to the memory die.

Example 5a: The apparatus of example 4a, wherein the memory interface is one of: DDR or CXL.

Example 6a: The apparatus of example 4a, wherein the memory die is on the first die, wherein the second die is on the memory die, and wherein the third die is on the second die.

Example 7a: The apparatus of example 1a, wherein when the coherent cache or memory-side buffer is a memory-side buffer, it includes a cache with orthogonal indexing.

Example 8a: The apparatus of example 1a, wherein the second die includes a controller for the Level-4 cache of the third die.

Example 9a: The apparatus of example 1a, wherein the first die, the second die, and the third die are coupled to one another via at least one of: micro-bumps, copper-to-copper hybrid bond, or wire bond, Flip-chip ball grid array routing, chip-on-wafer substrate (COWOS), or embedded multi-die interconnect bridge.

Example 10a: The apparatus of example 1a, wherein the second die is independent of through-silicon-vias (TSV).

Example 11a: The apparatus of example 1a, wherein the third die includes a plurality of cache banks, a local cache controller, a non-volatile controller, and a reliability logic coupled together.

Example 12a: The apparatus of example 11a, wherein each of the plurality of cache banks includes a data bank and an associated tag, an endurance controller, a lookup logic, and/or a compute logic coupled together.

Example 12aa: The apparatus of example 1a, wherein the third die includes a memory controller to manage traffic between the second die and/or a memory die.

Example 13a: An apparatus comprising: a plurality of processor dies; an I/O die coupled to the plurality of processor dies; a first memory chiplet coupled to the I/O die; and a second memory chiplet coupled to the I/O die, wherein the first memory chiplet and the second memory chiplet includes ferroelectric memory cells.

Example 14a: The apparatus of example 13a, comprising a substrate, wherein the I/O die is on the substrate.

Example 15a: The apparatus of example 13a, wherein the plurality of processors includes one or more of CPU, GPU, or AI Core.

Example 16a: The apparatus of example 13a comprises: a first memory die coupled to the first memory chiplet via a first memory interface, wherein the first memory chiplet includes a first memory controller to manage data traffic to the first memory die; and a second memory die coupled to the second memory chiplet via a second memory interface, wherein the second memory chiplet includes a second memory controller to manage data traffic to the second memory die.

Example 17a: The apparatus of example 13a, wherein the first and the second memory chiplets are one of coherent cache, cache with orthogonal indexing, or serve as cache or buffer for a unified memory architecture.

Example 18a: A system comprising: a first memory comprising non-volatile memory (NVM) cells; a second memory, wherein the first memory is coupled to the second memory; a third memory coupled to the first memory; a first processor coupled to the second memory; and a second processor coupled to the third memory and the first processor, wherein the second processor comprises: a first die comprising a switch and a first plurality of input-output transceivers; a second die comprising a compute logic, wherein the second die includes a second plurality of input-output transceivers coupled to the first plurality of input-output transceivers; and a third die comprising a coherent cache or memory-side buffer, wherein the coherent cache or memory-side buffer comprises ferroelectric memory cells, wherein the coherent cache or memory-side buffer is coupled to the second die via cache I/Os.

Example 19a: The system of example 18a comprising a substrate, wherein the first die is on the substrate, or wherein the first die is in the substrate.

Example 20a: The system of example 18a comprises a memory die coupled to the first die via a memory interface, wherein: the first die includes a memory controller to manage data traffic to the memory die; the memory die is on the first die, wherein the second die is on the memory die, and wherein the third die is on the second die; wherein the second die includes a controller for the coherent cache or memory-side buffer of the third die.

Example 1b: An apparatus comprising: a first die comprising a processor; a second die comprising a memory chiplet with ferroelectric memory cells; a third die comprising an accelerator, wherein the first die is coupled to the second die, and wherein the third die is coupled to the third die; and a fourth die comprising memory, wherein the fourth die is coupled to the second die, wherein second die includes a memory controller to manage memory data transfer between the first die, the second die and the fourth die.

Example 2b: The apparatus of example 1b, wherein the memory chiplet is configured as a unified memory.

Example 3b: The apparatus of example 1b, wherein the first die includes a memory interface to communicate with the memory chiplet, wherein the memory interface is one of DDR or CXL.

Example 4b: The apparatus of example 1b, wherein the fourth die is under the first die.

Example 5b: The apparatus of example 1b, wherein the fourth die is off-package, and wherein the second die is on-package.

Example 6b: The apparatus of example 1b, wherein the memory chiplet includes memory-side buffer which includes cache with orthogonal indexing.

Example 7b: The apparatus of example 1b, wherein the memory chiplet includes coherent cache.

Example 8b: The apparatus of example 1b, wherein the first die, the second die, the third die, and the fourth die are coupled to one another via at least one of: micro-bumps, copper-to-copper hybrid bond, or wire bond, Flip-chip ball grid array routing, chip-on-wafer substrate (COWOS), or embedded multi-die interconnect bridge.

Example 9b: The apparatus of example 1b comprising a fifth die including memory, wherein the fourth die is coupled to the first die, and wherein the fifth die is coupled to the third die, wherein memory of the second die is mapped to the memory of the fourth die and the memory of the fifth die.

Example 10b: The apparatus of example 9b, wherein the fourth die and the fifth die are off-package, and wherein the second die is on-package.

Example 11b: The apparatus of example 9b, wherein the fourth die and the fifth die comprise DRAM.

Example 12b: The apparatus of example 1b, wherein the first die includes a memory controller which is bypassed in favor of the memory controller of the second die.

Example 13b: The apparatus of example 1b, wherein the first die is given preference for the second die compared to the third die.

Example 14b: The apparatus of example 1b, wherein the third die is given preference for the second die compared to the first die.

Example 15b: The apparatus of example 1b, wherein the accelerator die comprises a graphics processor.

Example 16b: An apparatus comprising: a first die comprising a processor; a second die comprising a memory chiplet with ferroelectric memory cells; a third die comprising memory, wherein the third die is coupled to the second die, wherein second die includes a memory controller to manage memory data transfer between the first die and the third die.

Example 17b: The apparatus of example 16b, wherein the memory chiplet is configured as a unified memory.

Example 18b: The apparatus of example 16b, wherein the first die includes a memory controller which is disabled.

Example 19b: A system comprising: a first memory comprising non-volatile memory (NVM) cells; a second memory, wherein the first memory is coupled to the second memory; a third memory coupled to the first memory; a first processor coupled to the second memory; and a second processor coupled to the third memory and the first processor, wherein the second processor comprises: a first die comprising a computational block; a second die comprising a memory chiplet with ferroelectric memory cells; a third die comprising an accelerator, wherein the first die is coupled to the second die, and wherein the third die is coupled to the third die; and a fourth die comprising memory, wherein the fourth die is coupled to the second die, wherein second die includes a memory controller to manage memory data transfer between the first die, the second die and the fourth die.

Example 20b: The system of example 19b, wherein: the first die is given preference for the second die compared to the third die; or the third die is given preference for the second die compared to the first die.

Example 1c: An apparatus comprising: a first die comprising a processor, wherein the first die includes a first plurality of input-output transceivers; a second die comprising a coherent cache or memory-side buffer, wherein the coherent cache or memory-side buffer comprises ferroelectric memory cells, wherein the coherent cache or memory-side buffer is coupled to the first die via I/Os; and a substrate comprising a switch and a second plurality of input-output transceivers, wherein the first plurality of input-output transceivers is coupled to the second plurality of input-output transceivers.

Example 2c: The apparatus of example 1c comprising a memory die coupled to the substrate via a memory interface, wherein the substrate includes a memory controller to manage data traffic to the memory die.

Example 3c: The apparatus of example 1c comprising: a memory die coupled to the substrate via a memory interface; and a memory controller to manage data traffic to the memory die.

Example 4c: The apparatus of example 3c, wherein the memory interface is one of: DDR or CXL.

Example 5c: The apparatus of example 3c, wherein the memory die is on the substrate, wherein the first die is on the memory die, and wherein the second die is on the first die.

Example 6c: The apparatus of example 3c, wherein the memory die is off-package, and wherein the first die and the second die are on-package.

Example 7c: The apparatus of example 3c, wherein the memory die comprises DRAM.

Example 8c: The apparatus of example 1c, wherein the first die includes a controller for the coherent cache or memory-side buffer.

Example 9c: The apparatus of example 1c, wherein the first die and the second die are coupled to one another via at least one of: micro-bumps, copper-to-copper hybrid bond, or wire bond, Flip-chip ball grid array routing, chip-on-wafer substrate (COWOS), or embedded multi-die interconnect bridge.

Example 10c: The apparatus of example 1c, wherein the second die includes a memory controller to manage data traffic with the first die.

Example 11c: An apparatus comprising: a first die comprising a processor, wherein the first die includes a first plurality of input-output transceivers; a second die comprising a memory chiplet, wherein the memory chiplet comprises ferroelectric memory cells, wherein the memory chiplet is coupled to the first die via I/Os; and an interposer comprising a switch and a second plurality of input-output transceivers, wherein the first plurality of input-output transceivers is coupled to the second plurality of input-output transceivers.

Example 12c: The apparatus of example 11c comprising a memory die coupled to the interposer via a memory interface.

Example 13c: The apparatus of example 12c, wherein the memory interface is one of: DDR or CXL.

Example 14c: The apparatus of example 12c, wherein the memory die is on the interposer, wherein the first die is on the memory die, and wherein the second die is on the first die.

Example 15c: The apparatus of example 12c, wherein the memory die is off-package, and wherein the first die and the second die are on-package.

Example 16c: The apparatus of example 12c, wherein the memory die comprises DRAM.

Example 17c: The apparatus of example 11c, wherein the first die includes a controller for the memory chiplet.

Example 18c: The apparatus of example 11c, wherein the memory chiplet includes coherent cache or memory-side buffer.

Example 19c: A system comprising: a first memory comprising non-volatile memory (NVM) cells; a second memory, wherein the first memory is coupled to the second memory; a third memory coupled to the first memory; a first processor coupled to the second memory; and a second processor coupled to the third memory and the first processor, wherein the second processor comprises: a first die comprising a processor, wherein the first die includes a first plurality of input-output transceivers; a second die comprising a memory chiplet, wherein the memory chiplet comprises ferroelectric memory cells, wherein the memory chiplet is coupled to the first die via I/Os; and an interposer comprising a switch and a second plurality of input-output transceivers, wherein the first plurality of input-output transceivers is coupled to the second plurality of input-output transceivers.

Example 20c: The system of example 19c, wherein the first die and the second die are coupled to one another via at least one of: micro-bumps, copper-to-copper hybrid bond, or wire bond, Flip-chip ball grid array routing, chip-on-wafer substrate (COWOS), or embedded multi-die interconnect bridge.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first die comprising a processor;
a second die comprising a memory chiplet with ferroelectric memory cells;
a third die comprising an accelerator, wherein the first die is coupled to the second die, and wherein the third die is coupled to the second die; and
a fourth die comprising memory, wherein the fourth die is coupled to the second die, and wherein the second die includes a memory controller to manage memory data transfer between the first die, the second die and the fourth die.

2. The apparatus of claim 1, wherein the memory chiplet is configured as a unified memory.

3. The apparatus of claim 1, wherein the first die includes a memory interface to communicate with the memory chiplet, and wherein the memory interface is one of DDR or CXL.

4. The apparatus of claim 1, wherein the fourth die is under the first die.

5. The apparatus of claim 1, wherein the fourth die is off-package, and wherein the second die is on-package.

6. The apparatus of claim 1, wherein the memory chiplet includes memory-side buffer which includes cache with orthogonal indexing.

7. The apparatus of claim 1, wherein the memory chiplet includes coherent cache.

8. The apparatus of claim 1, wherein the first die, the second die, the third die, and the fourth die are coupled to one another via at least one of: micro-bumps, copper-to-copper hybrid bond, or wire bond, Flip-chip ball grid array routing, chip-on-wafer substrate (COWOS), or embedded multi-die interconnect bridge.

9. The apparatus of claim 1 comprising a fifth die including memory, wherein the fourth die is coupled to the first die, and wherein the fifth die is coupled to the third die, and wherein the memory chiplet of the second die is mapped to the memory of the fourth die and the memory of the fifth die.

10. The apparatus of claim 9, wherein the fourth die and the fifth die are off-package, and wherein the second die is on-package.

11. The apparatus of claim 9, wherein the fourth die and the fifth die comprise DRAM.

12. The apparatus of claim 1, wherein the first die includes a second memory controller which is bypassed in favor of the memory controller of the second die.

13. The apparatus of claim 1, wherein the first die is given preference for the second die compared to the third die.

14. The apparatus of claim 1, wherein the third die is given preference for the second die compared to the first die.

15. The apparatus of claim 1, wherein the accelerator comprises a graphics processor.

16. An apparatus comprising:
a first die comprising a processor;
a second die comprising a memory chiplet with ferroelectric memory cells; and
a third die comprising memory, wherein the third die is coupled to the second die, and wherein the second die includes a memory controller to manage memory data transfer between the first die and the third die.

17. The apparatus of claim 16, wherein the memory chiplet is configured as a unified memory.

18. The apparatus of claim 16, wherein the first die includes a second memory controller which is disabled.

19. A system comprising:
a first memory comprising non-volatile memory (NVM) cells;
a second memory, wherein the first memory is coupled to the second memory;
a third memory coupled to the first memory;
a first processor coupled to the second memory; and
a second processor coupled to the third memory and the first processor, wherein the second processor comprises:
a first die comprising a computational block;
a second die comprising a memory chiplet with ferroelectric memory cells;

a third die comprising an accelerator, wherein the first die is coupled to the second die, and wherein the third die is coupled to the third die; and a fourth die comprising memory, wherein the fourth die is coupled to the second die, and wherein the second die includes a memory controller to manage memory data transfer between the first die, the second die and the fourth die.

20. The system of claim 19, wherein:

the first die is given preference for the second die compared to the third die; or the third die is given preference for the second die compared to the first die.

\* \* \* \* \*